(12) United States Patent
Ku et al.

(10) Patent No.: US 12,299,247 B1
(45) Date of Patent: May 13, 2025

(54) ELECTRONIC DEVICE

(71) Applicant: Samsung Display Co., Ltd., Yongin-si (KR)

(72) Inventors: Kyowon Ku, Yongin-si (KR);
Gwang-Bum Ko, Yongin-si (KR);
Miyoung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/821,840

(22) Filed: Aug. 30, 2024

(30) Foreign Application Priority Data

Nov. 1, 2023 (KR) .......................... 10-2023-0149456

(51) Int. Cl.
*G06F 3/044* (2006.01)
*G06F 3/041* (2006.01)

(52) U.S. Cl.
CPC ........ *G06F 3/0446* (2019.05); *G06F 3/04164* (2019.05); *G06F 3/0443* (2019.05); *G06F 3/0448* (2019.05); *G06F 2203/04106* (2013.01)

(58) Field of Classification Search
CPC .. G06F 3/0446; G06F 3/04164; G06F 3/0443; G06F 3/0448; G06F 2203/04106
See application file for complete search history.

(56) References Cited

U.S. PATENT DOCUMENTS

| | | | |
|---|---|---|---|
| 9,158,398 B2 | 10/2015 | Jeong et al. | |
| 10,234,980 B2 * | 3/2019 | Seong | G06F 3/0445 |
| 10,379,641 B2 | 8/2019 | Lim et al. | |
| 10,949,047 B2 | 3/2021 | Na et al. | |
| 11,275,474 B2 * | 3/2022 | Yang | G06F 3/0446 |
| 11,460,949 B2 * | 10/2022 | Huang | G06F 3/04164 |
| 11,507,223 B2 | 11/2022 | Kadowaki | |
| 11,507,238 B2 * | 11/2022 | Song | G06F 3/04164 |
| 11,625,118 B2 * | 4/2023 | Kim | G06F 3/0412 |
| | | | 345/173 |
| 11,650,695 B2 | 5/2023 | Lim | |
| 11,703,961 B2 | 7/2023 | Jeon et al. | |
| 11,726,625 B2 | 8/2023 | Kim et al. | |
| 2017/0024060 A1 * | 1/2017 | Seong | G06F 3/0446 |
| 2017/0139525 A1 * | 5/2017 | Jo | G06F 3/0446 |

(Continued)

FOREIGN PATENT DOCUMENTS

| | | |
|---|---|---|
| EP | 3 657 309 A1 | 11/2019 |
| EP | 3 623 918 A1 | 3/2020 |

(Continued)

*Primary Examiner* — Amy Onyekaba
(74) *Attorney, Agent, or Firm* — Womble Bond Dickinson (US) LLP

(57) ABSTRACT

A method of driving a sensor layer of an electronic device includes, at a first time, driving a first connection line with a first signal, the first connection line connected to a first end of each of first electrodes, driving a second connection line with the first signal, the second connection line connected to a second end of each of first group electrodes of the first electrodes, and driving a third connection line with a second signal different from the first signal, the third connection line connected to a second end of each of second group electrodes of the first electrodes, and generating a magnetic field with the first connection line, the first group electrodes, and the second group electrodes to charge a RLC resonance circuit of a pen at a first time.

21 Claims, 38 Drawing Sheets

(56) References Cited

U.S. PATENT DOCUMENTS

| | | | |
|---|---|---|---|
| 2017/0308205 A1* | 10/2017 | Cheng | G06F 1/16 |
| 2019/0220123 A1* | 7/2019 | Kanaya | H10K 59/40 |
| 2020/0110498 A1* | 4/2020 | Lee | G06F 3/0446 |
| 2021/0405819 A1* | 12/2021 | Seo | G06F 3/0443 |
| 2022/0147216 A1* | 5/2022 | Huang | G06F 3/0445 |
| 2022/0149329 A1 | 5/2022 | Jeong et al. | |
| 2022/0214770 A1* | 7/2022 | Bang | G06F 3/0445 |
| 2023/0054462 A1 | 2/2023 | Jeon | |
| 2024/0045523 A1 | 2/2024 | Kim et al. | |
| 2024/0184382 A1 | 6/2024 | Kim et al. | |

FOREIGN PATENT DOCUMENTS

| | | |
|---|---|---|
| KR | 10-1391243 B1 | 5/2014 |
| KR | 10-2018-0007388 A | 1/2018 |
| KR | 10-2022-0129123 A | 9/2022 |
| KR | 10-2022-0145666 A | 10/2022 |
| KR | 10-2022-0169972 A | 12/2022 |
| KR | 2023-0023857 A1 | 2/2023 |
| WO | WO 2022/203471 A1 | 9/2022 |

* cited by examiner

FIG. 1B
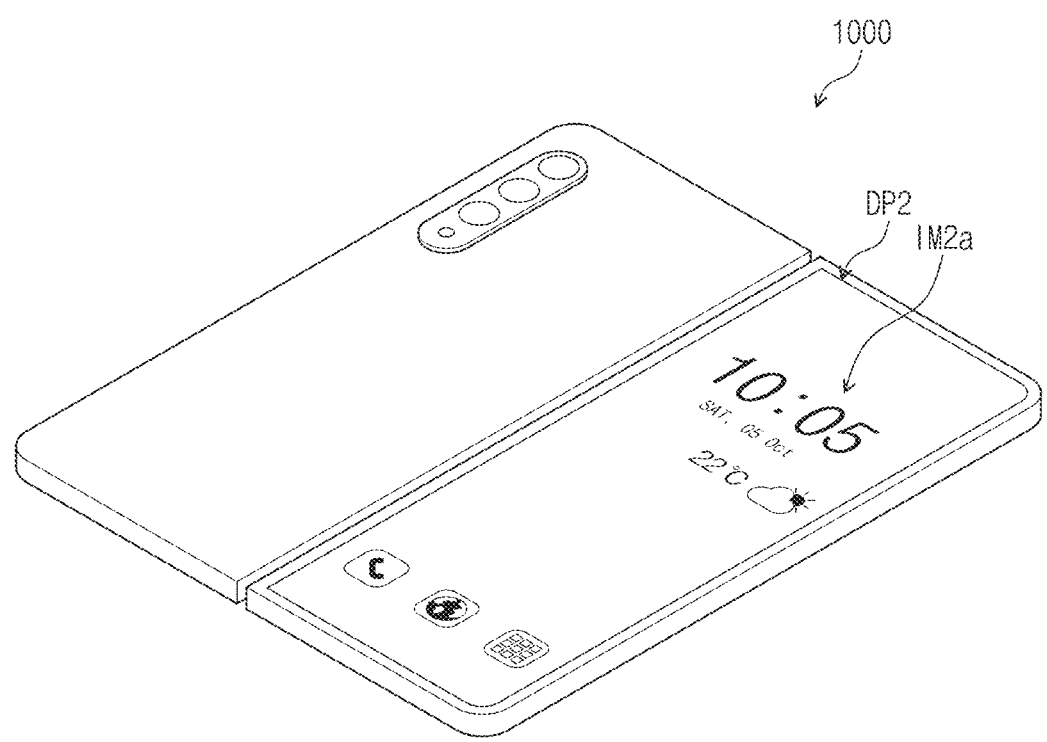
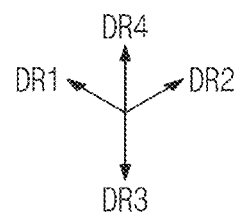

FIG. 9
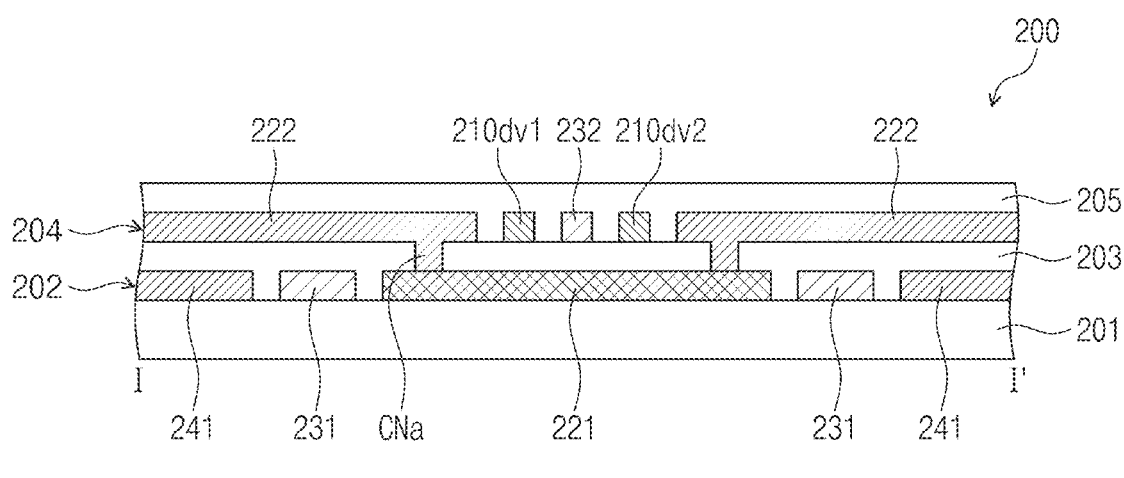
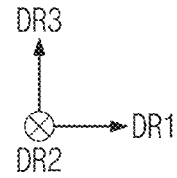

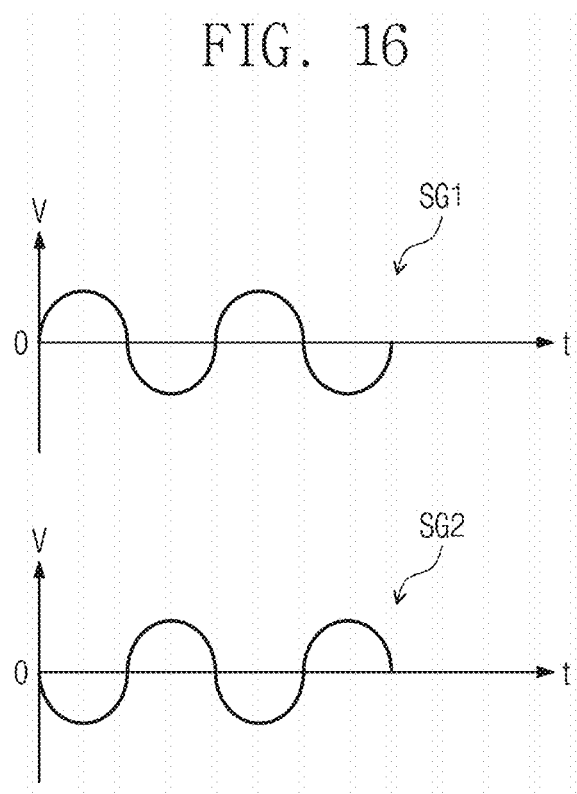

FIG. 17A

| | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | SG2 | FL | FL | SG1 | SG1 | FL | FL | FL | FL | FL | FL | FL |
| t2 | SG2 | SG2 | FL | FL | SG1 | SG1 | FL | FL | FL | FL | FL | FL |
| t3 | FL | SG2 | SG2 | FL | FL | SG1 | SG1 | FL | FL | FL | FL | FL |
| t4 | FL | FL | SG2 | SG2 | FL | FL | SG1 | SG1 | FL | FL | FL | FL |
| t5 | FL | FL | FL | SG2 | SG2 | FL | FL | SG1 | SG1 | FL | FL | FL |
| t6 | FL | FL | FL | FL | SG2 | SG2 | FL | FL | SG1 | SG1 | FL | FL |
| t7 | FL | FL | FL | FL | FL | SG2 | SG2 | FL | FL | SG1 | SG1 | FL |
| t8 | FL | FL | FL | FL | FL | FL | SG2 | SG2 | FL | FL | SG1 | SG1 |
| t9 | FL | FL | FL | FL | FL | FL | FL | SG2 | SG2 | FL | FL | SG1 |

FIG. 17B

| | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | SG2 | SG2 | FL | FL | SG1 | SG1 | FL | FL | FL | FL | FL | FL |
| t2 | FL | SG2 | SG2 | FL | FL | SG1 | SG1 | FL | FL | FL | FL | FL |
| t3 | FL | FL | SG2 | SG2 | FL | FL | SG1 | SG1 | FL | FL | FL | FL |
| t4 | FL | FL | FL | SG2 | SG2 | FL | FL | SG1 | SG1 | FL | FL | FL |
| t5 | FL | FL | FL | FL | SG2 | SG2 | FL | FL | SG1 | SG1 | FL | FL |
| t6 | FL | FL | FL | FL | FL | SG2 | SG2 | FL | FL | SG1 | SG1 | FL |
| t7 | FL | FL | FL | FL | FL | FL | SG2 | SG2 | FL | FL | SG1 | SG1 |

FIG. 19A

| | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | FL | FL | SG2 | SG2 | FL | FL | SG1 | SG1 | FL | FL | FL | FL |
| t2 | FL | FL | FL | SG2 | SG2 | FL | FL | SG1 | SG1 | FL | FL | FL |
| t3 | FL | FL | FL | FL | SG2 | SG2 | FL | FL | SG1 | SG1 | FL | FL |

| | 232t | 230ch1 | 230ch2 | 230ch3 | 230ch4 | 230ch5 | 230ch6 | 230ch7 | 230ch8 | 230ch9 | 230ch10 | 233t |
|---|---|---|---|---|---|---|---|---|---|---|---|---|
| t1 | FL | SG2 | SG2 | FL | FL | SG1 | SG1 | FL | FL | FL | FL | FL |
| t2 | FL | FL | SG2 | SG2 | FL | FL | SG1 | SG1 | FL | FL | FL | FL |
| t3 | FL | FL | FL | SG2 | SG2 | FL | FL | SG1 | SG1 | FL | FL | FL |
| t4 | FL | FL | FL | FL | SG2 | SG2 | FL | FL | SG1 | SG1 | FL | FL |
| t5 | FL | FL | FL | FL | FL | SG2 | SG2 | FL | FL | SG1 | SG1 | FL |

PN-dt

ELECTRONIC DEVICE

CROSS-REFERENCE TO RELATED APPLICATIONS

This application claims priority to, and the benefit of, Korean Patent Application No. 10-2023-0149456, filed on Nov. 1, 2023, the entire contents of which are hereby incorporated by reference.

BACKGROUND

The present disclosure herein relates to an electronic device including an input sensor.

Multimedia electronic devices, such as televisions, mobile phones, tablet computers, laptops, navigation systems, and game consoles include a display device for displaying images. An electronic device may include a sensor layer (or input sensor) capable of providing a touch-based input method, which allows a user to input information or a command easily, intuitively, and conveniently, in addition to including other input methods, such as a button, a keyboard, and a mouse. The sensor layer may sense a touch or pressure of a user.

Meanwhile, there is an increasing demand for the use of a pen for users accustomed to inputting information by using a writing instrument, or for the use of detailed touch input for corresponding application programs (for example, application programs for sketching or drawing).

SUMMARY

The present disclosure provides an electronic device capable of sensing inputs by different types of input means.

One or more embodiments of the present disclosure provides an electronic device including a sensor layer including a main region and a peripheral region, and including electrodes in the main region, and including first sensing electrodes extending in a first direction, second sensing electrodes extending in a second direction crossing the first direction, first electrodes extending in the first direction, respectively overlapping the first sensing electrodes, and each of the first electrodes including a first end and a second end, and second electrodes extending in the second direction, and respectively overlapping the second sensing electrodes, a connection line in the peripheral region, and including a first connection line connecting between the second end of each of at least two first electrodes of the first electrodes and a first pad, and a second connection line connecting between the first end of each of the at least two first electrodes and a second pad, wherein the second connection line includes a first portion having a first line width and a second portion having a second line width, wherein the first line width is larger than the second line width, wherein a first signal is applied to the first connection line when a second signal is applied to the second connection line at a first time, and wherein the first signal has a first phase and the second signal has a second phase opposite to the first phase.

The second connection line may include a first line portion connected to the first end of each of the at least two first electrodes and facing the first pad in the first direction, a second line portion extending from the first line portion, and a third line portion extending from the first line portion, wherein the second line portion and the third line portion are facing each other in the second direction, and wherein at least one of the second line portion or the third line portion includes the first portion and the second portion.

A resistance of the second line portion may be less than a resistance of one of the first electrodes.

A resistance of the second line portion may be substantially same to a resistance of the at least two first electrodes.

The connection line may further include third connection lines in the peripheral region, and respectively connected to the first sensing electrodes, a first-first connection line connected to one of the second sensing electrodes, a first-second connection line connected to another one of the second sensing electrodes, a second-first connection line connected to first group electrodes of the second electrodes, and one of the first group electrodes overlapping the one of the second sensing electrodes, and a second-second connection line connected to second group electrodes of the second electrodes, and one of the second group electrodes overlapping the another one of the second sensing electrodes.

The first-second connection line may be disposed between the second-first connection line and the main region in the second direction, wherein the second-second connection line is disposed between the first-first connection line and the main region in the second direction.

The sensor layer may further include a first insulating layer and a second insulating layer overlapping the main region and the peripheral region, wherein each of the first sensing electrodes includes a first split electrode and a second split electrode that are above the first insulating layer and the second insulating layer, and that are spaced apart from each other in the second direction, and wherein each of the second sensing electrodes includes sensing patterns above the first insulating layer and the second insulating layer, and bridge patterns between the first insulating layer and the second insulating layer, and connected to the sensing patterns.

Each of the first electrodes may include a first pattern between the first insulating layer and the second insulating layer, extending in the first direction, and overlapping the first split electrode and the second split electrode, and a second pattern above the first insulating layer and the second insulating layer, extending in the first direction, and between the first split electrode and the second split electrode in the second direction, wherein the first pattern and the second pattern are connected to each other through a contact hole passing through the second insulating layer.

Each of the second electrodes may include first patterns between the first insulating layer and the second insulating layer, and spaced apart from each other in the second direction, a second pattern between the first insulating layer and the second insulating layer, and between two adjacent ones of the first patterns in the second direction, and third patterns above the first insulating layer and the second insulating layer, and spaced apart from each other in the second direction, wherein the first patterns respectively overlap corresponding ones of the sensing patterns, and wherein the third patterns are respectively connected to the first patterns, and is connected to the second pattern.

The second connection line may include a first layer portion between the first insulating layer and the second insulating layer, and a second layer portion above the first insulating layer and the second insulating layer, and connected to the first layer portion.

The first layer portion may have a larger line width than the second layer portion.

The first layer portion may have a larger line width than the first connection line.

The connection line may further include third connection lines in the peripheral region, respectively connected to the first sensing electrodes, and above the first insulating layer and the second insulating layer, a first-first connection line connected to one of the second sensing electrodes and above the first insulating layer and the second insulating layer, a first-second connection line connected to another one of the second sensing electrodes and above the first insulating layer and the second insulating layer, a second-first connection line above the first insulating layer and the second insulating layer, connected to first group electrodes of the second electrodes, and one of the first group electrodes overlapping the one of the second sensing electrodes, and a second-second connection line above the first insulating layer and the second insulating layer, connected to second group electrodes of the second electrodes, and one of the second group electrodes overlapping the another one of the second sensing electrodes.

The electronic device may further include a sensor driver configured to drive the sensor layer in a first mode for sensing a touch input, or in a second mode for sensing a pen input.

In the second mode, the sensor driver may be configured to receive a first induced current flowing from the first electrodes toward the first sensing electrodes through first coupling capacitors defined between the first electrodes and the first sensing electrodes, and is configured to receive a second induced current flowing from the second electrodes toward the second sensing electrodes through second coupling capacitors defined between the second electrodes and the second sensing electrodes.

In one or more embodiments of the present disclosure, an electronic device includes a sensor layer including a main region and a peripheral region, and including electrodes in the main region, and including first sensing electrodes extending in a first direction, second sensing electrodes extending in a second direction crossing the first direction, first electrodes extending in the first direction, respectively overlapping the first sensing electrodes, and each of the first electrodes including a first end and a second end, and second electrodes extending in the second direction, and respectively overlapping the second sensing electrodes, a connection line in the peripheral region, and including a first connection line connecting between the second end of each of at least two first electrodes of the first electrodes and a first pad, and a second connection line connecting between the first end of each of the at least two first electrodes and a second pad, wherein the second connection line includes a first line portion facing the at least two first electrodes in the second direction, wherein a resistance of the first line portion of the second connection line is less than a resistance of one of the at least two first electrodes, and wherein a first signal is applied to the first connection line when a second signal different the first signal is applied to the second connection line at a first time.

The first signal may include a sinusoidal signal or square wave signal that has opposite phase to the second signal.

The at least two first electrodes of the first electrodes may be defined as first group electrodes, wherein the first electrodes further include second group electrodes disposed between the first line portion and the first group electrodes.

The first electrodes may further include third group electrodes, wherein the first group electrodes disposed between the second group electrodes and the third group electrodes, and wherein the second group electrodes and the third group electrodes do not receive the first signal and the second signal at the first time.

The first signal may be applied to the second group electrodes and the second signal is applied to the third group electrodes at a second time, wherein the first group electrodes do not receive the first signal and the second signal at the second time.

The first line portion may include a first layer portion, and a second layer portion overlapping the first layer portion, at a layer that is different from that of the first layer portion, and having a width that is less than a width of the first layer portion.

In one or more embodiments of the present disclosure, an electronic device includes a sensor layer including a main region and a peripheral region, and including electrodes in the main region, and including first sensing electrodes extending in a first direction, second sensing electrodes extending in a second direction crossing the first direction, first electrodes extending in the first direction, respectively overlapping the first sensing electrodes, and each of the first electrodes including a first end and a second end, and second electrodes extending in the second direction, and respectively overlapping the second sensing electrodes, a line in the peripheral region, and including a first-first line connected to one of the second sensing electrodes, a first-second line connected to another one of the second sensing electrodes, a second-first line connected to first group electrodes of the second electrodes, and one of the first group electrodes overlapping the one of the second sensing electrodes, a second-second line connected to second group electrodes of the second electrodes, and one of the second group electrodes overlapping the another one of the second sensing electrodes, a third line connected to the first end of each of at least two first electrodes of the first electrodes, and a fourth line connected to the second end of each of the at least two first electrodes, wherein the first-second line is disposed between the second-first line and the main region in the second direction, the second-second line is disposed between the first-first line and the main region in the second direction, and a first signal is applied to the third line when a second signal different from the first signal is applied to the fourth line at a first time.

The electronic device may further include fifth lines in the peripheral region, and respectively connected to the first sensing electrodes.

The third line may include a first line portion connected to the first end of each of the at least two first electrodes, a second line portion extending from the first line portion, and a third line portion extending from the first line portion, wherein the second line portion and the third line portion are facing each other in the second direction, wherein the second-first line is disposed between the second line portion and the first-second line in the second direction, and wherein the first-first line is disposed between the third line portion and the second-second line in the second direction.

The third line may include at least two portions having different line widths.

In one or more embodiments of the present disclosure, a method of driving a sensor layer of an electronic device, the method including at a first time driving a first connection line with a first signal, the first connection line connected to a first end of each of first electrodes, driving a second connection line with the first signal, the second connection line connected to a second end of each of first group electrodes of the first electrodes, and driving a third connection line with a second signal different from the first signal, the third connection line connected to a second end of each of second group electrodes of the first electrodes. A magnetic field generated from the first connection line, the first group electrodes, and the second group electrodes by the driving the first connection line, the driving the second connection line, and the driving the third connection line charges a RLC resonance circuit of a pen at the first time.

The method may further include electrically disconnecting between a fourth connection line and a sensor driver at the first time, wherein the sensor driver is configured to provide the first signal and the second signal, and wherein third group electrodes of the first electrodes are extended in a first direction, disposed between the first group electrodes and the second group electrodes in a second direction crossing the first direction, and connected to the fourth connection line, The method may further include, at a second time, electrically disconnecting between the first connection line and the sensor driver, driving the second connection line with the first signal, driving the third connection line with the second signal, and electrically disconnecting between the fourth connection line and the sensor driver.

The first signal may include a sinusoidal signal or square wave signal that has opposite phase to the second signal.

The method may further include detecting a position of the pen, and driving respective ones of the first connection line, the second connection line, and the third connection line based upon the position of the pen.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings:

FIG. 1B is a rear-side perspective view of the electronic device according to one or more embodiments of the present disclosure;

FIG. 9 is a cross-sectional view of the sensor layer according to one or more embodiments of the present disclosure, which is taken along the line I-I' illustrated in each of FIGS. 8A and 8B;

FIG. 16 shows graphs illustrating the waveforms of a first signal and a second signal according to one or more embodiments of the present disclosure;

FIG. 17A is a table showing signals provided to the sensor layer according to one or more embodiments of the present disclosure;

FIG. 17B is a table showing signals provided to the sensor layer according to one or more embodiments of the present disclosure;

FIG. 19A is a table showing signals provided to the sensor layer according to one or more embodiments of the present disclosure;

FIG. 19B is a table showing signals provided to the sensor layer according to one or more embodiments of the present disclosure;

DETAILED DESCRIPTION

Figure 1A:
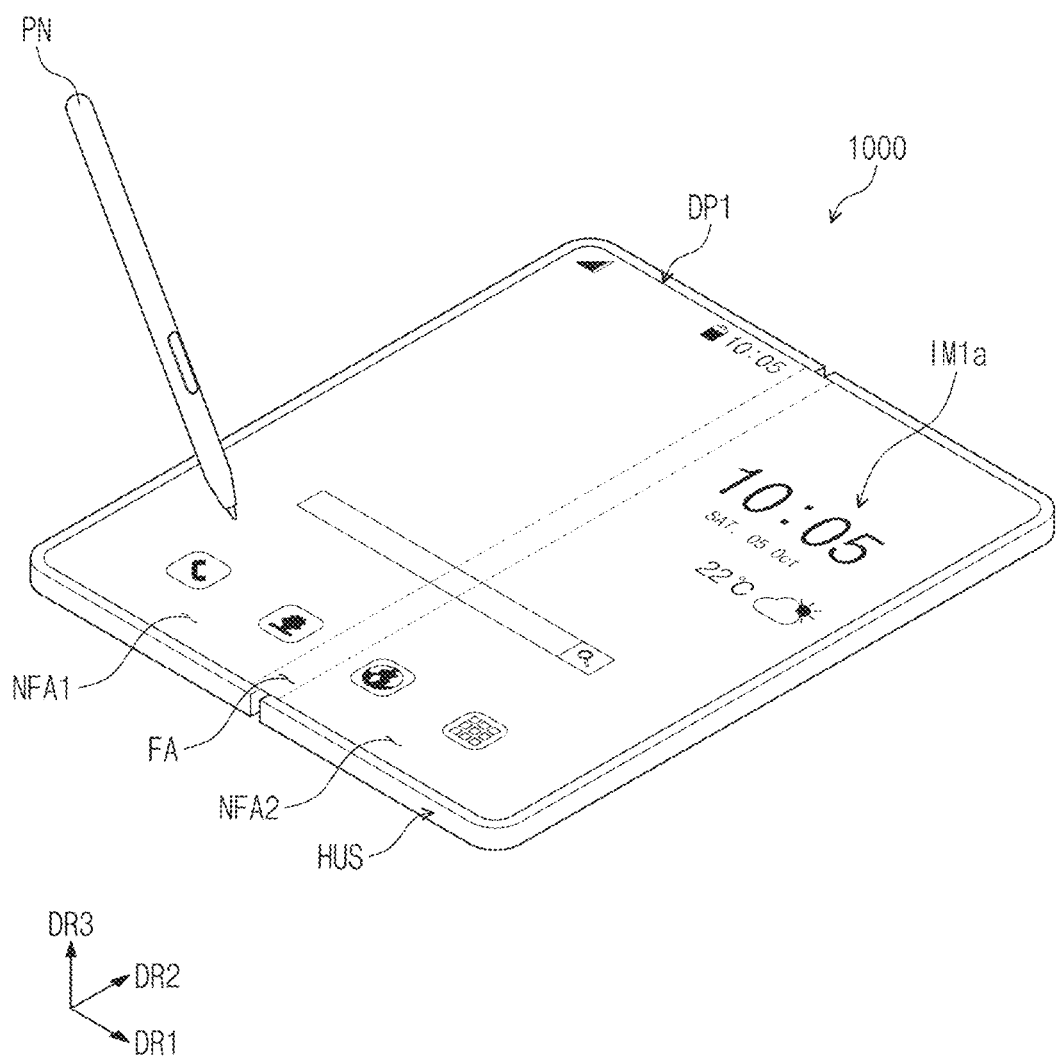
FIG. 1A is a perspective view of an electronic device according to one or more embodiments of the present disclosure.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

The term "part" or "unit" refers to a software component or hardware component that performs a corresponding function. The hardware component may include, for example, a field-programmable gate array (FPGA) or an application-specific integrated circuit (ASIC). The software component may refer to an executable code and/or data used by the executable code in an addressable storage medium. Accordingly, the software components may be, for example, object-oriented software components, class components, and task components, and may include processes, functions, attributes, procedures, subroutines, program code segments, drivers, firmware, micro codes, circuits, data, databases, data structures, tables, arrays or variables.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described with reference to the drawings.

Figure 2:
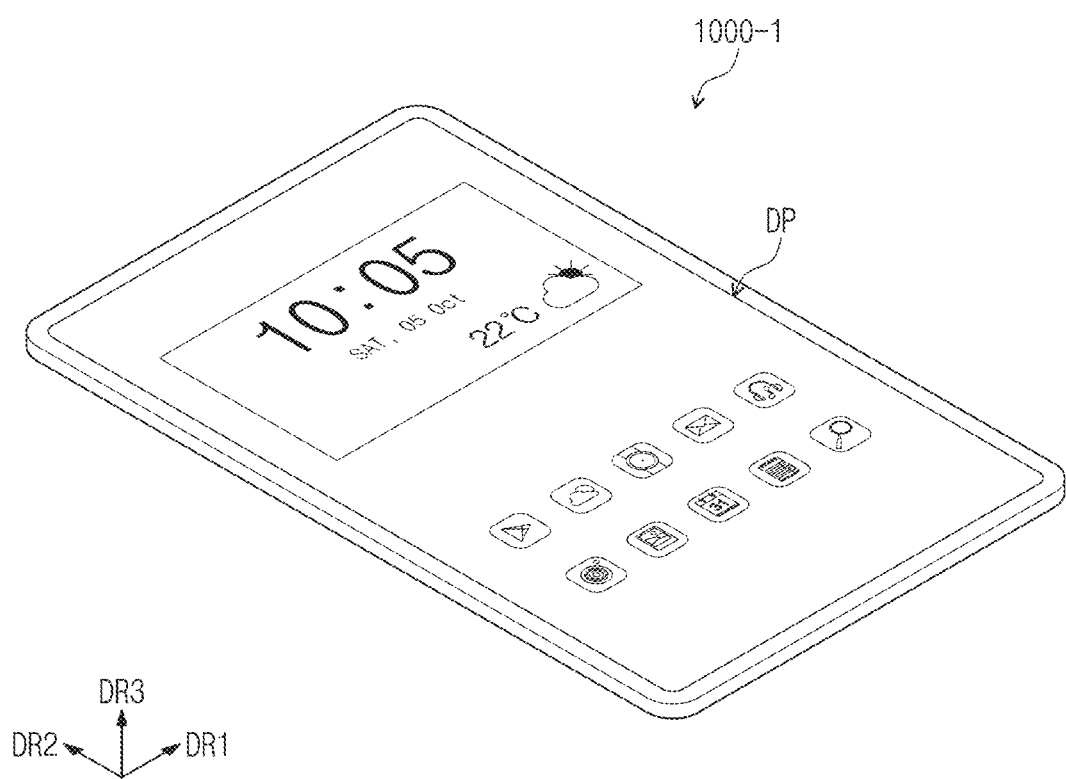
FIG. 2 is a perspective view of an electronic device according to one or more embodiments of the present disclosure.

FIG. 1A is a perspective view of an electronic device 1000 according to one or more embodiments of the present disclosure. FIG. 1B is a rear-side perspective view of the electronic device 1000 according to one or more embodiments of the present disclosure. FIG. 2 is a perspective view of an electronic device 1000-1 according to one or more embodiments of the present disclosure.

Referring to FIGS. 1A and 1B, the electronic device 1000 may be a display device that is activated according to an electrical signal. For example, the electronic device 1000 may display an image, and may sense an externally applied input. An external input may be a user's input. The external input may include various types of inputs, such as an input by a body part of a user, or an input by an input means.

The electronic device 1000 may include a first display panel DP1 and a second display panel DP2. The first display panel DP1 and the second display panel DP2 may be separate panels. The first display panel DP1 may be referred to as a main display panel, and the second display panel DP2 may be referred to as an auxiliary display panel or an external display panel. Each of the first display panel DP1 and the second display panel DP2 may be coupled to a housing HUS.

The area of the second display panel DP2 may be less than the area of the first display panel DP1. If the electronic device 1000 is unfolded, the first display panel DP1 may have a plane that is substantially parallel to a first direction DR1 and to a second direction DR2. The thickness direction of the electronic device 1000 may be parallel to a third direction DR3 that crosses the first direction DR1 and the second direction DR2. Accordingly, the front (or upper) and rear (or lower) surfaces of members constituting the electronic device 1000 may be defined based on the third direction DR3.

The first display panel DP1 may include a folding region FA, which may be folded and unfolded, and a plurality of non-folding regions NFA1 and NFA2 spaced apart from each other with the folding region FA interposed therebetween. The second display panel DP2 may overlap any one of the plurality of non-folding regions NFA1 or NFA2. For example, the second display panel DP2 may overlap a first non-folding region NFA1.

The display direction of a first image IM1a displayed on a portion of the first display panel DP1 (e.g., on the first non-folding region NFA1), and the display direction of a second image IM2a displayed on the second display panel DP2, may be opposite to each other. For example, the first image IM1a may be displayed in the third direction DR3, and the second image IM2a may be displayed in a fourth direction DR4 (see FIG. 1B) that is opposite to the third direction DR3.

In one or more embodiments of the present disclosure, the folding region FA may be bent based on a folding axis extending in a direction parallel to the long side of the electronic device 1000, for example, in a direction parallel to the second direction DR2. In a state in which the electronic device 1000 is folded, the folding region FA has a curvature (e.g., predetermined curvature) and a curvature radius (e.g., predetermined curvature radius). The first non-folding region NFA1 and a second non-folding region NFA2 face each other, or are opposite to each other, and the electronic device 1000 may be inner-folded so that the first display panel DP1 is not exposed to the outside. That is, the first display panel DP1 may be inner-folded.

In one or more embodiments of the present disclosure, the first display panel DP1 may be outer-folded so as to be exposed to the outside. In one or more embodiments of the present disclosure, the electronic device 1000 may selectively operate between being inner-folded and being outer-folded from an unfolded state, but the present disclosure is not limited thereto.

FIG. 1A illustrates that one folding region FA is defined in the electronic device 1000, but the present disclosure is not limited thereto. For example, a plurality of folding axes and a plurality of folding regions corresponding thereto may be defined in the electronic device 1000-1, and the electronic device 1000 may be inner-folded or outer-folded in an unfolded state in each of the plurality of folding regions.

According to one or more embodiments of the present disclosure, at least one of the first display panel DP1 or the second display panel DP2 may sense an input by a pen PN, even though a digitizer is not included. Accordingly, because the digitizer for sensing the pen PN is omitted, it is possible to reduce the thickness and weight of the electronic device 1000, and to increase the flexibility of the electronic device 1000, which may be otherwise undesirably affected due to the addition of the digitizer. Accordingly, not only the first display panel DP1 but also the second display panel DP2 may be designed to sense the pen PN.

Referring to FIG. 2, the electronic device 1000-1 may be a mobile phone or a tablet and is not particularly limited thereto. The electronic device 1000-1 may include a display panel DP.

In one or more embodiments of the present disclosure, the display panel DP may sense external inputs. According to one or more embodiments of the present disclosure, the display panel DP may sense an input by the pen PN although a digitizer is not included/is omitted. Accordingly, because the digitizer for sensing the pen PN is omitted, the thickness and weight of the electronic device 1000-1 or 1000-2 need not increase due to the addition of the digitizer.

FIGS. 1A and 1B illustrate a foldable-type electronic device 1000, and FIG. 2 illustrates a flat-type electronic device 1000-1, but the present disclosure is not limited thereto. For example, the descriptions given below may be applied to various electronic devices, such as a rollable-type electronic device, a slidable-type electronic device, and a stretchable-type electronic device.

Figure 3:
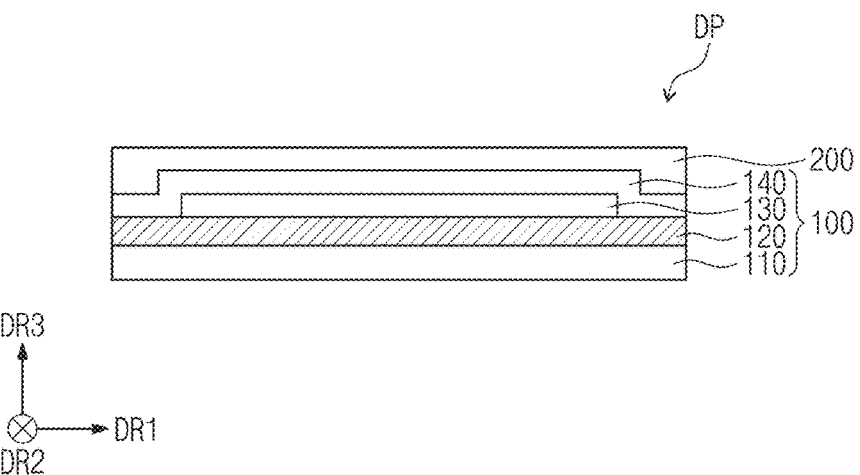
FIG. 3 is a schematic cross-sectional view of a display panel according to one or more embodiments of the present disclosure.

FIG. 3 is a schematic cross-sectional view of a display panel DP according to one or more embodiments of the present disclosure. The display panel DP may be the first display panel DP1 or the second display panel DP2 of FIG. 1.

Referring to FIG. 3, the display panel DP may include a display layer 100 and a sensor layer 200. In one or more embodiments of the present disclosure, the display layer 100 may be defined as a display panel, and the sensor layer 200 may be defined as an input sensor.

The display layer 100 may be configured to substantially generate an image. The display layer 100 may be a light-emitting display layer. For example, the display layer 100 may include an organic light-emitting display layer, an inorganic light-emitting display layer, an organic-inorganic light-emitting display layer, a quantum dot display layer, a micro LED display layer, or a nano LED display layer. The display layer 100 may include a base layer 110, a circuit layer 120, a light-emitting element layer 130, and an encapsulation layer 140.

The base layer 110 may be a member that provides a base surface on which the circuit layer 120 is located. The base layer 110 may have a multi-layered structure or a single-layered structure. The base layer 110 may be a glass substrate, a metal substrate, a silicon substrate, or a polymer substrate, but is not particularly limited thereto.

The circuit layer 120 may be located on the base layer 110 (as used herein, "located on" may mean "above"). The circuit layer 120 may include an insulating layer, a semiconductor pattern, a conductive pattern, a signal line, and/or the like. An insulating layer, a semiconductor layer, and a conductive layer may be formed on the base layer 110 by coating, deposition, etc., and the insulating layer, the semiconductor layer, and the conductive layer may be selectively patterned through a plurality of photolithography processes. In one or more embodiments of the present disclosure, the circuit layer 120 may be defined as a driving element layer.

The light-emitting element layer 130 may be located on the circuit layer 120. The light-emitting element layer 130 may include a light-emitting element. For example, the light-emitting element layer 130 may include an organic light-emitting material, an inorganic light-emitting material, an organic-inorganic light-emitting material, a quantum dot, a quantum rod, a micro LED, or a nano LED.

The encapsulation layer 140 may be located on the light-emitting element layer 130. The encapsulation layer 140 may protect the light-emitting element layer 130 from moisture, oxygen, and foreign substances, such as dust particles.

The sensor layer 200 may be located on the display layer 100. The sensor layer 200 may sense an external input. The sensor layer 200 may be an integrated sensor formed continuously during the manufacturing process of the display layer 100, or the sensor layer 200 may be an external sensor attached to the display layer 100. The sensor layer 200 may be referred to as a sensor, an input-sensing layer, an input-sensing panel, or an electronic device for sensing an input coordinate.

In one or more embodiments of the present disclosure, a portion of the sensor layer 200 may be located on the display layer 100, and a portion of the sensor layer 200 may be located below the display layer 100. For example, a first conductive layer 202 and a sensing-insulating layer (which may be referred to as a second insulating layer in the claims) 203 illustrated in FIG. 5 may be located below the display layer 100, as opposed to above the display layer 100. In this case, a second conductive layer 204 and a cover-insulating layer 205 may be located on a base-insulating layer (which may be referred to as a first insulating layer in the claims) 201. The first conductive layer 202 may be located below the base layer 110, and the sensing-insulating layer 203 may be located below the first conductive layer 202.

According to one or more embodiments of the present disclosure, the sensor layer 200 may sense not only an input by a body part of a user, but also an input by an input means that generates a magnetic field at a resonant frequency (e.g., predetermined resonant frequency). In one or more embodiments of the present disclosure, the input means that generates a magnetic field at a resonance frequency (e.g., predetermined resonance frequency) may be referred to as a pen, an input pen, a magnetic pen, a stylus pen, or an electromagnetic resonance pen.

Figure 4:
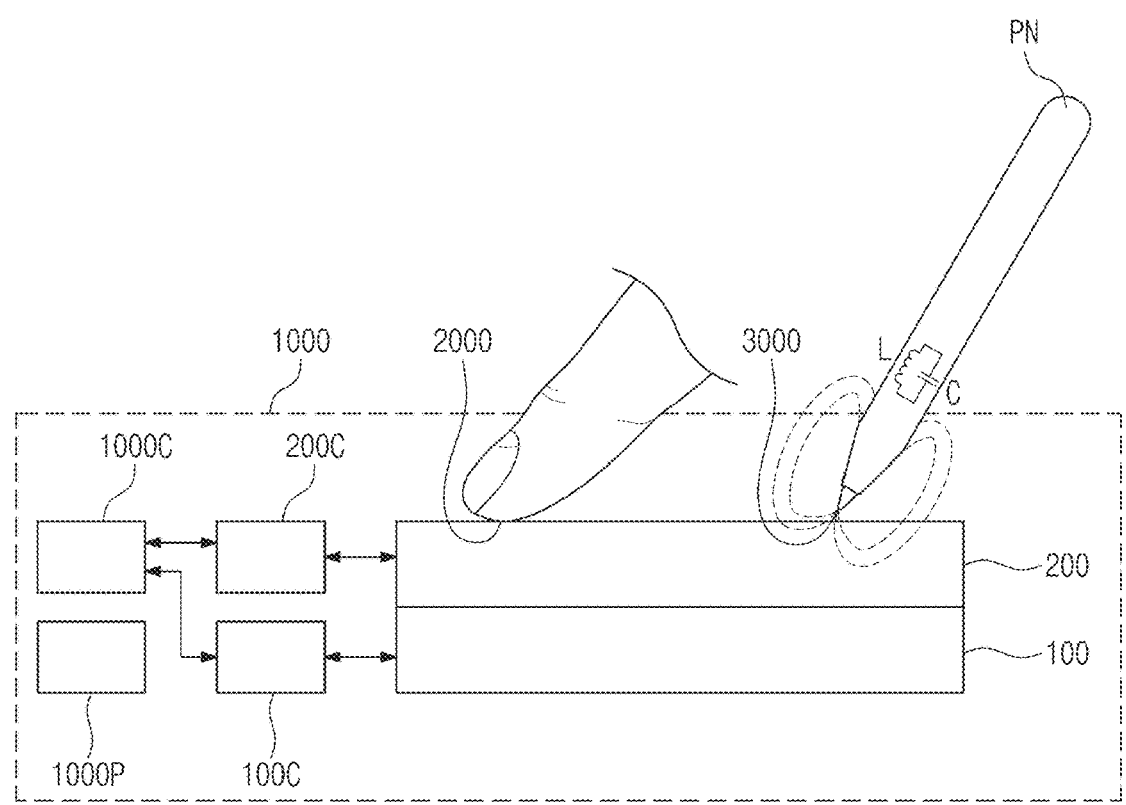
FIG. 4 describes an operation of an electronic device according to one or more embodiments of the present disclosure.

FIG. 4 describes an operation of the electronic device 1000 according to one or more embodiments of the present disclosure.

Referring to FIG. 4, the electronic device 1000 may include a display layer 100, a sensor layer 200, a display driver 100C, a sensor driver 2000, a main driver 1000C, and a power circuit 1000P.

The sensor layer 200 may sense a first input 2000 or a second input 3000 applied from the outside. Each of the first input 2000 and the second input 3000 may be an input means capable of providing a change in the capacitance of the sensor layer 200, or an input means capable of causing an induced current in the sensor layer 200. For example, the first input 2000 may be an input means capable of providing an electric charge. The second input 3000 may be an input by a pen PN or an RFIC tag. For example, the pen PN may be a passive-type pen or an active-type pen.

In one or more embodiments of the present disclosure, the pen PN may be a device that generates a magnetic field at a resonant frequency (e.g., predetermined resonant frequency). The pen PN may be configured to transmit an output signal based on an electromagnetic resonance method. The pen PN may be referred to as an input pen, a magnetic pen, a stylus pen, or an electromagnetic resonance pen.

The pen PN may include an RLC resonance circuit, and the RLC resonance circuit may include an inductor L and a capacitor C. In one or more embodiments of the present disclosure, the RLC resonance circuit may be a variable resonance circuit that varies a resonance frequency. In this case, the inductor L may be a variable inductor and/or the capacitor C may be a variable capacitor, but the present disclosure is not particularly limited thereto.

The inductor L generates a current by a magnetic field formed in the sensor layer 200. However, the present disclosure is not particularly limited thereto. For example, if the pen PN operates as an active type, the pen PN may generate a current even though the pen PN does not receive a magnetic field from the outside. The generated current is transmitted to the capacitor C. The capacitor C is charged with the current input from the inductor L, and discharges the charged current to the inductor L. Hereafter, the inductor L may emit a magnetic field at a resonant frequency. An induced current may flow in the sensor layer 200 due to a magnetic field emitted by the pen PN, and the induced current may be transmitted to the sensor driver 2000 as a reception signal (or sensing signal).

The main driver 1000C may control the overall operation of the electronic device 1000. For example, the main driver 1000C may control the operation of the display driver 100C and the sensor driver 2000. The main driver 1000C may include at least one microprocessor, and may further include a graphic controller. The main driver 1000C may be referred to as an application processor, a central processing unit, or a main processor.

The display driver 100C may drive the display layer 100. The display driver 100C may receive image data and control signals from the main driver 1000C. The control signal may include various signals. For example, the control signal may include an input vertical synchronization signal, an input horizontal synchronization signal, a main clock, a data enable signal, and/or the like.

The sensor driver 2000 may drive the sensor layer 200. The sensor driver 2000 may receive a control signal from the main driver 1000C. The control signal may include a clock signal of the sensor driver 2000. In addition, the control signal may further include a mode determination signal that determines the driving modes of the sensor driver 2000 and the sensor layer 200.

The sensor driver 2000 may be implemented as an integrated circuit IC, and may be electrically connected to the sensor layer 200. For example, the sensor driver 2000 may be mounted directly on a region (e.g., predetermined region) of the display panel, or may be mounted on a separate printed circuit board by a chip on film (COF) method so as to be electrically connected to the sensor layer 200.

The sensor driver 2000 may selectively operate the sensor layer 200 in the first mode or the second mode. For example, the first mode may be a mode for sensing a touch input, for example, the first input 2000. The second mode may be a mode for sensing a pen PN input, for example, the second input 3000. The first mode may be referred to as a touch-sensing mode (e.g., a pen standby mode), and the second mode may be referred to as a pen-sensing mode.

Conversion between the first mode and the second mode may be carried out in a variety of ways. For example, the sensor driver 2000 and the sensor layer 200 may be time-dividedly driven in the first mode and the second mode, and may sense the first input 2000 and the second input 3000.

Alternatively, conversion between the first mode and the second mode may occur due to a selection or corresponding action of a user, or any one of the first mode or the second mode may be activated or deactivated, or converted into the other mode thereof by activation or deactivation of a corresponding application. Alternatively, while the sensor driver 2000 and the sensor layer 200 operate alternately in the first mode and the second mode, the first mode may be maintained if the first input 2000 is sensed, or the second mode may be maintained if the second input 3000 is sensed.

The sensor driver 2000 may calculate the coordinate information of an input, based on a signal received from the sensor layer 200, and may provide the main driver 1000C with a coordinate signal having the coordinate information. The main driver 1000C executes an operation corresponding to a user input, based on the coordinate signal. For example, the main driver 1000C may operate the display driver 1000 so that a new application image is displayed on the display layer 100.

The power circuit 1000P may include a power management integrated circuit (PMIC). The power circuit 1000P may generate a plurality of driving voltages for driving the display layer 100, the sensor layer 200, the display driver 1000, and the sensor driver 2000. For example, the plurality of driving voltages may include a gate high voltage, a gate low voltage, a first driving voltage (e.g., ELVSS voltage), a second driving voltage (e.g., ELVDD voltage), an initialization voltage, and/or the like, but the present disclosure is not limited to the above examples.

Figure 5:
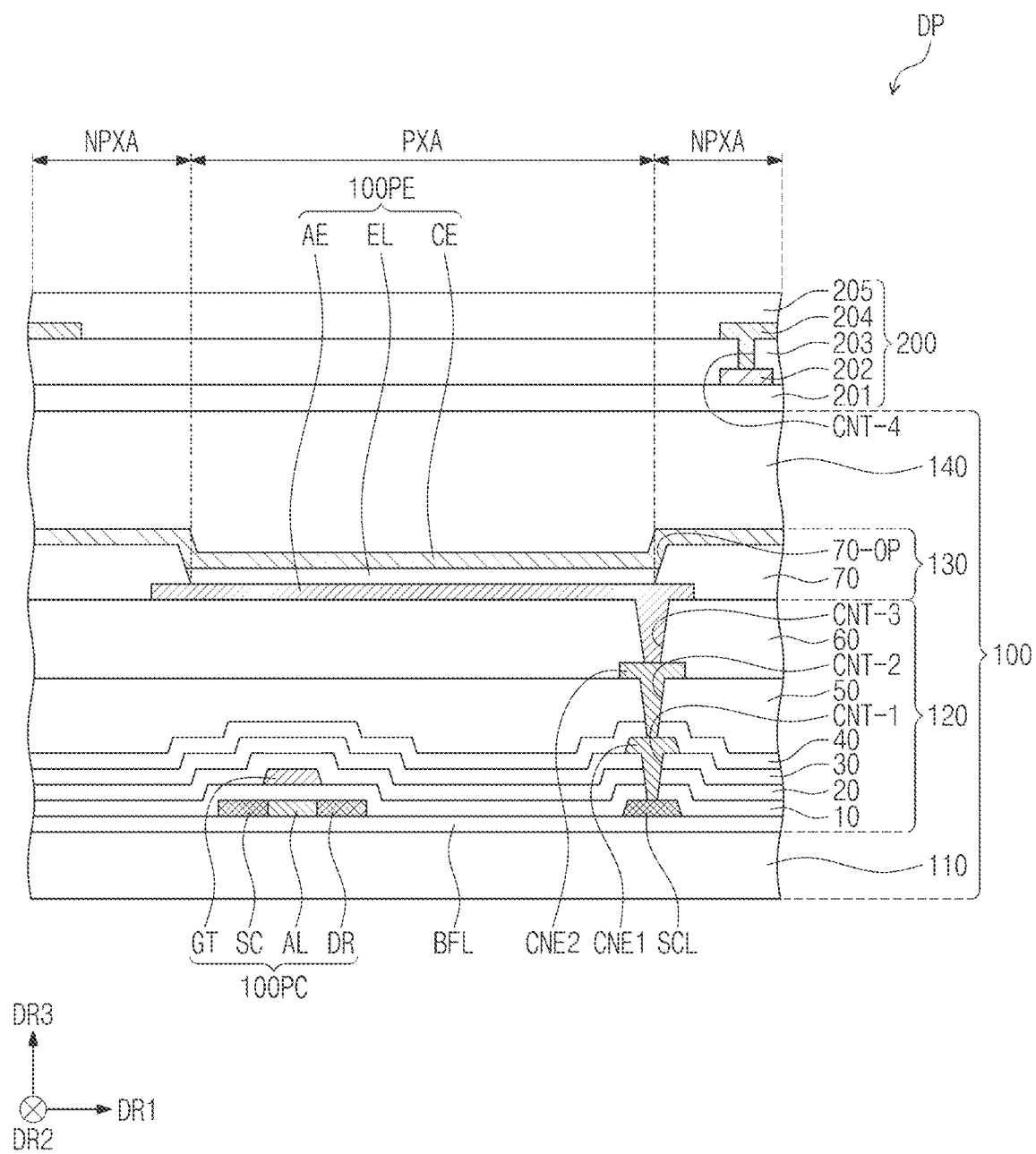
FIG. 5 is a cross-sectional view of the display panel according to one or more embodiments of the present disclosure.

FIG. 5 is a cross-sectional view of the display panel DP according to one or more embodiments of the present disclosure. The display panel DP may be the first display panel DP1 or the second display panel DP2 of FIG. 1.

Referring to FIG. 5, at least one buffer layer BFL is formed on the upper surface of the base layer 110. The buffer layer BFL may improve the bonding strength between the base layer 110 and the semiconductor pattern. The display layer 100 may further include a barrier layer. The buffer layer BFL may include at least one of silicon oxide, silicon nitride, or silicon oxynitride. For example, the buffer layer BFL may include a structure in which a silicon oxide layer and a silicon nitride layer are alternately stacked.

Semiconductor patterns SC, AL, DR, and SCL may be located on the buffer layer BFL. The semiconductor patterns SC, AL, DR, and SCL may include polysilicon. Without being limited thereto, however, the semiconductor patterns SC, AL, DR, and SCL may include amorphous silicon, low-temperature polycrystalline silicon, or oxide semiconductor.

FIG. 5 illustrates only some semiconductor patterns SC, AL, DR, and SCL, and additional semiconductor patterns may be located in other regions. The semiconductor patterns SC, AL, DR, and SCL may be arranged in a corresponding rule across pixels. The semiconductor patterns SC, AL, DR, and SCL may have different electrical properties depending on whether or not they are doped. The semiconductor patterns SC, AL, DR, and SCL may include a first region SC, DR, and SCL having high conductivity, and a second region AL having low conductivity. The first region SC, DR, and SCL may be doped with an N-type dopant or a P-type dopant. A P-type transistor may include a doped region doped with a P-type dopant, and an N-type transistor may include a doped region doped with an N-type dopant. The second region AL may be a non-doped region, or may be a region doped at a lower concentration than the first region.

The conductivity of the first region SC, DR, and SCL may be greater than that of the second region AL, and the first region SC, DR, and SCL may substantially serve as an electrode or a signal line. The second region AL may substantially correspond to an active region AL (or channel) of a transistor 100PC. In other words, a portion of the semiconductor patterns SC, AL, DR, and SCL may be an active region AL of the transistor 100PC, another portion thereof may be a source region SC or drain region DR of the transistor 100PC, and still another portion thereof may be a connection electrode or a connection signal line SCL.

Each of the pixels may have an equivalent circuit including seven transistors, one capacitor, and a light-emitting element, and the equivalent circuit diagram of the pixel may be modified in various forms. FIG. 5 illustrates one transistor 100PC and a light-emitting element 100PE included in the pixel.

The source region SC, active region AL, and drain region DR of the transistor 100PC may be formed from the semiconductor patterns SC, AL, DR, and SCL. The source region SC and the drain region DR may extend in opposite directions from each other from the active region AL on a cross section. FIG. 5 illustrates a portion of the connection signal line SCL formed from the semiconductor patterns SC, AL, DR, and SCL. In one or more embodiments, the connection signal line SCL may be connected to the drain region DR of the transistor 100PC on a plane.

A first insulating layer 10 may be located on the buffer layer BFL. The first insulating layer 10 may commonly overlap a plurality of pixels, and may cover the semiconductor patterns SC, AL, DR, and SCL. The first insulating layer 10 may be an inorganic layer and/or an organic layer, and may have a single-layered or multi-layered structure. The first insulating layer 10 may include at least one of aluminum oxide, titanium oxide, silicon oxide, silicon nitride, silicon oxynitride, zirconium oxide, or hafnium oxide. The first insulating layer 10 may be a single layer of silicon oxide. Not only the first insulating layer 10, but also the insulating layers of the circuit layer 120 to be described later, may be an inorganic layer and/or an organic layer, and may have a single-layered or multi-layered structure. The inorganic layer may include at least one of the above-mentioned materials, but the present disclosure is not limited thereto.

A gate GT of the transistor 100PC is located on the first insulating layer 10. The gate GT may be a portion of a metal pattern. The gate GT overlaps the active region AL. In the process of doping or reducing the semiconductor patterns SC, AL, DR, and SCL, the gate GT may function as a mask.

A second insulating layer 20 may be located on the first insulating layer 10, and may cover the gate GT. The second insulating layer 20 may commonly overlap the pixels. The second insulating layer 20 may be an inorganic layer and/or an organic layer, and may have a single-layered or multi-layered structure. The second insulating layer 20 may include at least one of silicon oxide, silicon nitride, or silicon oxynitride. The second insulating layer 20 may have a multi-layered structure including a silicon oxide layer and a silicon nitride layer.

A third insulating layer 30 may be located on the second insulating layer 20. The third insulating layer 30 may have a single-layered or multi-layered structure. For example, the third insulating layer 30 may have a multi-layered structure including a silicon oxide layer and a silicon nitride layer.

A first connection electrode CNE1 may be located on the third insulating layer 30. The first connection electrode CNE1 may be connected to the connection signal line SCL through a contact hole CNT-1 passing through the first, second, and third insulating layers 10, 20, and 30.

A fourth insulating layer 40 may be located on the third insulating layer 30. The fourth insulating layer 40 may be a single layer of silicon oxide. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be located on the fifth insulating layer 50, and may cover the second connection electrode CNE2. The sixth insulating layer 60 may be an organic layer.

The light-emitting element layer 130 may be located on the circuit layer 120. The light-emitting element layer 130 may include a light-emitting element 100PE. For example, the light-emitting element layer 130 may include an organic light-emitting material, an inorganic light-emitting material, an organic-inorganic light-emitting material, quantum dots, quantum rods, micro LEDs, or nano LEDs. Hereinafter, the light-emitting element 100PE will be described as an organic light-emitting element, but the present disclosure is not particularly limited thereto.

The light-emitting element 100PE may include a first electrode AE, a light-emitting layer EL, and a second electrode CE. The first electrode AE may be located on the sixth insulating layer 60. The first electrode AE may be connected to the second connection electrode CNE2 through a contact hole CNT-3 passing through the sixth insulating layer 60.

A pixel-defining film 70 may be located on the sixth insulating layer 60, and may cover a portion of the first electrode AE. An opening 70-OP is defined in the pixel-defining film 70. The opening 70-OP of the pixel-defining film 70 exposes at least a portion of the first electrode AE.

The display panel DP may include a light-emitting region PXA, and a non-light-emitting region NPXA adjacent to the light-emitting region PXA. The non-light-emitting region NPXA may surround the light-emitting region PXA. The light-emitting region PXA is defined to correspond to a partial region of the first electrode AE, which is exposed by the opening 70-OP.

The light-emitting layer EL may be located on the first electrode AE. The light-emitting layer EL may be located in a region corresponding to the opening 70-OP. That is, the light-emitting layer EL may be dividedly formed, or independently formed, in each of the pixels. If the light-emitting layer EL is dividedly formed in each of the pixels, each of the light-emitting layers EL may emit light of at least one of blue, red, or green. Without being limited thereto, however, the light-emitting layer EL may be connected to the pixels so as to be included in common therein. In this case, the light-emitting layer EL may provide blue light or white light.

The second electrode CE may be located on the light-emitting layer EL. The second electrode CE may have an integral shape, and may be commonly included in a plurality of pixels.

In one or more embodiments of the present disclosure, a hole control layer may be located between the first electrode AE and the light-emitting layer EL. The hole control layer may be located in common in the light-emitting region PXA and the non-light-emitting region NPXA. The hole control layer may include a hole transport layer, and may further include a hole injection layer. An electron control layer may be located between the light-emitting layer EL and the second electrode CE. The electron control layer may include an electron transport layer, and may further include an electron injection layer. The hole control layer and the electron control layer may be commonly formed in a plurality of pixels by using an open mask or an inkjet process.

The encapsulation layer 140 may be located on the light-emitting element layer 130. The encapsulation layer 140 may include an inorganic layer, an organic layer, and an inorganic layer which are sequentially stacked, but layers constituting the encapsulation layer 140 are not limited thereto. The inorganic layers may protect the light-emitting element layer 130 from moisture and oxygen, and the organic layer may protect the light-emitting element layer 130 from foreign substances, such as dust particles. The inorganic layers may include a silicon nitride layer, a silicon oxynitride layer, a silicon oxide layer, a titanium oxide layer, an aluminum oxide layer, or the like. The organic layer may include an acrylic-based organic layer, but the present disclosure is not limited thereto.

The sensor layer 200 may include a base-insulating layer 201, a first conductive layer 202, a sensing-insulating layer 203, a second conductive layer 204, and a cover-insulating layer 205. The base-insulating layer 201 may be defined as a first insulating layer of the sensor layer 200, the sensing-insulating layer 203 may be defined as a second insulating layer of the sensor layer 200, and the cover-insulating layer 205 may be defined as a third insulating layer of the sensor layer 200.

The base-insulating layer 201 may be an inorganic layer including at least any one of silicon nitride, silicon oxynitride, or silicon oxide. Alternatively, the base-insulating layer 201 may be an organic layer including epoxy resin, acrylic resin, or imide-based resin. The base-insulating layer 201 may have a single-layered structure or a multi-layered structure in which layers are stacked along the third direction DR3.

Each of the first conductive layer 202 and the second conductive layer 204 may have a single-layered structure or a multi-layered structure in which layers are stacked along the third direction DR3. The second conductive layer 204 may be connected to the first conductive layer 202 through a contact hole CNT-4 passing through the sensing-insulating layer 203.

Each of the first conductive layer 202 and the second conductive layer 204 which have a single-layered structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include a conductive polymer, such as poly(3,4-ethylenedioxythiophene) (PEDOT), metal nanowire, graphene, and/or the like.

Each of the first conductive layer 202 and the second conductive layer 204 which have a multi-layered structure may include metal layers. The metal layers may have, for example, a three-layer structure of titanium/aluminum/titanium. A multi-layered conductive layer may include at least one metal layer and at least one transparent conductive layer.

At least any one of the sensing-insulating layer 203 or the cover-insulating layer 205 may include an inorganic film. The inorganic film may include at least one of aluminum oxide, titanium oxide, silicon oxide, silicon nitride, silicon oxy nitride, zirconium oxide, or hafnium oxide.

At least any one of the sensing-insulating layer 203 or the cover-insulating layer 205 may include an organic film. The organic film may include at least any one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The sensor layer 200 including three insulating layers 201, 203, and 205 and two conductive layers 202 and 204 is described as an example, but the present disclosure is not limited thereto. The sensor layer 200 may include four insulating layers and three conductive layers, or five insulating layers and four conductive layers. Some of the plurality of insulating layers and the plurality of conductive layers may be located below the base layer 110.

Figure 6:
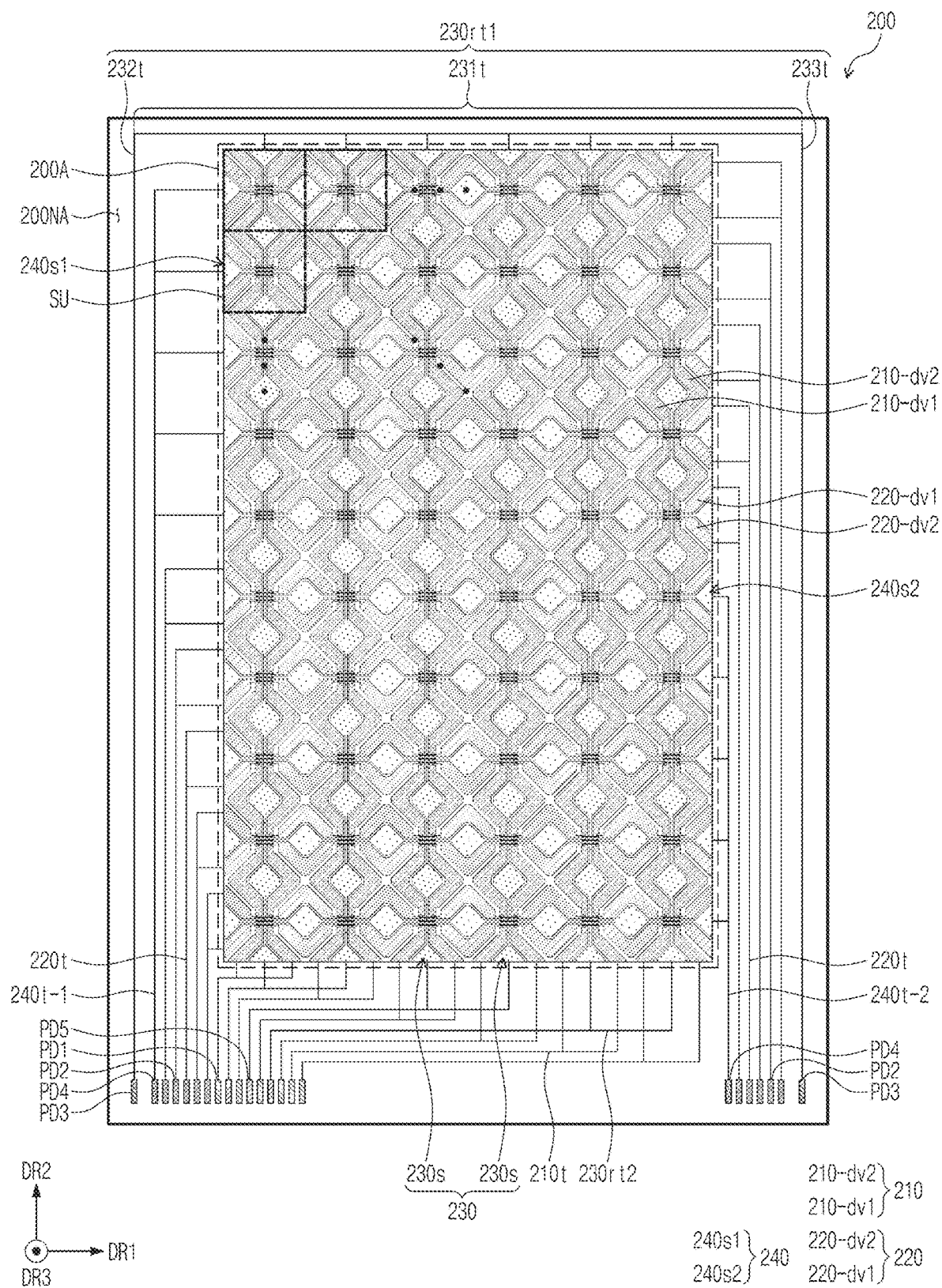
FIG. 6 is a plan view of a sensor layer according to one or more embodiments of the present disclosure.
Figure 7:
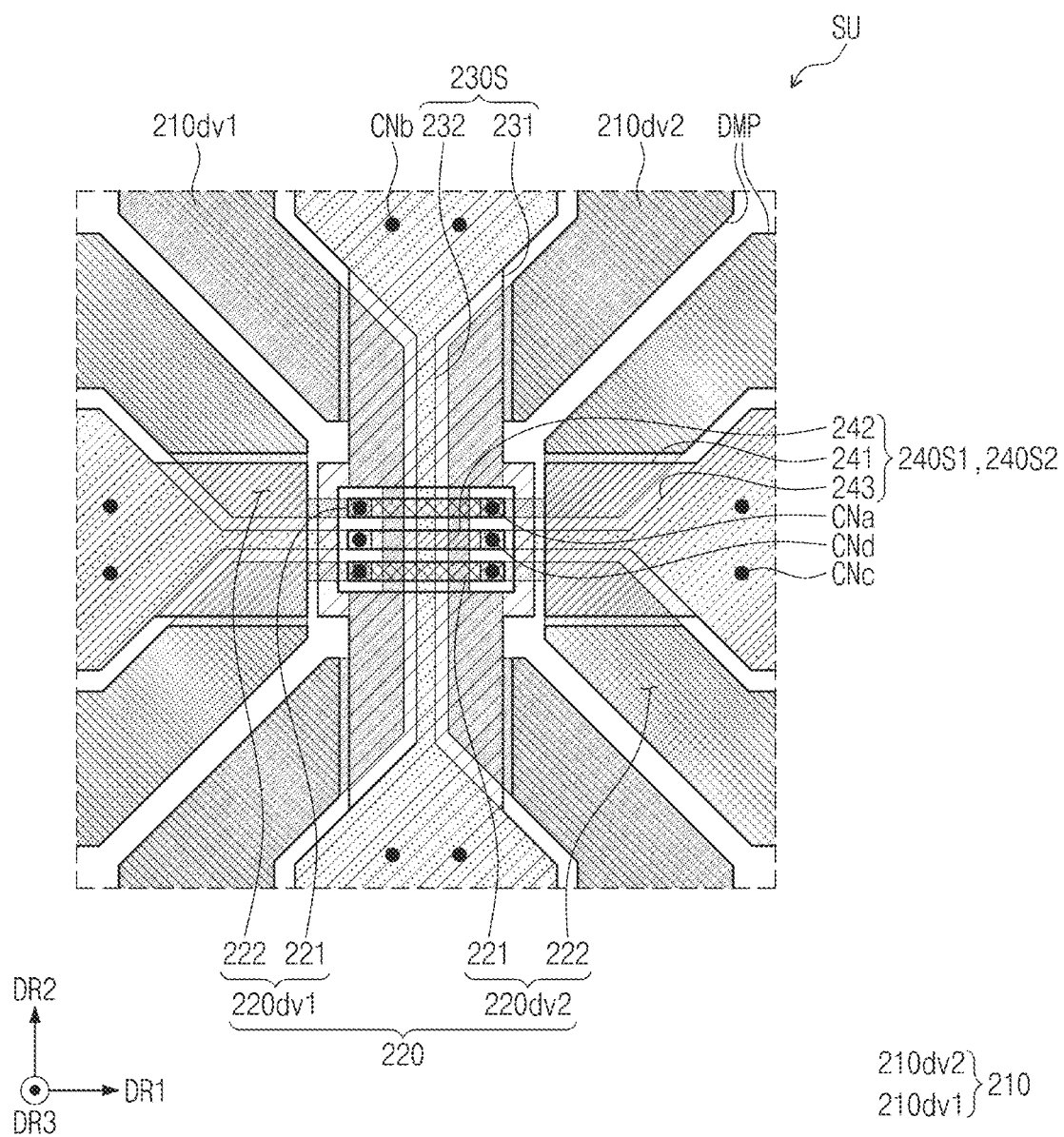
FIG. 7 is an enlarged plan view of one sensing unit according to one or more embodiments of the present disclosure.
Figure 8A:
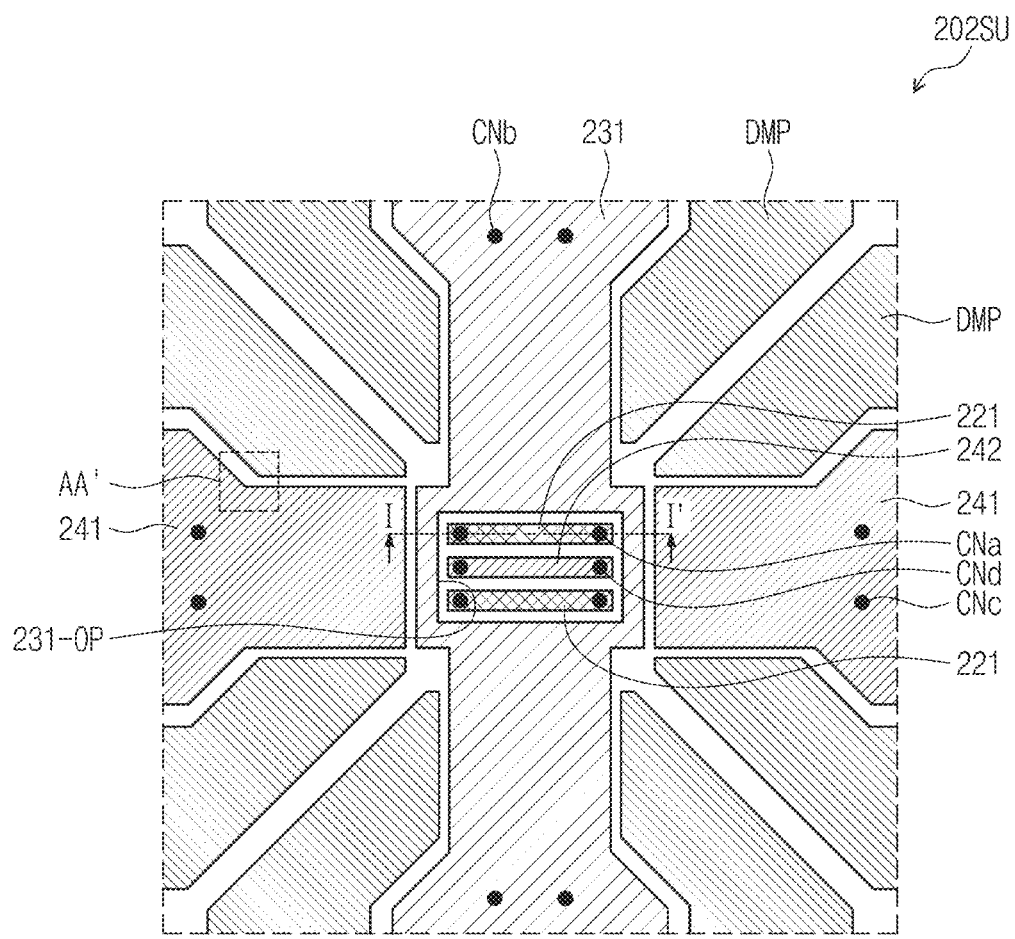
FIG. 8A is a plan view illustrating a first conductive layer of the sensing unit according to one or more embodiments of the present disclosure.
Figure 8B:
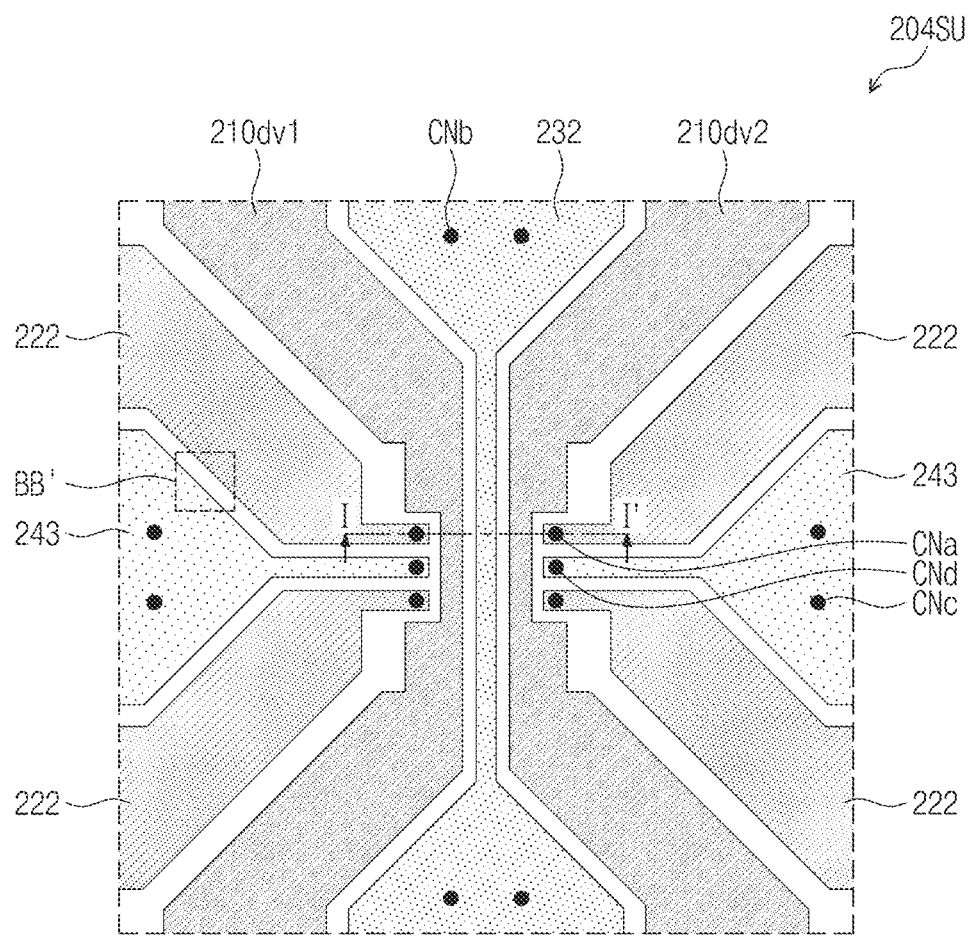
FIG. 8B is a plan view illustrating a second conductive layer of the sensing unit according to one or more embodiments of the present disclosure.

FIG. 6 is a plan view of the sensor layer 200 according to one or more embodiments of the present disclosure. FIG. 7 is an enlarged plan view of one sensing unit SU according to one or more embodiments of the present disclosure. FIG. 8A is a plan view illustrating a first conductive layer 202SU of the sensing unit SU according to one or more embodiments of the present disclosure. FIG. 8B is a plan view illustrating a second conductive layer 204SU of the sensing unit SU according to one or more embodiments of the present disclosure. FIG. 9 is a cross-sectional view of the sensor layer 200 according to one or more embodiments of the present disclosure, which is taken along the line I-I' illustrated in each of FIGS. 8A and 8B.

Referring to FIG. 6, a sensing region ("sensing region" may be referred to as "main region" in the claims) 200A and a peripheral region 200NA adjacent to the sensing region 200A may be defined in the sensor layer 200. A display region corresponding to the sensing region 200A, and a non-display region corresponding to the peripheral region 200NA, may also be defined in the display layer 100 of FIGS. 3 and 5. The light-emitting region PXA and the non-light-emitting region NPXA in FIG. 5 may correspond to the display region. The non-display region may be located outside the display region (e.g., in a plan view).

The sensor layer 200 may include a plurality of first electrodes 210, a plurality of second electrodes 220, a plurality of third electrodes 230, and a plurality of fourth electrodes 240, which are located in the sensing region 200A ("first electrodes" may be referred to as "first sensing electrodes," and "second electrodes" may be referred to as "second sensing electrodes," in the claims).

The first electrodes 210 may respectively cross the second electrodes 220. Each of the first electrodes 210 may extend along the second direction DR2, and the first electrodes 210 may be arranged to be spaced apart from each other in the first direction DR1. Each of the second electrodes 220 may extend along the first direction DR1, and the second electrodes 220 may be arranged to be spaced apart from each other in the second direction DR2. The sensing unit SU of the sensor layer 200 may be a region in which one first electrode 210 and one second electrode 220 cross each other. FIG. 6 illustrates six first electrodes 210, ten second electrodes 220, and sixty sensing units SU, but the number of the first electrodes 210 and the number of the second electrodes 220 are not limited thereto.

Referring to FIGS. 6 and 7, each of the first electrodes 210 may include first split electrodes 210-$dv$1 and 210-$dv$2. The first split electrodes 210-$dv$1 and 210-$dv$2 may extend along the second direction DR2, and may be spaced apart from each other in the first direction DR1. The first split electrodes 210-$dv$1 and 210-$dv$2 may have a that is symmetrical to a line extending in the second direction DR2 (e.g., may be symmetrical).

Each of the second electrodes 220 may include second split electrodes 220-$dv$1 and 220-$dv$2. The second electrodes 220 may extend along the first direction DR1, and may be spaced apart from each other in the second direction DR2. The second split electrodes 220-$dv$1 and 220-$dv$2 may have a linearly symmetrical shape with respect to a line extending in the first direction DR1 (e.g., may be symmetrical).

Referring to FIGS. 7, 8A, 8B, and 9, each of the second split electrodes 220-$dv$1 and 220-$dv$2 may include a bridge pattern 221 and two sensing patterns 222 located in the sensing unit SU. The bridge pattern 221 may be located on a layer that is different from that of the sensing patterns 222, and the bridge pattern 221 and the sensing patterns 222 may be electrically connected to each other through a first contact hole CNa. Contact holes described below, including the first contact hole CNa, may pass through the sensing-insulating layer 203 like the contact hole CNT-4 in FIG. 5. For example, the bridge pattern 221 may be included in the first conductive layer 202SU, and the sensing pattern 222 and the first split electrodes 210-$dv$1 and 210-$dv$2 may be included in the second conductive layer 204SU. The first conductive layer 202SU may be included in the first conductive layer 202 of FIG. 5, and the second conductive layer 204SU may be included in the second conductive layer 204 of FIG. 5. Conductive patterns and/or electrodes may be formed from the conductive layers through a photolithography process.

Referring to FIG. 6, each of the third electrodes 230 may extend along the second direction DR2, and the third electrodes 230 may be arranged to be spaced apart from each other in the first direction DR1. In one or more embodiments of the present disclosure, each of the third electrodes 230 may include a plurality of first auxiliary electrodes 230$s$ connected to each other in parallel with each other ("first auxiliary electrodes" may be referred to as "first electrodes" in the claims). The number of the first auxiliary electrodes 230$s$ included in each of the third electrodes 230 may vary. For example, as the number of the first auxiliary electrodes 230$s$ included in each of the third electrodes 230 increases, the resistance of each of the third electrodes 230 decreases, and therefore, power efficiency and sensing sensitivity may be improved. Conversely, as the number of the first auxiliary electrodes 230$s$ included in each of the third electrodes 230 decreases, a loop coil pattern formed by using the third electrodes 230 may be implemented in more diverse forms.

FIG. 6 illustrates that one third electrode 230 includes two first auxiliary electrodes 230$s$, but the present disclosure is not particularly limited thereto. In one or more embodiments of the present disclosure, each of the third electrodes 230 may include one first auxiliary electrode 230$s$. Referring to FIG. 6, the first auxiliary electrodes 230$s$ may be located in a one-to-one correspondence with the first electrodes 210. Accordingly, a portion of one first auxiliary electrode 230$s$ may be located in one sensing unit SU illustrated in FIGS. 6 and 7. In one or more embodiments of the present disclosure, one third electrode 230 may include three first auxiliary electrodes 230$s$.

Referring to FIGS. 6 to 9, a coupling capacitor may be defined between one first electrode 210 and one first auxiliary electrode 230$s$. In this case, an induced current generated during pen-sensing may be transmitted from the first auxiliary electrode 230$s$ to the first electrode 210 through the coupling capacitor. That is, the first auxiliary electrode 230$s$ may serve to supplement a signal transmitted from the first electrode 210 to the sensor driver 2000. Therefore, the greatest effect may be obtained if the phase of a signal induced in the first auxiliary electrode 230s matches the phase of a signal induced in the first electrode 210. Accordingly, the center of each of the first electrodes 210 in the first direction DR1, and the center of each of the first auxiliary electrodes 230s in the first direction DR1, may overlap each other (e.g., in a plan view).

In one or more embodiments of the present disclosure, because one third electrode 230 includes two first auxiliary electrodes 230s, one third electrode 230 may correspond to (or overlap) two first electrodes 210. Accordingly, the number of the third electrodes 230 included in the sensor layer 200 may be less than the number of first electrodes 210. For example, the number of the first electrodes 210 may be equal to a value obtained by multiplying the number of the third electrodes 230 included in the sensor layer 200 by the number of the first auxiliary electrodes 230s included in each of the third electrodes 230. In FIG. 6, the number of the first electrodes 210 may be 6, the number of the third electrodes 230 may be 3, and the number of the first auxiliary electrodes 230s included in each of the third electrodes 230 may be 2.

The fourth electrodes 240 may be arranged along the second direction DR2, and the fourth electrodes 240 may extend along the first direction DR1. In one or more embodiments of the present disclosure, the fourth electrodes 240 may be divided into two groups. The fourth electrodes 240 belonging to a same group may be connected to a same trace line (or a same connection line). The fourth electrodes 240 divided into two groups may be referred to as second auxiliary electrodes 240s1 or 240s2 ("second auxiliary electrodes" may be referred to as "second electrodes" in the claims). The second auxiliary electrodes 240s1 and 240s2 may be referred to as (2-1)-th auxiliary electrodes 240s1 and (2-2)-th auxiliary electrodes 240s2. The (2-1)-th auxiliary electrodes 240s1 and the (2-2)-th auxiliary electrodes 240s2 are connected to different respective trace lines 240t-1 and 240t-2. The (2-1)-th auxiliary electrodes 240s1 are connected to a same trace line 240t-1, and the (2-2)-th auxiliary electrodes 240s2 are connected to a same trace line 240t-2.

In one or more embodiments of the present disclosure, the fourth electrodes 240 may be divided into two or more groups. If the fourth electrodes 240 are connected to different trace lines, the fourth electrodes 240 may be divided into different groups. The fourth electrodes 240 divided into different groups may receive a synchronized signal, or a same signal, through different fourth trace lines. In one or more embodiments of the present disclosure, the fourth electrodes 240 may be one group. The fourth electrodes 240 may be connected to one fourth trace line.

In one or more embodiments of the present disclosure, the fourth electrodes 240 may be divided into three groups. Two of the three groups may be located on the left side of the sensing region 200A, and one group thereof may be located on the right side of the sensing region 200A.

In one or more embodiments of the present disclosure, the fourth electrodes 240 may be divided into four groups. Two of the four groups may be located on the left side of the sensing region 200A, and two groups may be located on the right side of the sensing region 200A. In the second direction DR2, the two groups located on the left side may be located further away from, or closer to, second pads PD2 or third pads PD3 than the two groups located on the right side. In the second direction DR2, the two groups located on the left side and the two groups located on the right side may be in a zigzag shape from the second pads PD2 or the third pads PD3.

The routing directions of the (2-1)-th auxiliary electrodes 240s1 and the (2-2)-th auxiliary electrodes 240s2 may be different from each other. In this specification, the expression that the routing directions are different from each other means that connection positions between electrodes and trace lines are different from each other. For example, a first connection position of the fourth trace line 240t-1 electrically connected to the (2-1)-th auxiliary electrodes 240s1, and a second connection position of the fourth trace line 240t-2 electrically connected to the (2-2)-th auxiliary electrodes 240s2, may be different from each other. The first connection position may be at the left end of the (2-1)-th auxiliary electrodes 240s1, and the second connection position may be at the right end of the (2-2)-th auxiliary electrodes 240s2.

FIG. 6 illustrates that five (2-1)-th auxiliary electrodes 240s1 are electrically connected to each other, and that five (2-2)-th auxiliary electrodes 240s2 are electrically connected to each other. In one or more embodiments of the present disclosure, the number of the (2-1)-th auxiliary electrodes 240s1 and the number of the (2-2)-th auxiliary electrodes 240s2 may be different from each other.

In one or more embodiments of the present disclosure, as the number of the (2-1)-th auxiliary electrodes 240s1 increases and the number of the (2-2)-th auxiliary electrodes 240s2 increases, an effect may occur in which the area of an electrode that is electrically defined as one (e.g., a single, continuous electrode) increases. In addition, the resistance of an electrode electrically defined as one may be lowered, thereby improving the sensing sensitivity to the second input 3000 (see FIG. 4).

Referring to FIGS. 6 to 9, a coupling capacitor may be defined between one second electrode 220 and one second auxiliary electrode 240s1 or 240s2. In this case, an induced current generated during pen-sensing may be transferred from the second auxiliary electrode 240s1 or 240s2 to the second electrode 220 through the coupling capacitor. That is, the second auxiliary electrode 240s1 or 240s2 may serve to supplement a signal transmitted from the second electrode 220 to the sensor driver 2000. Therefore, the greatest effect may be obtained if the phase of a signal induced in the second auxiliary electrode 240s1 or 240s2 matches the phase of a signal induced in the second electrode 220. Accordingly, the center of each of the second electrodes 220 in the second direction DR2, and the center of each of the second auxiliary electrodes 240s1 or 240s2 in the second direction DR2, may overlap each other (e.g., in a plan view).

Referring to FIGS. 7, 8A, and 8B, each of the first auxiliary electrodes 230s may include a (3-1)-th pattern 231 and a (3-2)-th pattern 232. Meanwhile, the terms "(3-1)-th pattern 231" and "(3-2)-th pattern 232" are only used for the purpose of distinguishing them from other patterns. If the (3-1)-th pattern 231 is defined as a first pattern, the (3-2)-th pattern 232 may be defined as a second pattern.

The (3-1)-th pattern 231 and the (3-2)-th pattern 232 may be located on different respective layers, and may be electrically connected to each other through a second contact hole CNb. The (3-1)-th pattern 231 may be included in the first conductive layer 202SU, and the (3-2)-th pattern 232 may be included in the second conductive layer 204SU.

In one or more embodiments of the present disclosure, any one of the (3-1)-th pattern 231 or the (3-2)-th pattern 232 may be omitted. In one or more embodiments of the present disclosure, although the (3-1)-th pattern 231 and the (3-2)-th pattern 232 are located, they might not be electrically connected to each other. In this case, one of the (3-1)-th pattern 231 and the (3-2)-th pattern 232 may correspond to the first auxiliary electrodes 230s, and the other thereof may correspond to a dummy electrode (or floating electrode).

In one or more embodiments of the present disclosure, a portion of the (3-1)-th pattern 231 may overlap a portion of each of the first split electrodes 210-dv1 and 210-dv2. Accordingly, a coupling capacitance may be provided (or formed) between the first electrode 210 and the third electrode 230. An opening 231-OP may be defined in the (3-1)-th pattern 231. The bridge pattern 221 described above and a (4-2)-th pattern 242, which will be described later, may be located in the opening 231-OP.

Referring to FIGS. 7, 8A, and 8B, each of the second auxiliary electrodes 240s1 and 240s2 may include two (4-1)-th patterns 241, a (4-2)-th pattern 242, and two (4-3)-th patterns 243, which are located in the sensing unit SU. Meanwhile, the terms "(4-1)-th pattern 241, (4-2)-th pattern 242, and (4-3)-th pattern 243" are only used for the purpose of distinguishing them from other patterns. If the (4-1)-th pattern 241 is defined as a first pattern, the (4-2)-th pattern 242 may be defined as a second pattern, and the (4-3)-th pattern 243 may be defined as a third pattern.

The (4-1)-th pattern 241 and the (4-2)-th pattern 242 may be located on a same layer, and the (4-3)-th pattern 243 may be located on a layer that is different from the (4-1)-th pattern 241 and the (4-2)-th pattern 242. The (4-1)-th pattern 241 and the (4-3)-th pattern 243 may be electrically connected to each other through a third contact hole CNc. The (4-2)-th pattern 242 and the (4-3)-th pattern 243 may be electrically connected to each other through a fourth contact hole CNd. The (4-1)-th pattern 241 and the (4-2)-th pattern 242 may be included in the first conductive layer 202SU, and the (4-3)-th pattern 243 may be included in the second conductive layer 204SU.

Referring to FIGS. 7, 8A, and 8B, a portion of the (4-1)-th pattern 241 may overlap the sensing pattern 222 of each of the second split electrodes 220-dv1 and 220-dv2. Accordingly, a coupling capacitor may be defined (or provided, formed) between the second electrode 220 and the fourth electrode 240.

In one or more embodiments of the present disclosure, the first conductive layer 202SU may further include dummy patterns DMP. Each of the dummy patterns DMP may be electrically floated or electrically grounded. Some of the dummy patterns DMP may overlap the first split electrodes 210-dv1 and 210-dv2, and others thereof may overlap the sensing patterns 222. In one or more embodiments of the present disclosure, the dummy patterns DMP may be omitted. In one or more embodiments of the present disclosure, the dummy patterns DMP may be electrically connected to overlapping electrodes among the first split electrodes 210-dv1 and 210-dv2 so that sensing sensitivity may be further improved.

Referring to FIG. 6, the sensor layer 200 may further include a plurality of first trace lines 210t located in the peripheral region 200NA, and a plurality of first pads PD1 respectively connected to the first trace lines 210t in a one-to-one correspondence, and may also include a plurality of second trace lines 220t, and a plurality of second pads PD2 respectively connected to the second trace lines 220t in a one-to-one correspondence. Trace lines described below, including the first trace lines 210t and the second trace lines 220t, may also be defined as connection lines or lines in the claims.

The first trace lines 210t may be electrically connected to the first electrodes 210 in a one-to-one correspondence. Two first split electrodes 210-dv1 and 210-dv2 included in one first electrode 210 may be connected to one of the first trace lines 210t. Each of the first trace lines 210t may include a plurality of branches for being connected to two first split electrodes 210-dv1 and 210-dv2. In one or more embodiments of the present disclosure, the two first split electrodes 210-dv1 and 210-dv2 may be connected to each other in the sensing region 200A.

The second trace lines 220t may be electrically connected to the second electrodes 220 in a one-to-one correspondence. Two second split electrodes 220-dv1 and 220-dv2 included in one second electrode 220 may be connected to one of the second trace lines 220t. Each of the second trace lines 220t may include a plurality of branches for being connected to the two second split electrodes 220-dv1 and 220-dv2. In one or more embodiments of the present disclosure, the two second split electrodes 220-dv1 and 220-dv2 may be connected to each other in the sensing region 200A.

Referring to FIG. 6, the sensor layer 200 may further include a third trace line (e.g., a peripheral trace line, or simply a trace line or a connection line, in the claims) 230rt1, two third pads PD3 connected to respective ends of the third trace line 230rt1, two fourth trace lines 240t-1 and 240t-2, two fourth pads PD4 respectively connected to the fourth trace lines 240t-1 and 240t-2, fifth trace lines 230rt2, and fifth pads PD5 respectively connected to the fifth trace lines 230rt2 in a one-to-one correspondence, which are located in the peripheral region 200NA. In one or more embodiments, the fifth pads PD5 may be located more closely to one of the third pads PD3 (e.g., the third pad PD3 on the left) than the other one of the third pads PD3 (e.g., the third pad PD3 on the right).

The third trace line 230rt1 may be electrically connected to all of the third electrodes 230. The third trace line 230rt1 may include a first line portion 231t extending along the first direction DR1 and electrically connected to one ends of the third electrodes 230, a second line portion 232t extending along the second direction DR2 from a first end of the first line portion 231t, and a third line portion 233t extending along the second direction DR2 from a second end of the first line portion 231t. One end of the second line portion 232t is connected to the third pad PD3 (e.g., one of the third pads PD3), and one end of the third line portion 233t is connected to the third pad PD3 (e.g., another one of the third pads PD3).

The fifth trace lines 230rt2 may be connected to the third electrodes 230 in a one-to-one correspondence. That is, the number of the fifth trace lines 230rt2 may correspond to the number of the third electrodes 230. FIG. 6 illustrates three fifth trace lines 230rt2 as an example.

The fourth trace lines 240t-1 and 240t-2 may be spaced apart from each other with the sensing region 200A interposed therebetween. One end of each of the (2-1)-th auxiliary electrodes 240s1 may be connected to one fourth trace line 240t-1. One end of each of the (2-2)-th auxiliary electrodes 240s2 may be connected to the other fourth trace line 240t-2.

The sensor layer 200 formed from the first conductive layer 202 and the second conductive layer 204 of FIG. 5 is described in detail with reference to FIGS. 6 to 9, but the present disclosure is not limited thereto.

In one or more embodiments of the present disclosure, among the plurality of first electrodes 210, the plurality of second electrodes 220, the plurality of third electrodes 230, and the plurality of fourth electrodes 240 described above, one or more electrodes may be located below the base layer 110 of the display layer 100 illustrated in FIG. 5. A signal line connected to an electrode located at a lower side may also be located below the base layer 110 of the display layer 100. In one or more embodiments of the present disclosure, the plurality of first electrodes 210, the plurality of second electrodes 220, the plurality of third electrodes 230, and the plurality of fourth electrodes 240 may be formed from four conductive layers located on different respective layers. For example, the plurality of first electrodes 210 may be formed from a first conductive layer located on the base-insulating layer 201 of the sensor layer 200, the plurality of second electrodes 220 may be formed from a second conductive layer located on the first conductive layer, the plurality of third electrodes 230 may be formed from a third conductive layer located on the second conductive layer, and the plurality of fourth electrodes 240 may be formed from a fourth conductive layer located on the third conductive layer.

Figure 10A:
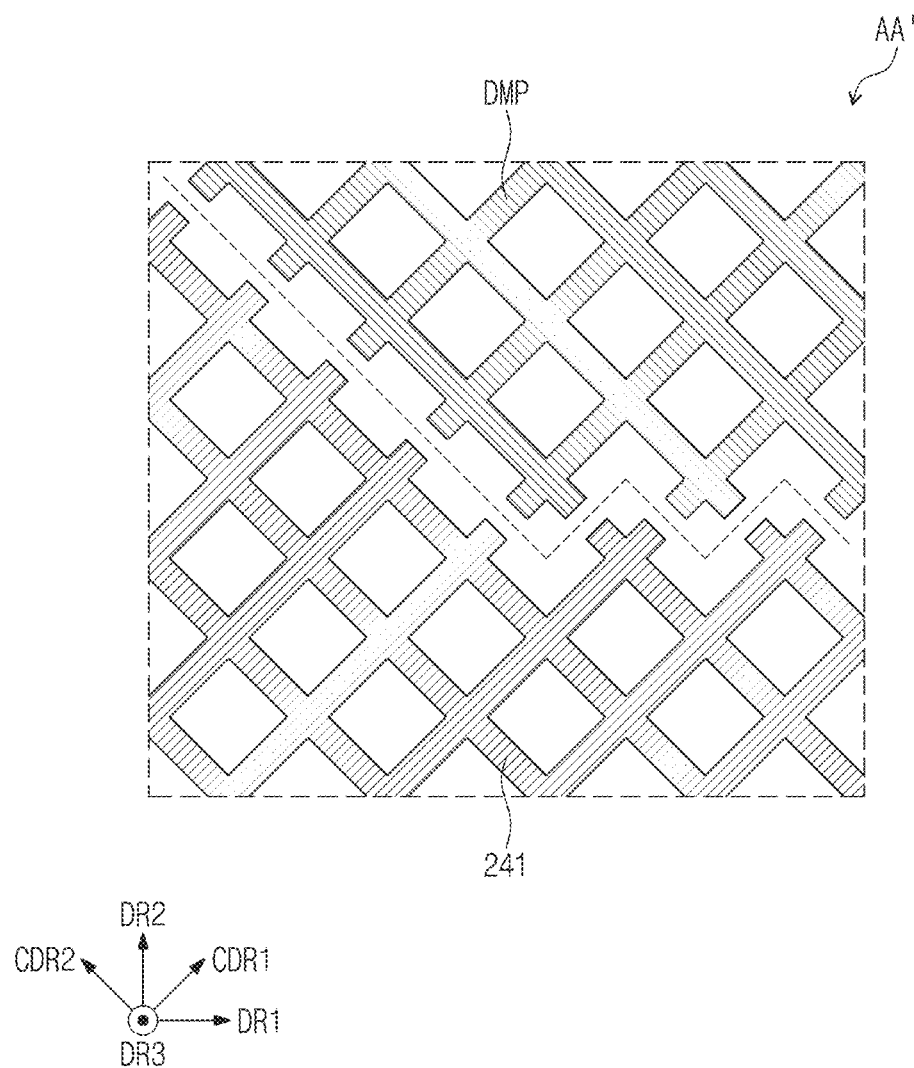
FIG. 10A is an enlarged plan view of a region AA' illustrated in FIG. 8A.
Figure 10B:
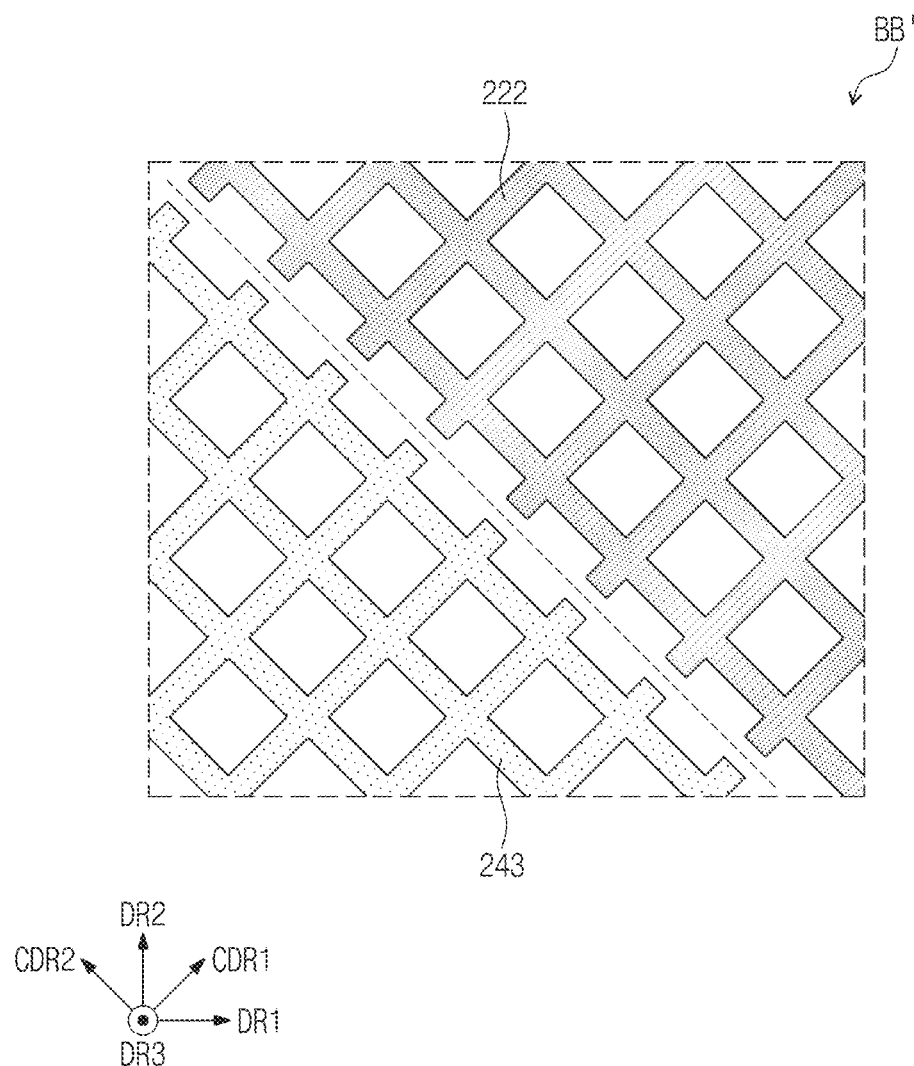
FIG. 10B is an enlarged plan view of a region BB' illustrated in FIG. 8B.

FIG. 10A is an enlarged plan view of a region AA' illustrated in FIG. 8A. FIG. 10B is an enlarged plan view of a region BB' illustrated in FIG. 8B.

Referring to FIGS. 8A, 8B, 10A, and 10B, each of the first electrodes 210, the second electrodes 220, the third electrodes 230, the fourth electrodes 240, and the dummy patterns DMP may have a mesh structure. Each of the mesh structures may include a plurality of mesh lines. Each of the plurality of mesh lines may have a straight line shape extending in a corresponding direction (e.g., predetermined direction), and may be connected to each other. Openings at which a mesh structure is not located may be defined (provided or formed) in each of the first electrodes 210, the second electrodes 220, the third electrodes 230, the fourth electrodes 240, and the dummy patterns DMP.

FIGS. 10A and 10B illustrate that the mesh structure includes mesh lines extending along a first crossing direction CDR1 that crosses the first direction DR1 and the second direction DR2, and mesh lines extending along a second crossing direction CDR2 that crosses the first crossing direction CDR1. However, the extension directions of the mesh lines constituting the mesh structure are not particularly limited to the illustrations of FIGS. 10A and 10B. For example, the mesh structure may include only mesh lines extending in the first direction DR1 and the second direction DR2, or may also include mesh lines extending in the first direction DR1, the second direction DR2, the first crossing direction CDR1, and the second crossing direction CDR2. That is, the mesh structure may be changed in various forms.

Figure 11:
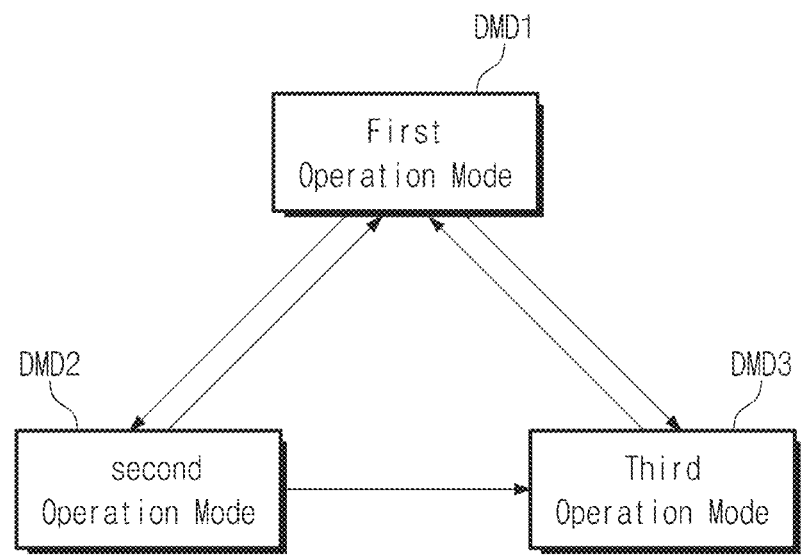
FIG. 11 shows an operation of a sensor driver according to one or more embodiments of the present disclosure.

FIG. 11 shows an operation of the sensor driver 2000 (see FIG. 4) according to one or more embodiments of the present disclosure.

Referring to FIGS. 4 and 11, the sensor driver 2000 may be configured to be selectively driven in any one of a first operation mode DMD1, a second operation mode DMD2, or a third operation mode DMD3.

The first operation mode DMD1 may be referred to as a touch-standby-and-pen-standby mode, the second operation mode DMD2 may be referred to as a touch-activation-and-pen-standby mode, and the third operation mode DMD3 may be referred to as a pen-activation mode. The first operation mode DMD1 may be a mode that waits for the first input 2000 and the second input 3000. Here, a standby mode means "detecting the occurrence of the first input 2000 or the second input 3000." The second operation mode DMD2 may be a mode that senses the information of the first input 2000, and that waits for the second input 3000 after the occurrence of the first input 2000 is sensed. "Sensing the information of the first input 2000" means "calculating the coordinate information of the first input 2000." Unlike the second operation mode DMD2, the third operation mode DMD3 may be a mode that senses the information of the second input 3000.

In one or more embodiments of the present disclosure, the sensor driver 2000 may first operate in the first operation mode DMD1. If the occurrence of the first input 2000 is sensed in the first operation mode DMD1, the sensor driver 2000 may be switched (or changed) to the second operation mode DMD2. Alternatively, if the occurrence of the second input 3000 is sensed in the first operation mode DMD1, the sensor driver 2000 may be switched (or changed) to the third operation mode DMD3.

In one or more embodiments of the present disclosure, if the occurrence of the second input 3000 is sensed in the second operation mode DMD2, the sensor driver 2000 may be switched to the third operation mode DMD3. If the first input 2000 is released (or if the occurrence of the first input 2000 is no longer sensed) in the second operation mode DMD2, the sensor driver 2000 may be switched to the first operation mode DMD1. If the second input 3000 is released (or the occurrence of the second input 3000 is no longer sensed) in the third operation mode DMD3, the sensor driver 2000 may be switched to the first operation mode DMD1.

Figure 12:
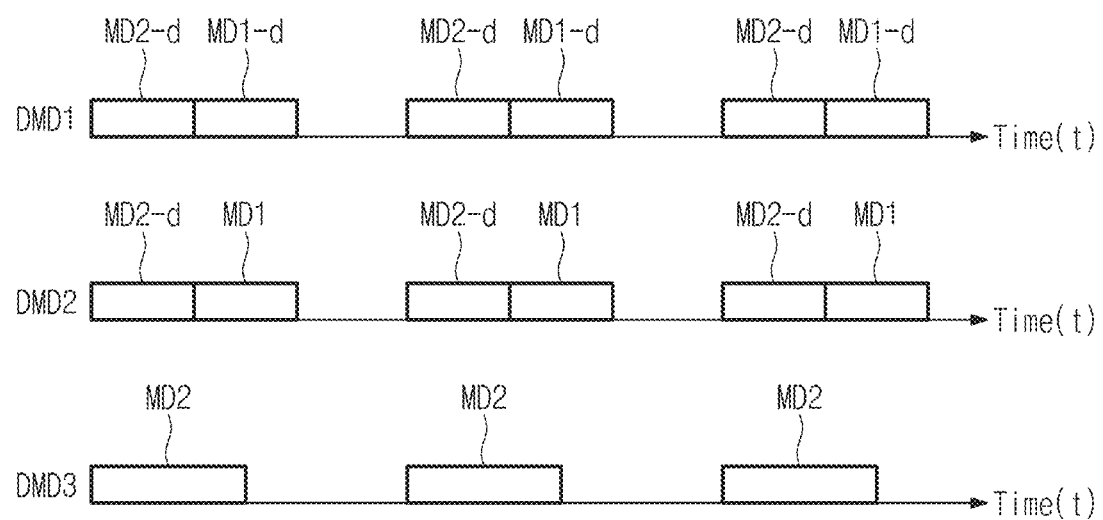
FIG. 12 shows an operation of the sensor driver according to one or more embodiments of the present disclosure.

FIG. 12 shows an operation of the sensor driver 2000 (see FIG. 4) according to one or more embodiments of the present disclosure.

Referring to FIGS. 4, 11, and 12, operations in the first to third operation modes DMD1, DMD2, and DMD3 are illustrated in order of time t.

In the first operation mode DMD1, the sensor driver 2000 may be repeatedly driven in a second mode MD2-d and in a first mode MD1-d. During the second mode MD2-d, the sensor layer 200 may be scan-driven to detect the occurrence of the second input 3000 (see FIG. 4). During the first mode MD1-d, the sensor layer 200 may be scan-driven to detect the occurrence of the first input 2000 (see FIG. 4). FIG. 12 illustrates that the sensor driver 2000 operates in the first mode MD1-d continuously after the second mode MD2-d, but the order is not limited thereto.

In the second operation mode DMD2, the sensor driver 2000 may be repeatedly driven in the second mode MD2-d and a first mode MD1. During the second mode MD2-d, the sensor layer 200 may be scan-driven to detect the occurrence of the second input 3000. During the first mode MD1, the sensor layer 200 may be scan-driven to detect the information of the first input 2000.

In the third operation mode DMD3, the sensor driver 2000 may be driven in a second mode MD2. During the second mode MD2, the sensor layer 200 may be scan-driven to detect the information of the second input 3000. In the third operation mode DMD3, the sensor driver 2000 might not operate in the first mode MD1-d or MD1 until the second input 3000 is released (or the occurrence of the second input 3000 is no longer sensed).

Referring also to FIG. 6, in the first mode MD1-d and the first mode MD1, both the third electrodes 230 and the fourth electrodes 240 may be grounded. Accordingly, touch noise may be reduced or may be prevented from entering through the third electrodes 230 and the fourth electrodes 240.

In the second mode MD2-d and the second mode MD2, first ends of each of the third electrodes 230 and the fourth electrodes 240 may be floated. In addition, in the second mode MD2-d and the second mode MD2, the other ends of each of the third electrodes 230 and the fourth electrodes 240 may be grounded or floated. Therefore, compensation of a sensing signal may be improved or maximized by coupling the first electrodes 210 and the third electrodes 230, and by coupling the second electrodes 220 and the fourth electrodes 240.

Figure 13A:
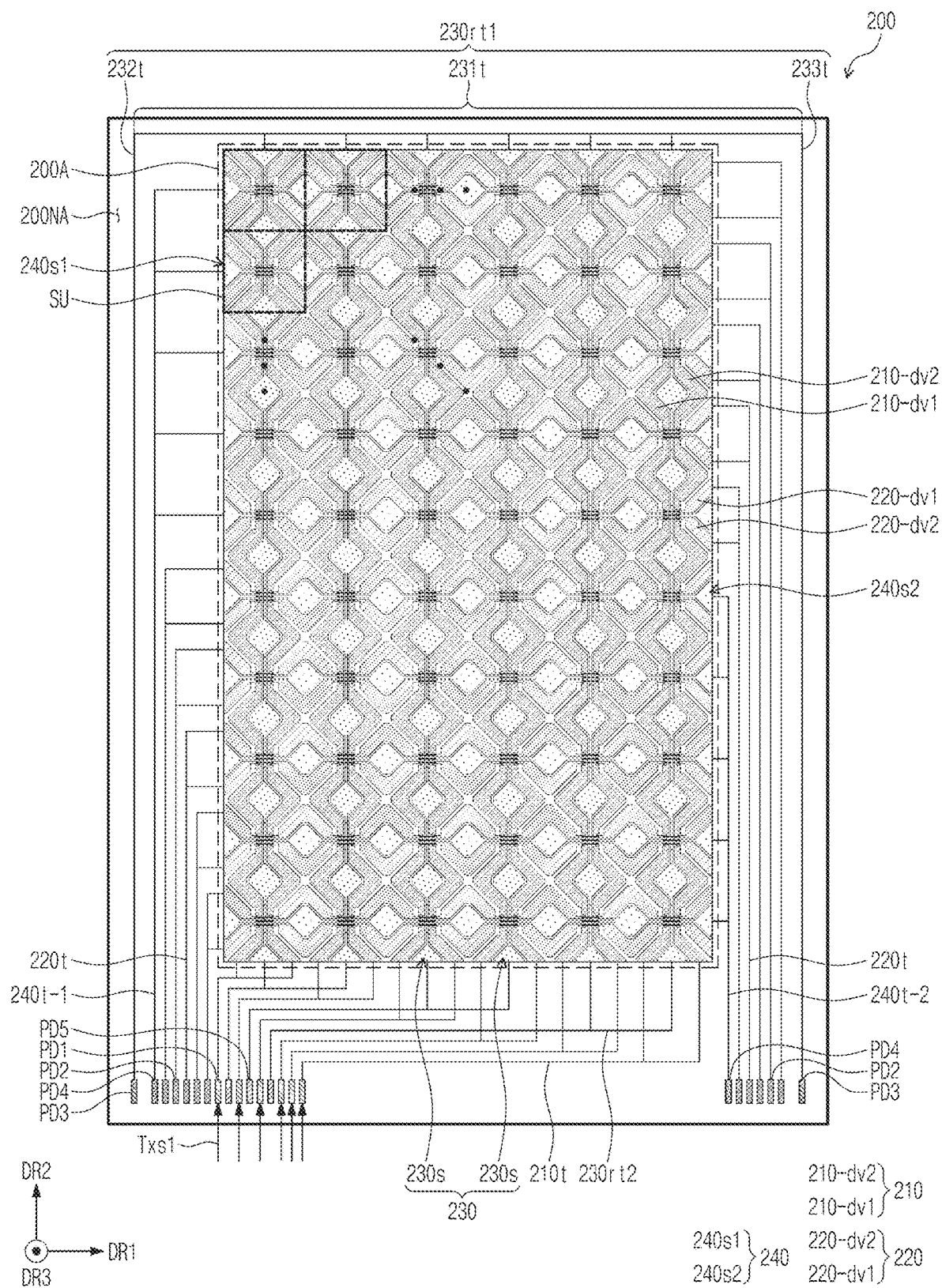
FIG. 13A describes a first mode according to one or more embodiments of the present disclosure.
Figure 13B:
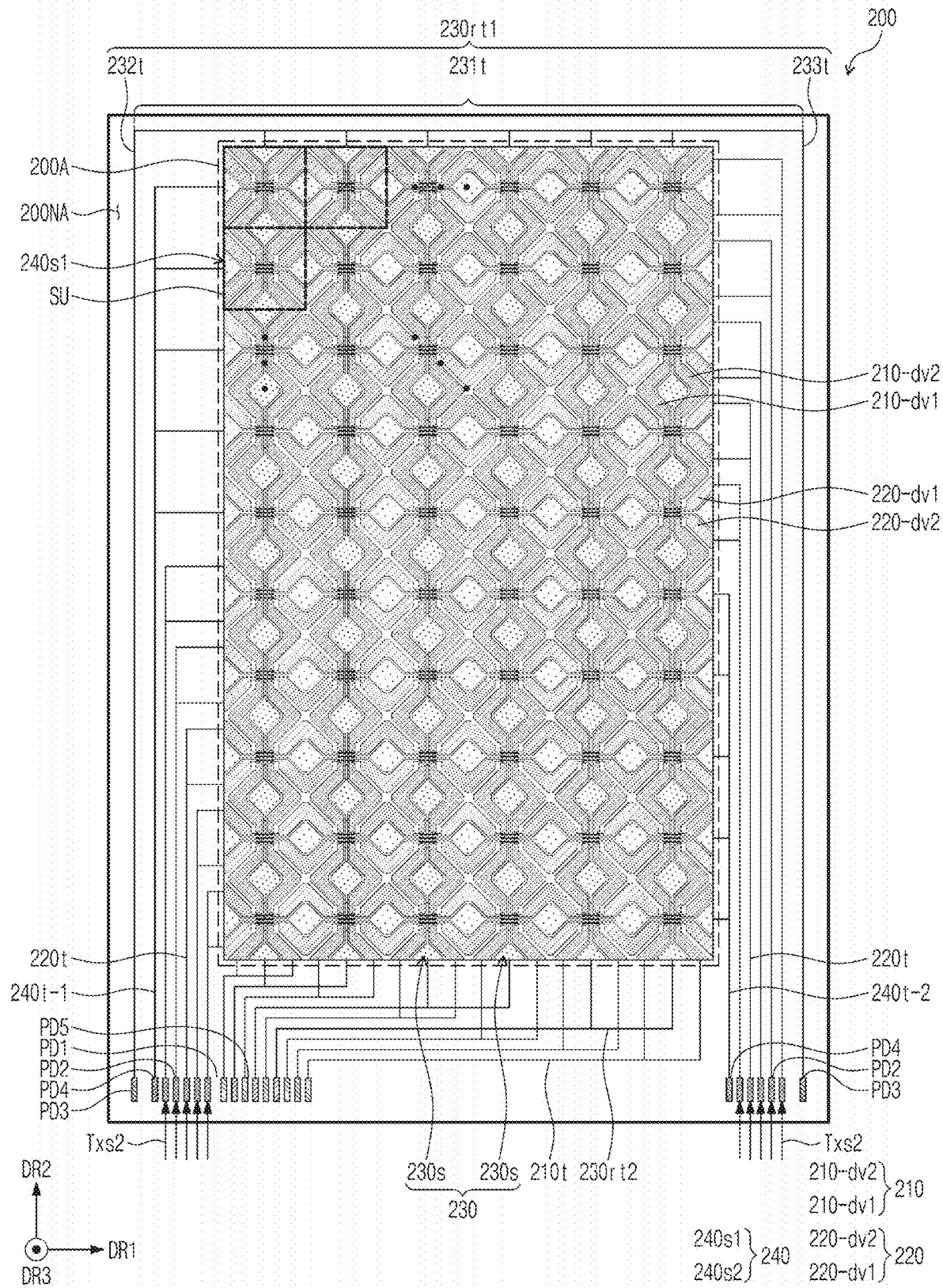
FIG. 13B describes a first mode according to one or more embodiments of the present disclosure.

FIG. 13A describes a first mode according to one or more embodiments of the present disclosure. FIG. 13B describes a first mode according to one or more embodiments of the present disclosure.

Referring to FIGS. 12, 13A, and 13B, the first mode MD1-d and the first mode MD1 may include a self-capacitance detection mode. The self-capacitance detection mode may include a first sub-section and a second sub-section. FIG. 13A describes an operation in the first sub-section, and FIG. 13B describes an operation in the second sub-section.

The sensor driver 2000 outputs driving signals Txs1 and Txs2 to the first electrodes 210 and the second electrodes 220 in the self-capacitance detection mode, and reads a changed signal after a time (e.g., predetermined time). The sensor driver 2000 may calculate an input coordinate by sensing a change in capacitance of each of the first electrodes 210 and the second electrodes 220. Referring to FIG. 13A, in the first sub-section, the sensor driver 2000 may output a driving signal Txs1 to the first trace lines 210$t$. Referring to FIG. 13B, in the second sub-section, the sensor driver 2000 may output a driving signal Txs2 to the second trace lines 220$t$. Within the first sub-section, the sensor driver 2000 may sense a signal changed from the driving signal Txs1 through the first trace lines 210$t$. Within the second sub-section, the sensor driver 2000 may sense a signal changed from the driving signal Txs2 through the second trace lines 220$t$.

The third electrodes 230 are electrically connected to the third trace line 230$rt$1 and the fifth trace lines 230$rt$2, and the fourth electrodes 240 are electrically connected to the fourth trace lines 240$t$-1 and 240$t$-2. In the self-capacitance detection mode, both the third electrodes 230 and the fourth electrodes 240 may be grounded. Accordingly, noise might not enter through the third electrodes 230 and the fourth electrodes 240.

In one or more other embodiments of the present disclosure, a reference potential may be applied to the third electrodes 230 and the fourth electrodes 240. In one or more other embodiments of the present disclosure, a transmission signal and an in-phase signal may be applied to the third electrodes 230 and the fourth electrodes 240. In this case, noise might not enter through the third electrodes 230 and fourth electrodes 240.

Figure 14:
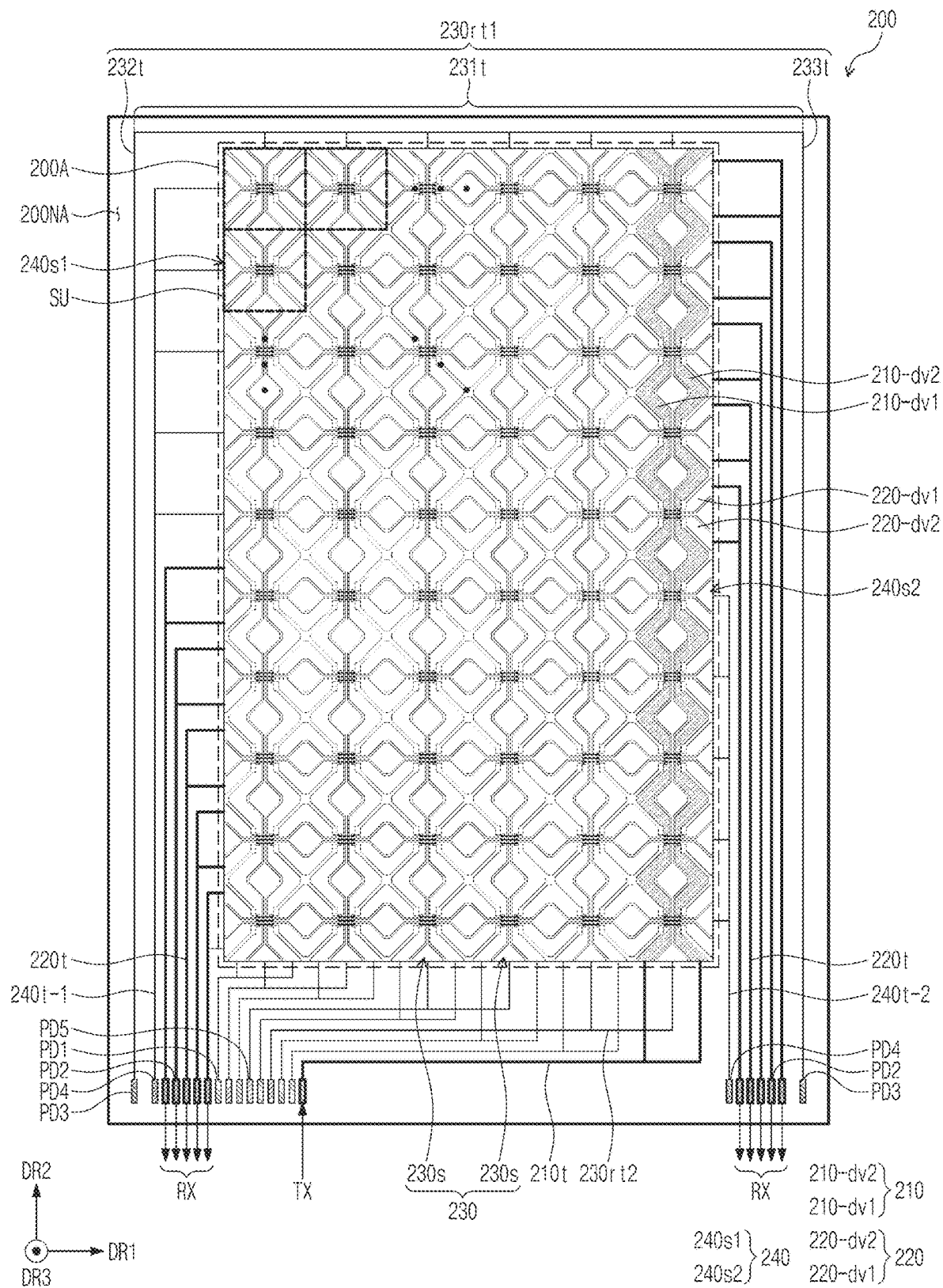
FIG. 14 describes a first mode according to one or more embodiments of the present disclosure.

FIG. 14 describes a first mode according to one or more embodiments of the present disclosure.

Referring to FIGS. 4, 12, and 14, the first mode MD1-d and the first mode MD1 may further include a mutual capacitance detection mode. FIG. 14 describes the mutual capacitance detection mode.

In the mutual capacitance detection mode, the sensor driver 2000 may sequentially provide a transmission signal TX to the first electrodes 210, and may detect the coordinate of the first input 2000 (see FIG. 4) by using a reception signal RX detected through the second electrodes 220. For example, the sensor driver 2000 may be configured to calculate an input coordinate by sensing a change in mutual capacitance between the first electrodes 210 and the second electrodes 220. In one or more embodiments of the present disclosure, the transmission signal TX may be sequentially provided to the second electrodes 220, and the coordinate of the first input 2000 (see FIG. 4) may be detected by using the reception signal RX detected through the first electrodes 210. The above-described conflicting driving methods may be alternately executed.

FIG. 14 illustrates that the transmission signal TX is provided to one first electrode 210, and that the reception signal RX is output from the second electrodes 220. To express a signal clearly, only one first electrode 210, to which the transmission signal TX is provided, is indicated by hatching/shading in FIG. 14. The sensor driver 2000 may detect the input coordinate of the first input 2000 by sensing a change in capacitance between the first electrode 210 and each of the second electrodes 220.

In the mutual capacitance detection mode, both the third electrodes 230 and the fourth electrodes 240 may be grounded. Accordingly, noise might not enter through the third electrodes 230 and fourth electrodes 240. In one or more other embodiments of the present disclosure, a reference potential may be applied to the third electrodes 230 and the fourth electrodes 240. In one or more other embodiments of the present disclosure, a transmission signal and an in-phase signal may be applied to the third electrodes 230 and the fourth electrodes 240. In this case, noise might not enter through the third electrodes 230 and fourth electrodes 240.

In each of the first mode MD1-d and the first mode MD1, the sensor layer 200 may alternately repeat the operations described in FIGS. 13A, 13B, and 14. However, this is only an example, and the present disclosure is not particularly limited thereto. For example, in each of the first mode MD1-d and the first mode MD1, the sensor layer 200 may repeatedly perform only the operation described in FIG. 14. Alternatively, in the first mode MD1-d, the sensor layer 200 may repeatedly perform at least one of the operations described in FIG. 13A, 13B, or 14, and in the first mode MD1, the sensor layer 200 may alternately repeat the operations described in FIGS. 13A, 13B, and 14.

Figure 15:
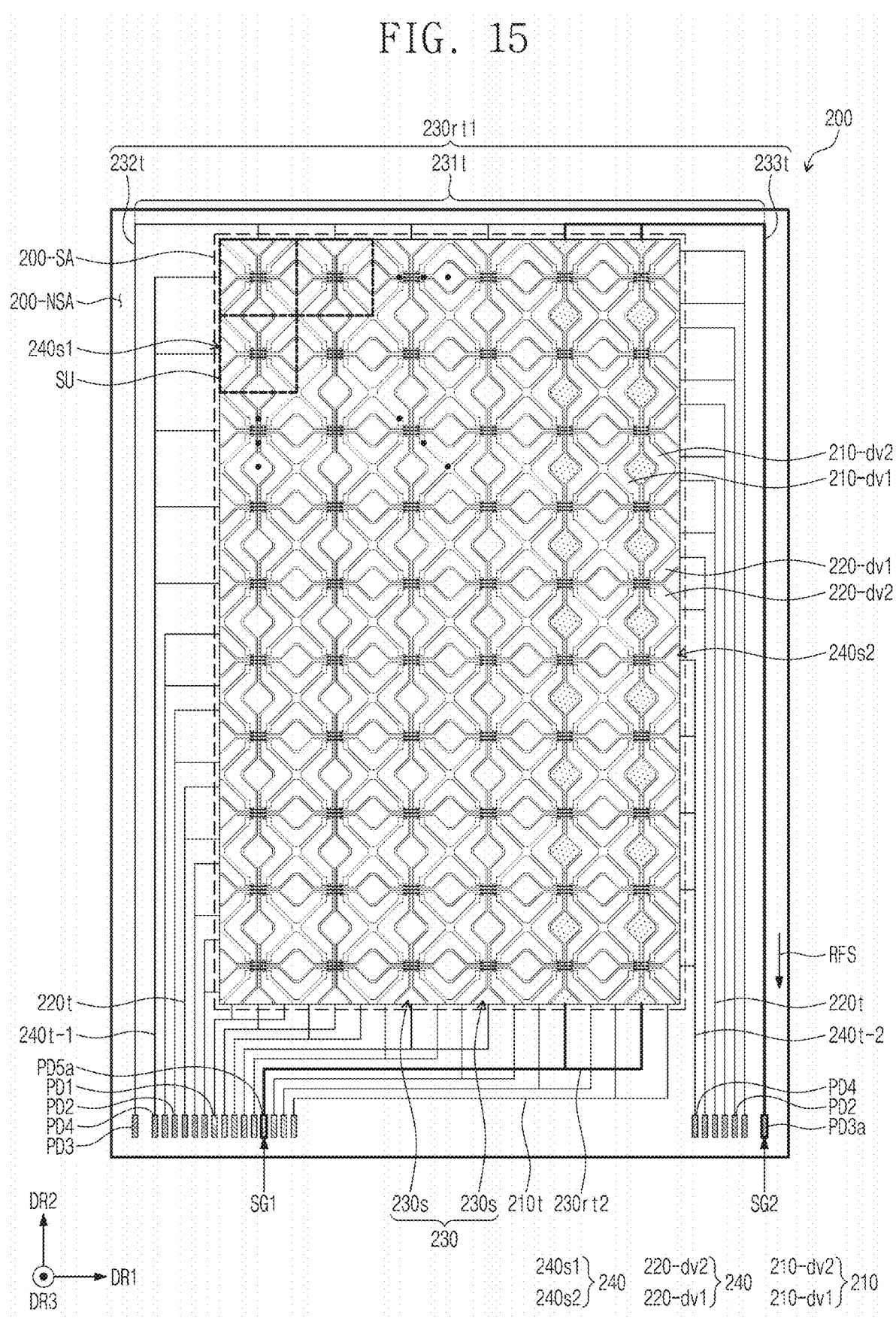
FIG. 15 describes a second mode according to one or more embodiments of the present disclosure.

FIG. 15 describes a second mode according to one or more embodiments of the present disclosure. FIG. 16 shows graphs illustrating the waveforms of a first signal and a second signal according to one or more embodiments of the present disclosure.

Referring to FIGS. 12 and 15, the second mode MD2 may include a charging-driving mode and a pen-sensing-driving mode. In addition, the charging-driving mode may include a searching-charging-driving mode and a tracking-charging-driving mode. FIG. 15 describes the searching-charging-driving mode.

Referring to FIGS. 12, 15, and 16, in the charging-driving mode, the sensor driver 2000 may apply a first signal SG1 to one of the third pads PD3 and the fifth pads PD5, and may apply a second signal SG2 to the other thereof. The second signal SG2 may be an inverse signal of the first signal SG1. For example, the first signal SG1 may be a sinusoidal signal. Each of the first signal SG1 and the second signal SG2 may be a square wave signal. The relationship between the first signal SG1 and the second signal SG2 is not limited thereto. In one or more embodiments of the present disclosure, if the first signal SG1 is a square wave signal, then the second signal SG2 may have a constant voltage (e.g., predetermined constant voltage).

Because the first signal SG1 and the second signal SG2 are applied to at least two pads, a current RFS forms a current path from one pad to the other pad. In addition, because the first signal SG1 and the second signal SG2 are sinusoidal signals having an inverse relationship with each other, the direction of the current RFS may change periodically.

Referring again to FIG. 15, FIG. 15 illustrates that the first signal SG1 is provided to one fifth pad PD5$a$ connected to the third electrode 230, and that the second signal SG2 is provided to one third pad PD3$a$ connected to the third line portion 233$t$. The current RFS may flow to the fifth pad PD5$a$, the fifth trace line 230$rt$2 connected to the fifth pad PD5*a*, the third electrode 230, a portion of the first line portion 231*t*, the third line portion 233*t* connected to the third pad PD3*a*, and the current path defined by the third pad PD3*a*. The current path may have a coil shape. Accordingly, in the charging-driving mode of the second mode, the RLC resonance circuit of the pen PN may be charged by a magnetic field induced by the current path.

According to one or more embodiments of the present disclosure, the current path of a loop coil pattern may be implemented by components included in the sensor layer 200. Accordingly, the electronic device 1000 (see FIG. 1) may charge the pen PN by using the sensor layer 200. Accordingly, because there is no need to separately add a component having a coil for charging the pen PN, the thickness and weight of the electronic device 1000 might not increase, and the flexibility of the electronic device 1000 might not be deteriorated.

In the charging-driving mode, the first electrodes 210, the second electrodes 220, and the fourth electrodes 240 may be grounded, may have a constant voltage applied, or may be electrically floated. For example, the first electrodes 210, the second electrodes 220, and the fourth electrodes 240 may be floated. In this case, the current RFS might not flow to the first electrodes 210, the second electrodes 220, and the fourth electrodes 240.

Figure 17C:
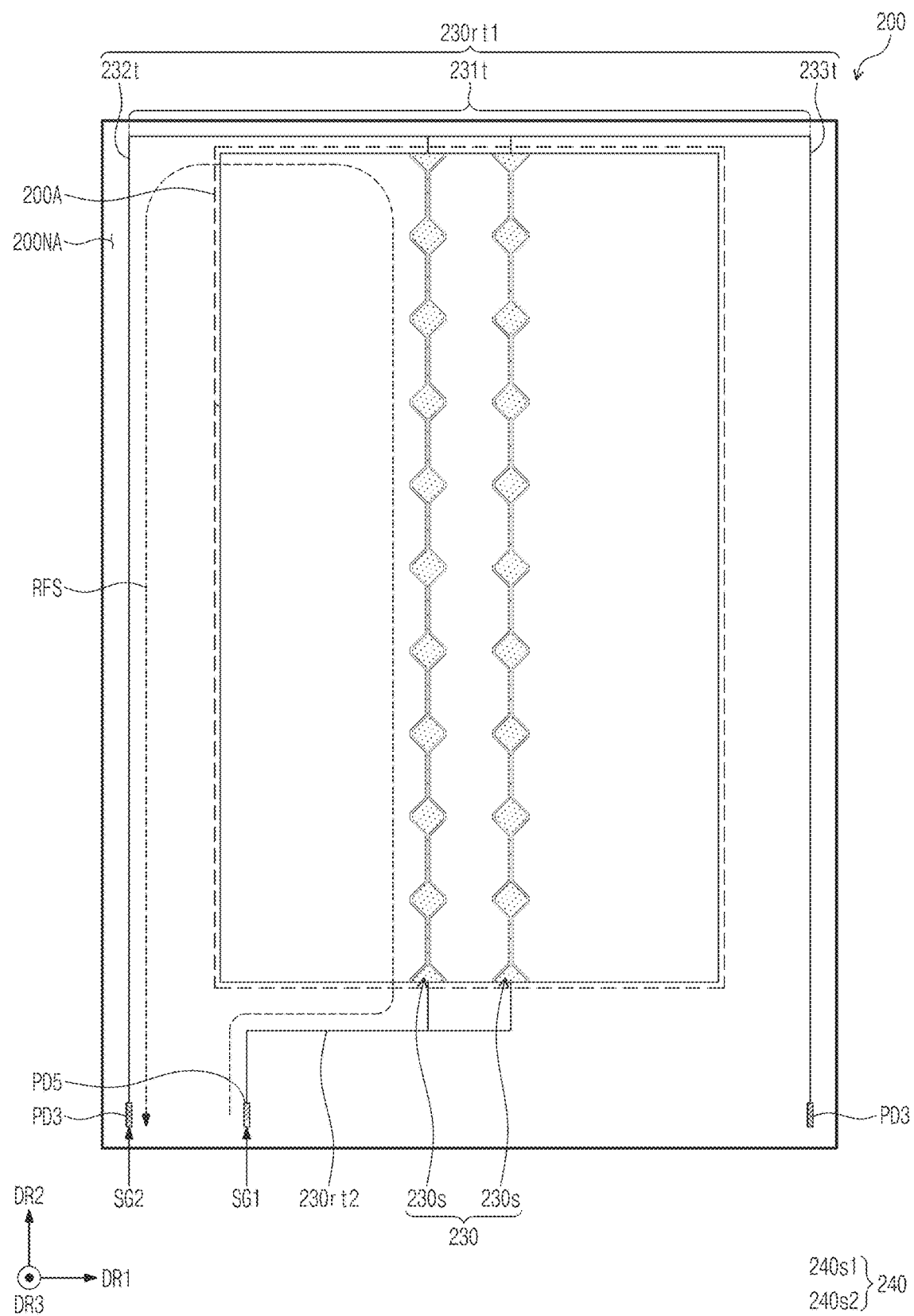
FIGS. 17C to 17E describe a charging-driving mode of the second mode according to one or more embodiments of the present disclosure.
Figure 17D:
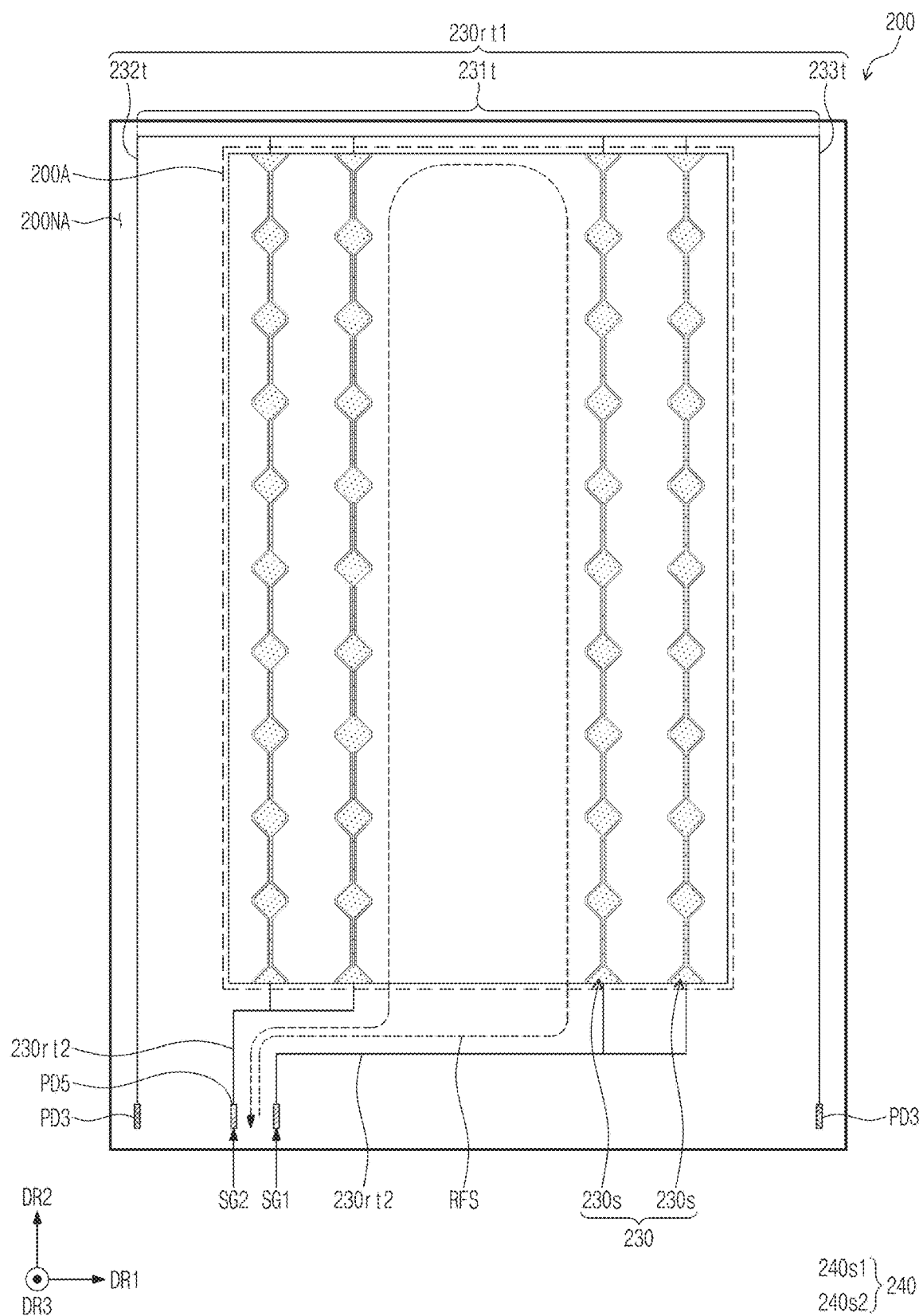
Figure 17E:
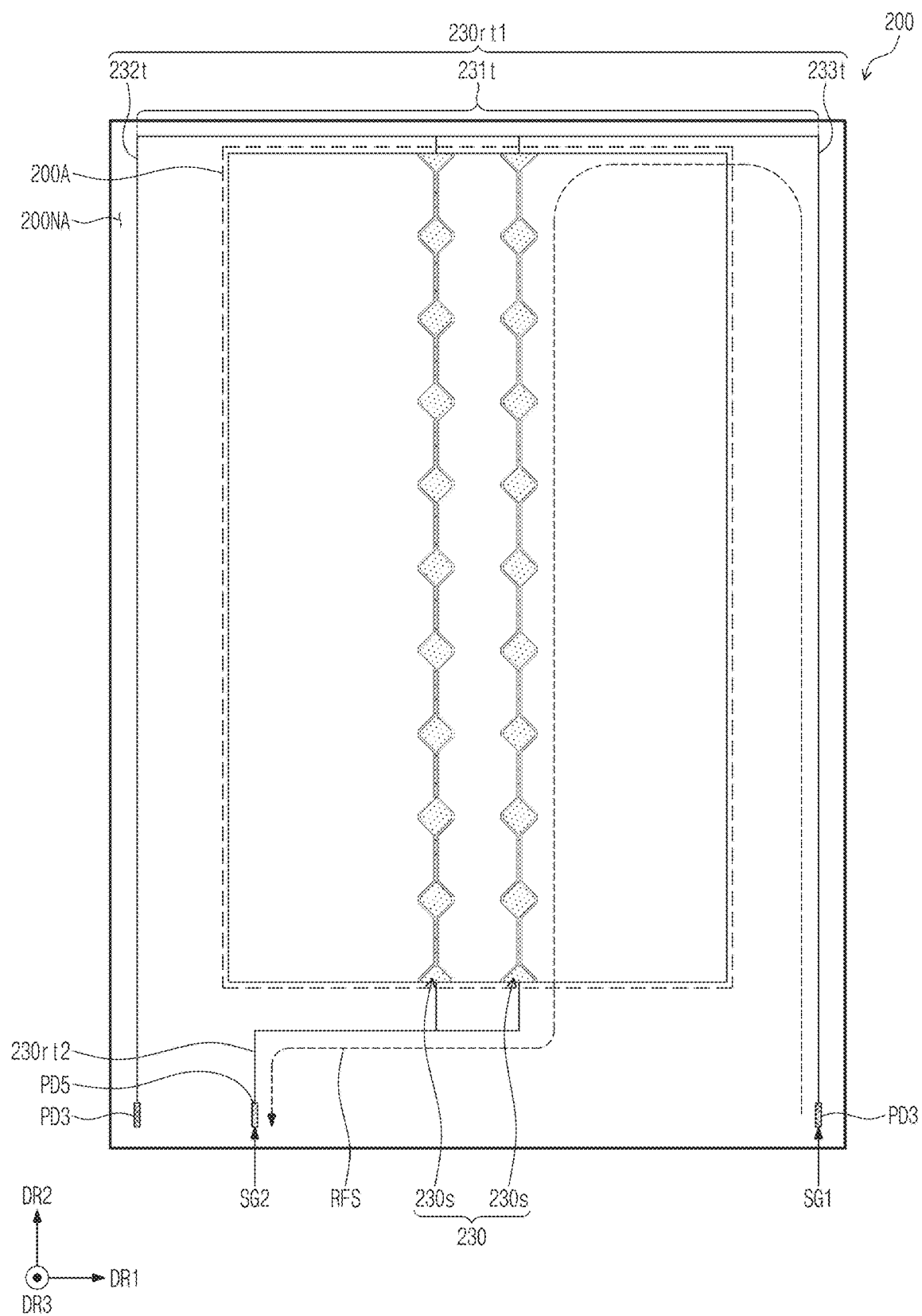
Figure 17F:
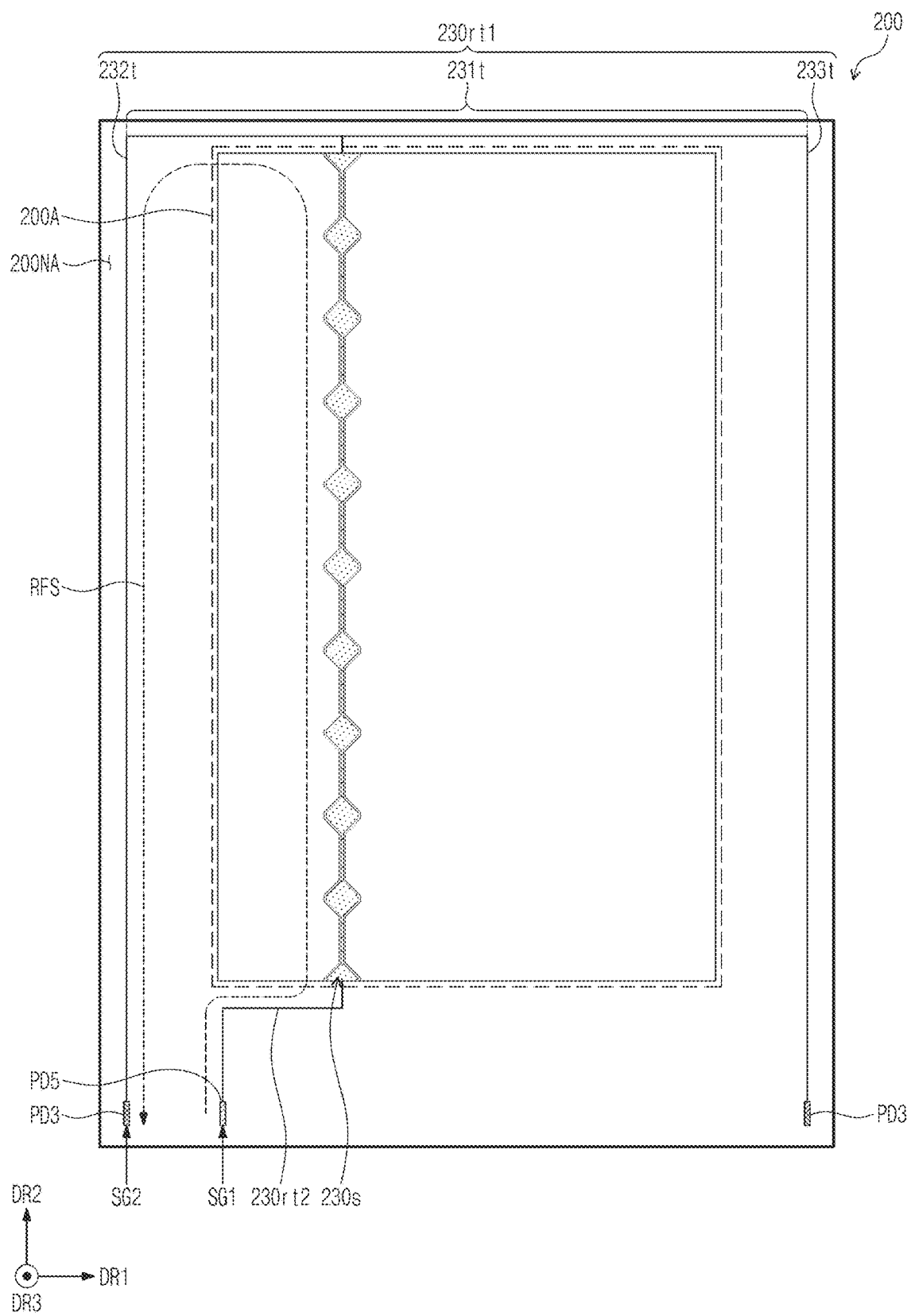
FIGS. 17F to 17H describe the charging-driving mode of the second mode according to one or more embodiments of the present disclosure.
Figure 17G:
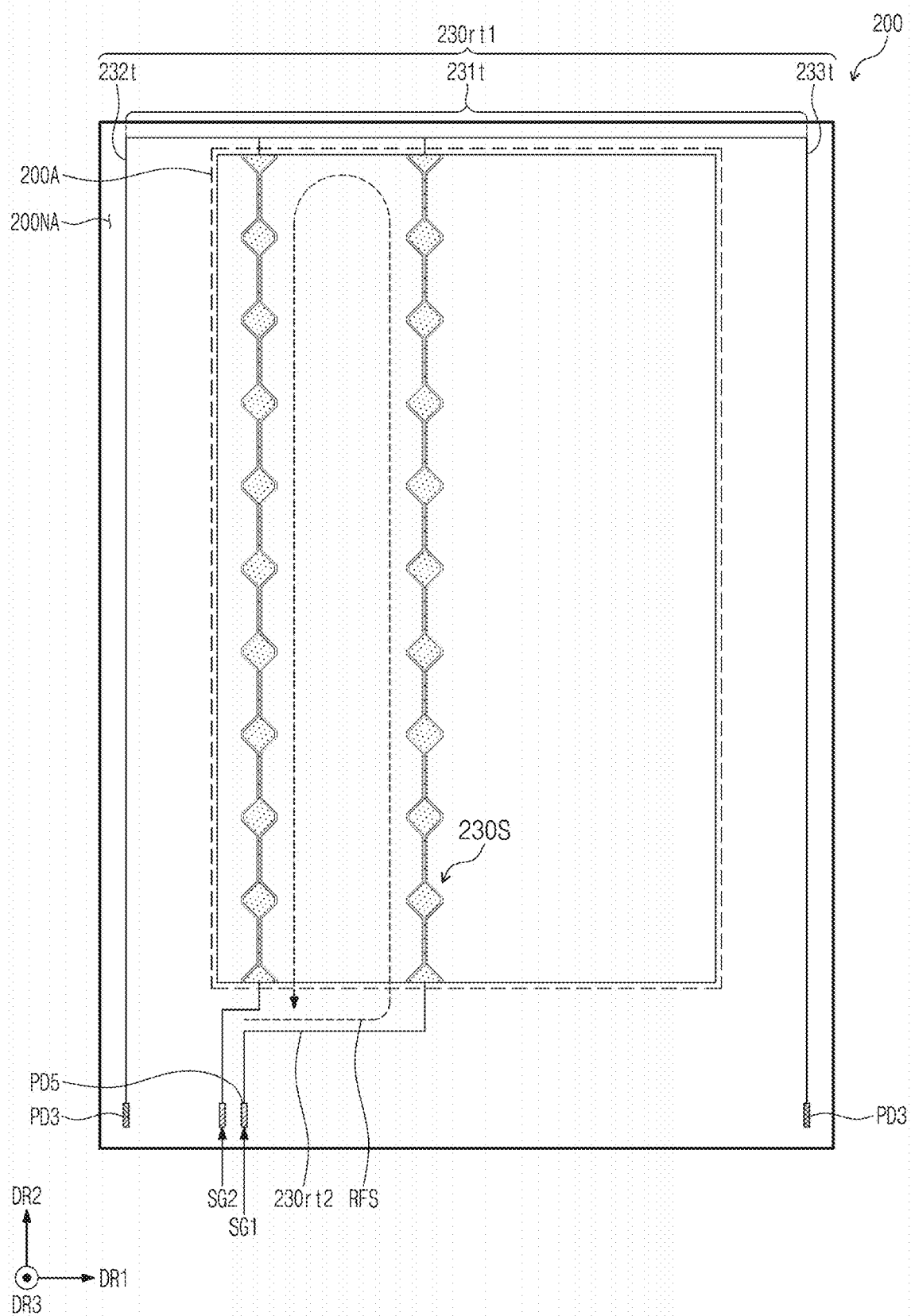
Figure 17H:
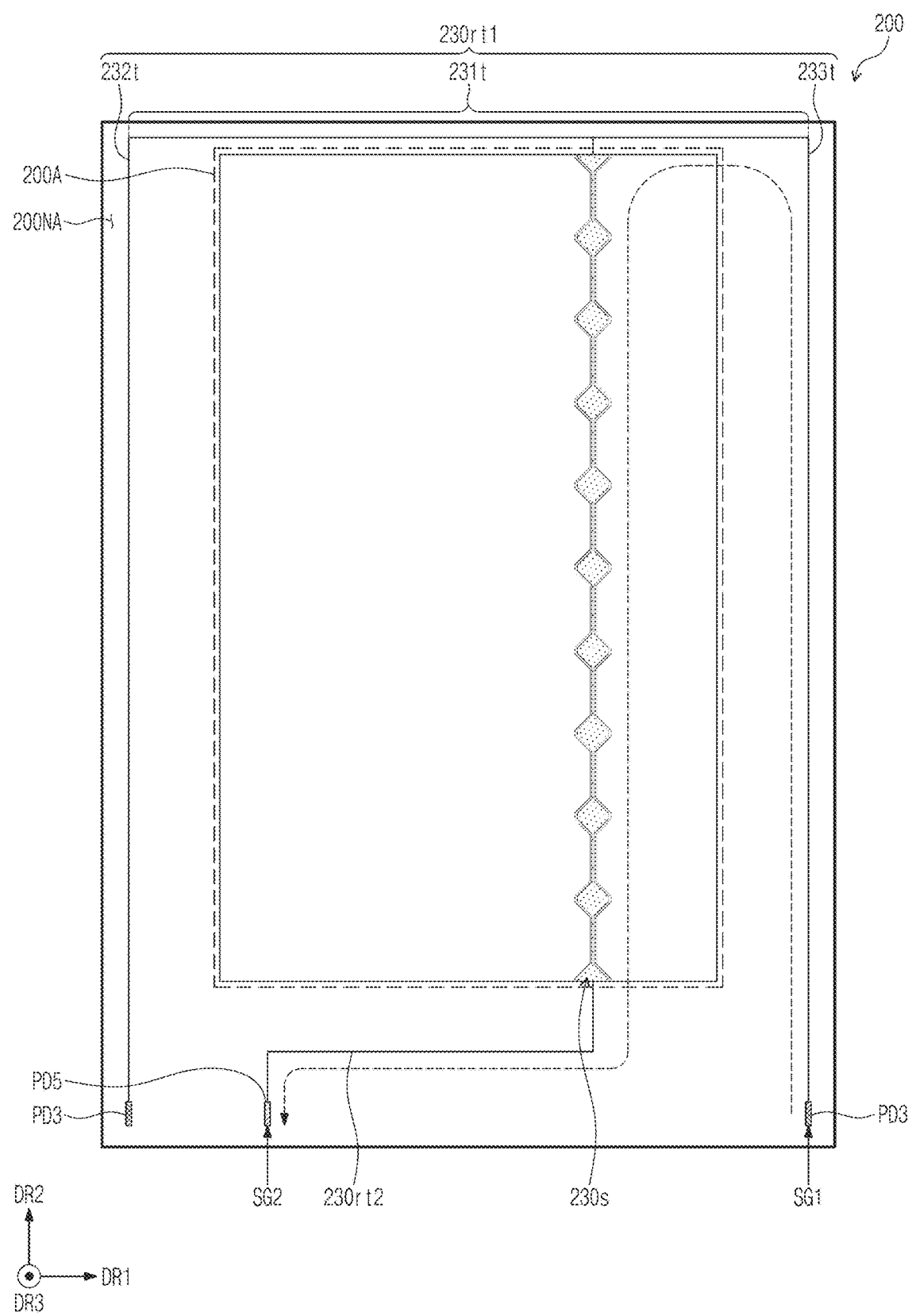

FIG. 17A is a table showing signals provided to the sensor layer according to one or more embodiments of the present disclosure. FIG. 17B is a table showing signals provided to the sensor layer according to one or more embodiments of the present disclosure. FIGS. 17C to 17E describe a charging-driving mode of the second mode according to one or more embodiments of the present disclosure. FIGS. 17F to 17H describe the charging-driving mode of the second mode according to one or more embodiments of the present disclosure.

Referring to FIGS. 6, 15, 16, and 17A, in each of first to nineth time periods t1, t2, t3, t4, t5, t6, t7, t8, and t9, the table in FIG. 17A shows signals provided to the second line portion 232*t*, to first to tenth charging channels 230*ch*1, 230*ch*2, 230*ch*3, 230*ch*4, 230*ch*5, 230*ch*6, 230*ch*7, 230*ch*8, 230*ch*9, and 230*ch*10 (hereinafter 230*ch*1 to 230*ch*10), and to the third line portion 233*t*, or the states of the third and fifth pads PD3 and PD5. The first to tenth charging channels 230*ch*1 to 230*ch*10 may be referred to as first to tenth channels, ten third electrode channels, or ten third channels.

The first to tenth charging channels 230*ch*1 to 230*ch*10 may respectively correspond to the third electrodes 230. Although FIG. 15 illustrates only three third electrodes 230 as an example, the sensor layer 200 may include three or more third electrodes 230, which may be described as the first to tenth charging channels 230*ch*1 to 230*ch*10. That is, the first to tenth charging channels 230*ch*1 to 230*ch*10 may correspond one-to-one to ten third electrodes 230.

The signals listed in the table shown in FIG. 17A are provided to the sensor layer 200 (see FIG. 15) in the searching-charging-driving mode. Accordingly, because the position of the pen PN is not sensed, the first signal SG1 or the second signal SG2 may be provided to all channels included in the sensor layer 200. That is, the entire region of the sensor layer 200 may be scanned in the searching-charging-driving mode.

In the second mode, the charging-driving mode and the pen-sensing-driving mode (see FIG. 20A) may be alternately repeated. For example, after being charge-driven during the first time period t1, the sensor layer 200 may be operated in the pen-sensing-driving mode. If the pen PN is not sensed, the sensor layer 200 may be charge-driven again during the second time period t2. Alternatively, if the pen PN is sensed, the sensor layer 200 may be driven in a tracking-charging-driving mode which will be described below with respect to FIGS. 18, 19A, and 19B. Meanwhile, in one or more embodiments of the present disclosure, alternatively, the sensor layer 200 may be continuously driven in the searching-charging-driving mode even if the pen PN is sensed.

During the first time period t1, the second signal SG2 may be provided to the second line portion 232*t*, and the first signal SG1 may be provided to the third charging channel 230*ch*3 and the fourth charging channel 230*ch*4. During the first time period t1, all of the third line portion 233*t* and the remaining charging channels 230*ch*1, 230*ch*2, 230*ch*5, 230*ch*6, 230*ch*7, 230*ch*8, 230*ch*9, and 230*ch*10, to which neither the first signal SG1 nor the second signal SG2 are provided, may be floated (FL). In FIGS. 17A and 17B, "FL" means that corresponding portions of the second line portion 232*t*, the third line portion 233*t*, and the charging channels 230*ch*1 to 230*ch*10 are floated.

During the second time period t2, the second signal SG2 may be provided to the second line portion 232*t* and the first charging channel 230*ch*1, and the first signal SG1 may be provided to the fourth charging channel 230*ch*4 and the fifth charging channel 230*ch*5. Hereafter, during the third to ninth time periods t3, t4, t5, t6, t7, t8, and t9, the second signal SG2 and the first signal SG1 may be provided while being shifted by one channel.

In one or more embodiments of the present disclosure, excluding the first time period t1 in which the second signal SG2 is provided to the second line portion 232*t*, and excluding the ninth time period t9 in which the first signal SG1 is provided to the third line portion 233*t*, the first signal SG1 may be provided to two channels, and the second signal SG2 may be provided to two channels. If a same signal is provided to a plurality of channels, the effect of reducing resistance may be obtained. Accordingly, as resistance decreases, the power consumption of the sensor layer 200 may be reduced.

However, the number of the channels to which the first signal SG1 and the second signal SG2 are provided is not particularly limited thereto. For example, the first signal SG1 may be provided to one channel, and the second signal SG2 may be provided to another channel, or the first signal SG1 may be provided to three or more channels, and the second signal SG2 may be provided to three or more other channels.

In one or more embodiments of the present disclosure, the operation of the second time period t2 may be omitted, and the operation of the third time period t3 may be performed immediately after the operation of the first time period t1. In addition, the operation of the eighth time period t8 may be omitted, and the operation of the ninth time period t9 may be performed immediately after the operation of the seventh time period t7.

To generate an electromagnetic field with an intensity equal to or exceeding a level (e.g., predetermined level), it is desirable that floated charging channels should be located between charging channels, to which the second signal SG2 and the first signal SG1 are provided, or between a second line portion 232*t* or a third line portion 233*t* and a charging channel. In one or more embodiments of the present disclosure, it is illustrated that the first and second charging channels 230*ch*1 and 230*ch*2 are floated between the second line portion 232*t* and the third charging channel 230*ch*3 in the first time period t1. That is, it is illustrated that two floated channels (hereinafter referred to as gap channels)

exist between a channel to which the first signal SG1 is provided and a channel to which the second signal SG2 is provided. As the number of the gap channels increases, the intensity of the magnetic field formed by the current RFS may increase. Accordingly, the number of the gap channels may change depending on the usage conditions of the electronic device 1000 (see FIG. 1A) or the type of pen.

Referring to FIGS. 15, 16A, and 17B, in the first time period t1, the second signal SG2 may be provided to the second line portion 232*t* and the first charging channel 230*ch*1, and the first signal SG1 may be provided to the fourth charging channel 230*ch*4 and the fifth charging channel 230*ch*5. All of the third line portion 233*t* and the remaining charging channels 230*ch*1, 230*ch*2, 230*ch*3, 230*ch*6, 230*ch*7, 230*ch*8, 230*ch*9, and 230*ch*10, to which neither the first signal SG1 nor the second signal SG2 is provided, may be floated. Hereafter, during the second to ninth time periods t2, t3, t4, t5, t6, t7, t8, and t9, the second signal SG2 and the first signal SG1 may be provided while being shifted by one channel.

At the first time period t1, the third trace line 230*rt*1 may be driven with the second signal SG2, the third trace line 230*rt*1 being connected to a first end of each of third electrode 230. Also, a portion of fifth trace lines 230*rt*2 may be driven with the second signal SG2, the portion of fifth trace lines 230*rt*2 being connected to a second end of each of first group electrodes of the third electrodes 230. Further, another portion of fifth trace lines 230*rt*2 may be driven with the first signal SG1 that is different from the second signal SG2, the another portion of third connection line 230*rt*2 being connected to a second end of each of second group electrodes of the third electrode 230.

When compared to the driving operation illustrated in FIG. 17A, in the driving operation illustrated in FIG. 17B, the operation may be omitted in which the first signal SG1 or the second signal SG2 is provided to only the second line portion 232*t* and the third line portion 233*t*. Accordingly, the entire sensor layer 200 may be scanned during the first to seventh time periods t1, t2, t3, t4, t5, t6, and t7. That is, according to the one or more embodiments described in FIG. 17B when compared to FIG. 17A, the entire sensor layer 200 may be scanned for a relatively shorter time.

FIGS. 17C to 17E respectively illustrate operations in a first time period, an n-th time period, and a last time period of one frame (or cycle) in the searching-charging-driving mode. The n-th time period may be the third time period t3 to the seventh time period t7 in the one or more embodiments described in FIG. 17A.

To allow the current RFS with a same intensity to flow during the first time period, the n-th time period, and the last time period, the resistances of the second line portion 232*t* and the third line portion 233*t* may be set based on the resistance of the third electrode 230 (e.g., of the charging channels 230*ch*1 to 230*ch*10) of FIG. 17A. In one or more embodiments of the present disclosure, each of the resistance of the second line portion 232*t* and the resistance of the third line portion 233*t* may be substantially equal to the resistance of one of the charging channels 230*ch*1 to 230*ch*10. In addition, the resistance of the second line portion 232*t* and the resistance of the third line portion 233*t* may be substantially equal to each other.

Because the third electrodes 230 respectively define the charging channels 230*ch*1 to 230*ch*10, each of the resistance of the second line portion 232*t* and the resistance of the third line portion 233*t* may be substantially equal to the resistance of one of the third electrodes 230. The charging channels 230*ch*1 to 230*ch*10 may include a plurality of first auxiliary electrodes 230*s*, which are electrically connected to each other, or which receive a same signal. FIGS. 17C to 17E illustrate that the charging channels 230*ch*1 to 230*ch*10 include two first auxiliary electrodes 230*s*.

The second line portion 232*t* and the third line portion 233*t* may serve as the third electrodes 230, and the second line portion 232*t* and the third line portion 233*t* may produce an effect substantially equal to having the third electrodes 230 located in the peripheral region 200NA. For example, any one of the second line portion 232*t* or the third line portion 233*t* and any one of the third electrodes 230 may form a coil that induces an electromagnetic field. Although the pen PN is positioned in the peripheral region 200NA, the RLC resonance circuit of the pen PN may be charged. As the charging sensitivity of the pen PN in the peripheral region 200NA is improved, the signal-to-noise ratio of the pen PN in the peripheral region 200NA may be improved. This improvement in the signal-to-noise ratio of the pen PN may reduce the time of the pen standby mode described with reference to FIGS. 4 and 11. In addition, the improvement in the signal-to-noise ratio of the pen PN may increase a detectable hovering height.

FIGS. 17F to 17H illustrate a searching-charging-driving mode according to one or more embodiments of the present disclosure, which is different from the searching-charging-driving mode of FIGS. 17C to 17E. In FIGS. 17F to 17H, the charging channels 230*ch*1 to 230*ch*10 may include one first auxiliary electrode 230*s*. Each of the resistance of the second line portion 232*t* and the resistance of the third line portion 233*t* may be substantially equal to the resistance of one first auxiliary electrode 230*s*. Also, a resistance of the second line portion 232*t* may be less than a resistance of one of the first electrodes 230*s*.

Figure 18:
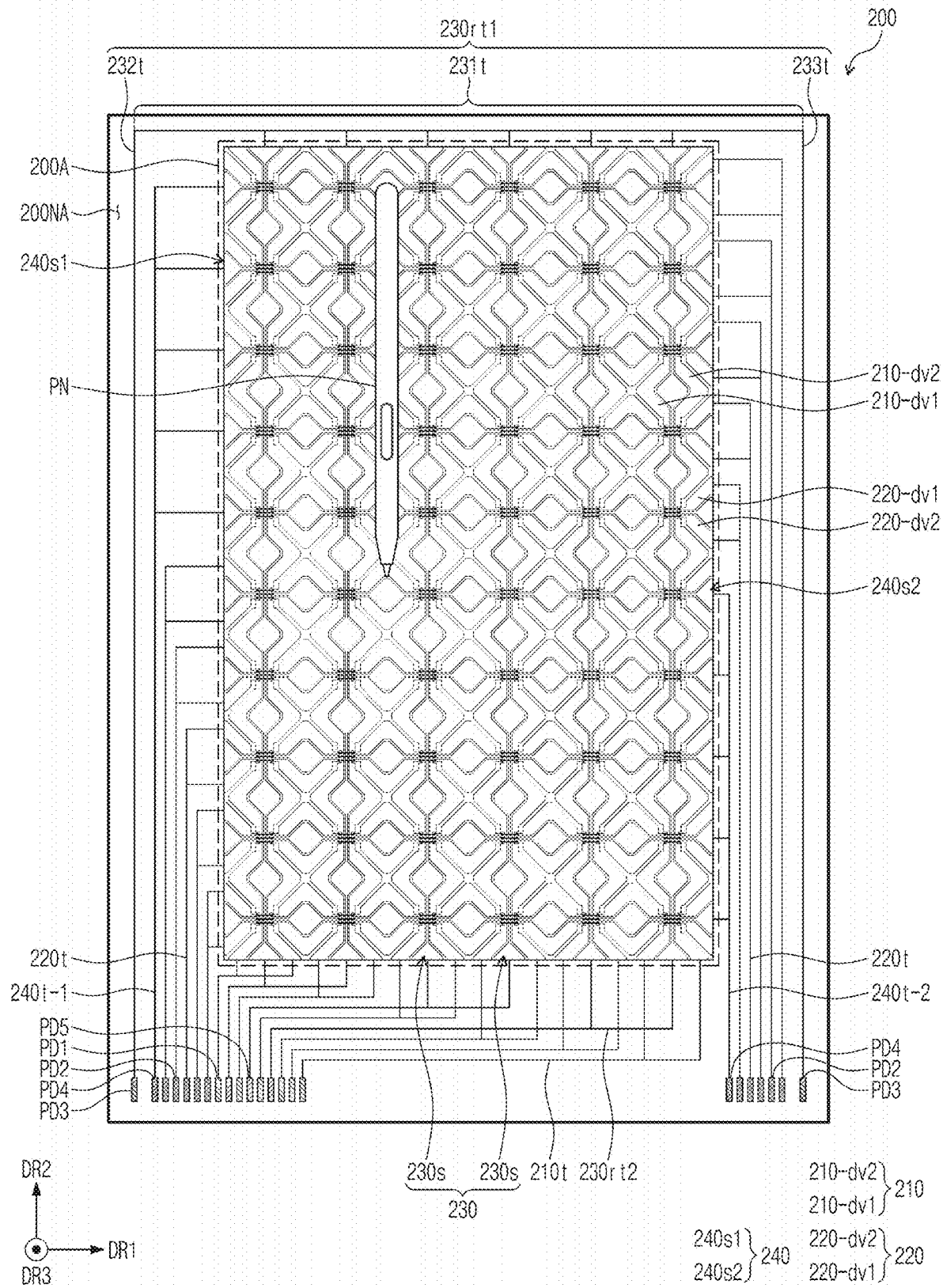
FIG. 18 describes a second mode according to one or more embodiments of the present disclosure.

FIG. 18 describes a second mode according to one or more embodiments of the present disclosure. FIG. 19A is a table showing signals provided to the sensor layer according to one or more embodiments of the present disclosure. FIG. 19B is a table showing signals provided to the sensor layer according to one or more embodiments of the present disclosure.

FIG. 18 describes a tracking-charging-driving mode. Referring to FIGS. 12 and 18, if a pen PN is sensed in the searching-charging-driving mode, the sensor layer 200 may be driven in the tracking-charging-driving mode. For example, in the tracking-charging-driving mode, the sensor driver 2000 may sequentially output the first signal SG1 and the second signal SG2 to a region overlapping a point at which the pen PN is sensed, not to the entire region of the sensor layer 200.

Referring to FIGS. 18 and 19A, a position PN-dt of the pen PN sensed in a previous frame is indicated. FIG. 19A illustrates that the pen PN is sensed in a region overlapping the fifth charging channel 230*ch*5 and the sixth charging channel 230*ch*6. In this case, the sensor driver 2000 may provide the first signal SG1 and the second signal SG2 to channels located in a region including the fifth charging channel 230*ch*5 and the sixth charging channel 230*ch*6.

In one or more embodiments of the present disclosure, the first signal SG1 and the second signal SG2 may be provided to a central loop surrounding the position PN-dt of the pen PN of a previous frame and regions shifted by one channel from left to right based on the central loop. The central loop may be provided (or formed) by the third and fourth charging channels 230*ch*3 and 230*ch*4 and the seventh and eighth charging channels 230*ch*7 and 230*ch*8 in the second time period t2 illustrated in FIG. 19A.

In the first time period t1, the second signal SG2 may be provided to the second charging channel 230ch2 and to the third charging channel 230ch3, and the first signal SG1 may be provided to the sixth charging channel 230ch6 and to the seventh charging channel 230ch7. In the second time period t2, the second signal SG2 may be provided to the third charging channel 230ch3 and to the fourth charging channel 230ch4, and the first signal SG1 may be provided to the seventh charging channel 230ch7 and to the eighth charging channel 230ch8. In the third time period t3, the second signal SG2 may be provided to the fourth charging channel 230ch4 and to the fifth charging channel 230ch5, and the first signal SG1 may be provided to the eighth charging channel 230ch8 and to the ninth charging channel 230ch9.

Accordingly, after the position PN-dt of the pen PN is sensed, channels charge-driven in response to the position PN-dt of the pen PN of a previous frame may be limited. Accordingly, as channels overlapping a region in which the pen PN is not positioned are not charge-driven, the efficiency of charging driving may be improved.

Referring to FIGS. 18 and 19B, the position PN-dt of the pen PN in a previous frame is indicated. It is illustrated that the pen PN is sensed in a region overlapping the fifth charging channel 230ch5 and the sixth charging channel 230ch6. In this case, the sensor driver 2000 may provide the first signal SG1 and the second signal SG2 to channels located in a region including the fifth charging channel 230ch5 and the sixth charging channel 230ch6. For example, the first signal SG1 and the second signal SG2 may be provided to a central loop surrounding the position PN-dt of the pen PN of a previous frame, and regions shifted by two channels from left to right based on the central loop.

FIG. 19A describes that three loop coils including a central loop are sequentially formed in the tracking-charging-driving mode, and FIG. 19B describes that five loop coils including a central loop are sequentially formed in the tracking-charging-driving mode, but the present disclosure is not particularly limited thereto. For example, the number of the loop coils sequentially formed in the tracking-charging-driving mode may be variously changed.

Figure 20A:
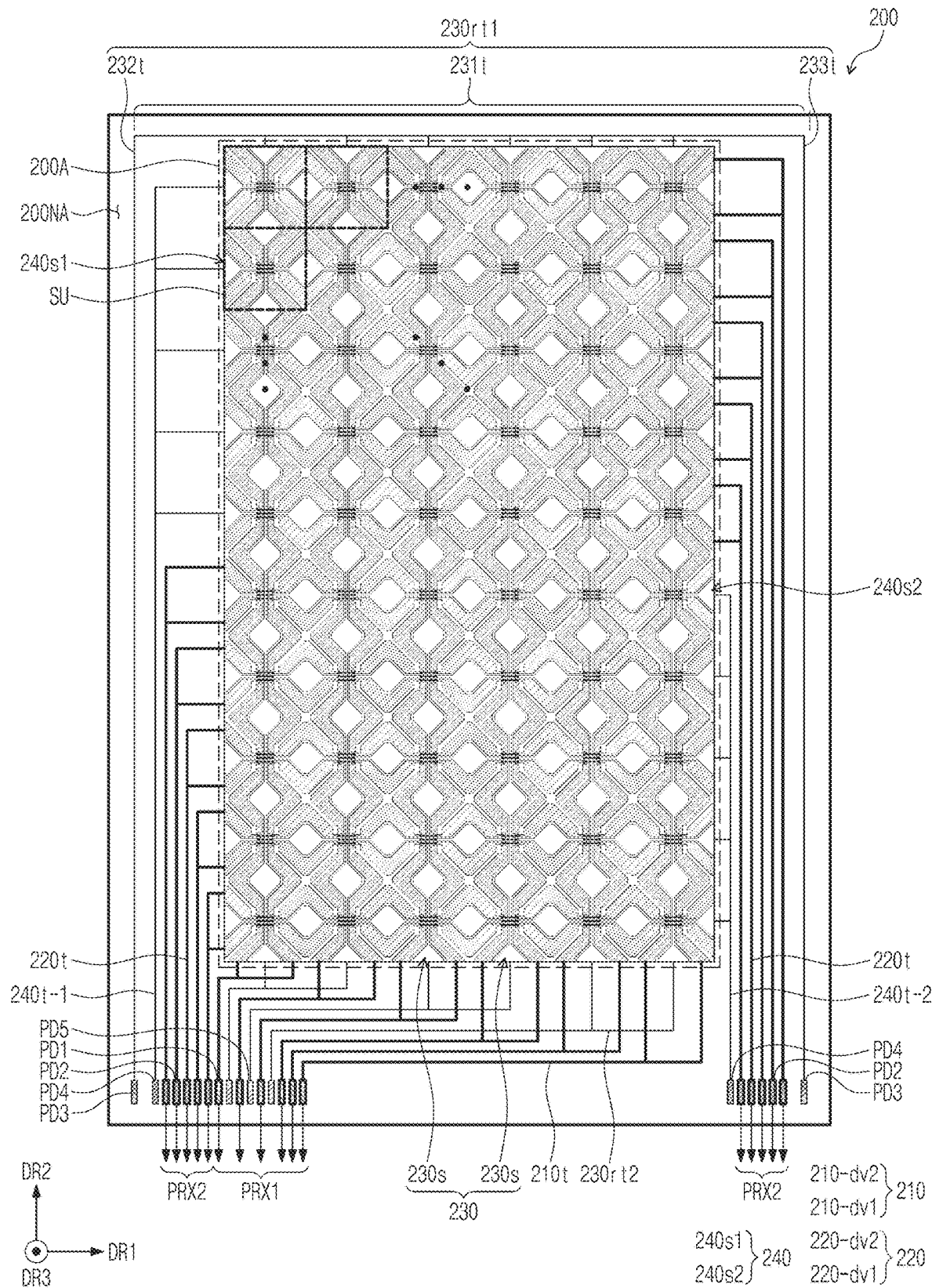
FIG. 20A describes a second mode according to one or more embodiments of the present disclosure.
Figure 20B:
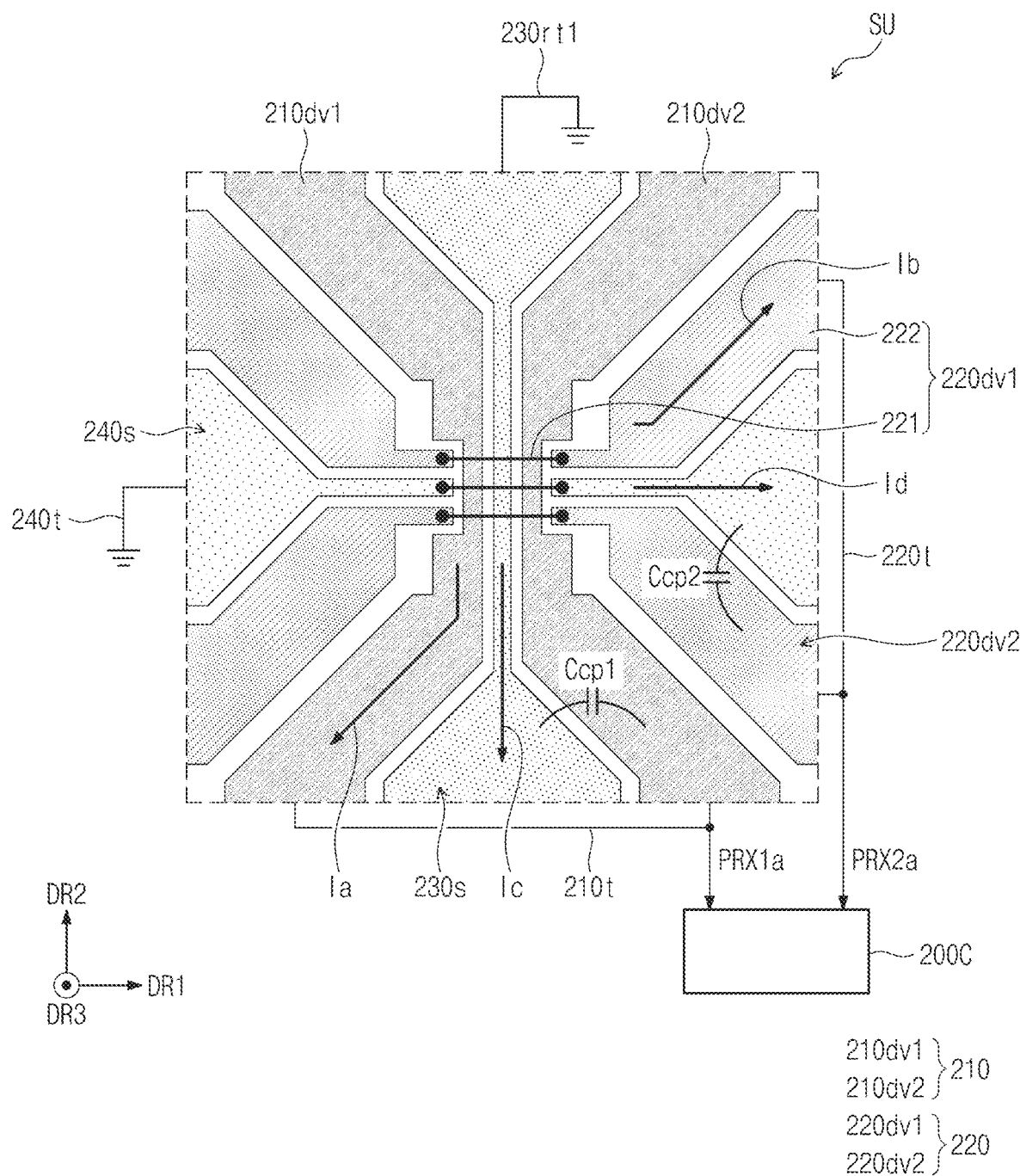
FIG. 20B describes a second mode, based on the sensing unit according to one or more embodiments of the present disclosure.

FIG. 20A described a second mode according to one or more embodiments of the present disclosure. FIG. 20B describes a second mode, based on the sensing unit SU according to one or more embodiments of the present disclosure.

FIGS. 20A and 20B describe a pen-sensing-driving mode. FIG. 20B illustrates one sensing unit SU through which first to fourth induced currents Ia, Ib, Ic, and Id generated by the pen PN flow.

The RLC resonance circuit of the pen PN may emit a magnetic field at a resonance frequency while discharging a charged electric charge. By the magnetic field provided from the pen PN, a first induced current Ia may be generated in the first electrode 210 and a second induced current Ib may be generated in the second electrode 220. In addition, a third induced current Ic may be generated in the first auxiliary electrode 230s of the third electrode 230, and a fourth induced current Id may be generated in the second auxiliary electrode 240s of the fourth electrode 240.

A first coupling capacitor Ccp1 may be formed between the first auxiliary electrode 230s and the first electrode 210, and a second coupling capacitor Ccp2 may be formed between the second auxiliary electrode 240s and the second electrode 220. The third induced current Ic may be transmitted to the first electrode 210 through the first coupling capacitor Ccp1, and the fourth induced current Id may be transmitted to the second electrode 220 through the second coupling capacitor Ccp2.

The sensor driver 2000 may receive a first reception signal PRX1a based on the first induced current Ia and the third induced current Ic from the first electrode 210, and may receive a second reception signal PRX2a based on the second induced current Ib and the fourth induced current Id from the second electrode 220. The sensor driver 2000 may detect the input coordinate of the pen PN, based on the first reception signal PRX1a and the second reception signal PRX2a.

During the pen-sensing-driving mode, one ends of both of the third electrodes 230 and the fourth electrodes 240 may be floated. Compensation of a sensing signal may be improved or maximized by coupling the first electrodes 210 and the third electrodes 230, and by coupling the second electrodes 220 and the fourth electrodes 240. The other ends of the third electrodes 230 and the fourth electrodes 240 may be grounded or floated. Therefore, by coupling the first electrodes 210 and the third electrodes 230, and by coupling the second electrodes 220 and the fourth electrodes 240, the third induced current Ic and the fourth induced current Id may be sufficiently transmitted to the first electrodes 210 and the second electrodes 220.

Figure 21A:
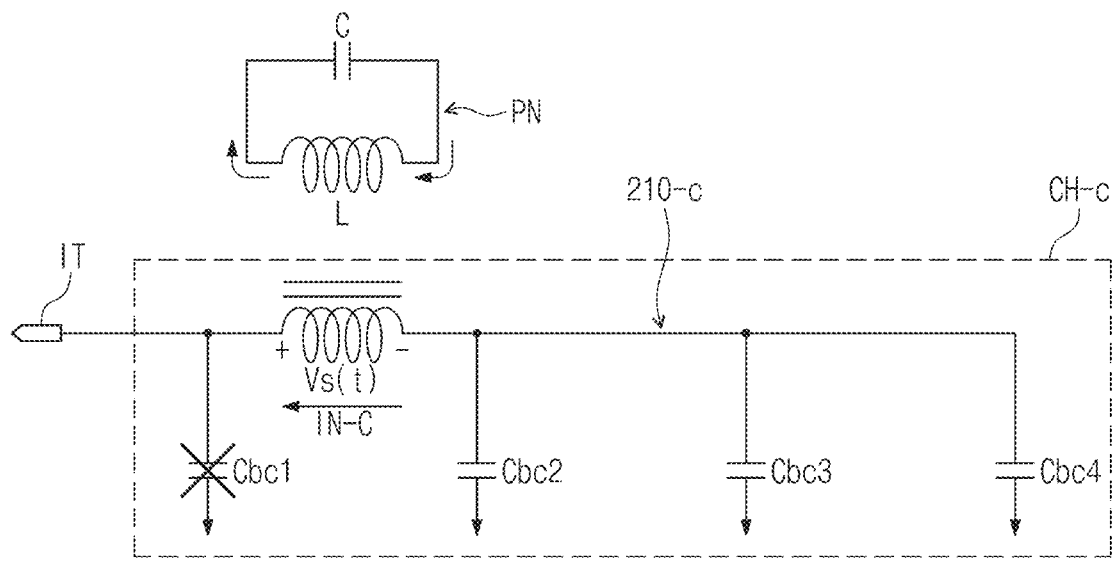
FIG. 21A is an equivalent circuit diagram illustrating the relationship between one channel and a pen according to one or more comparative embodiments of the present disclosure.
Figure 21B:
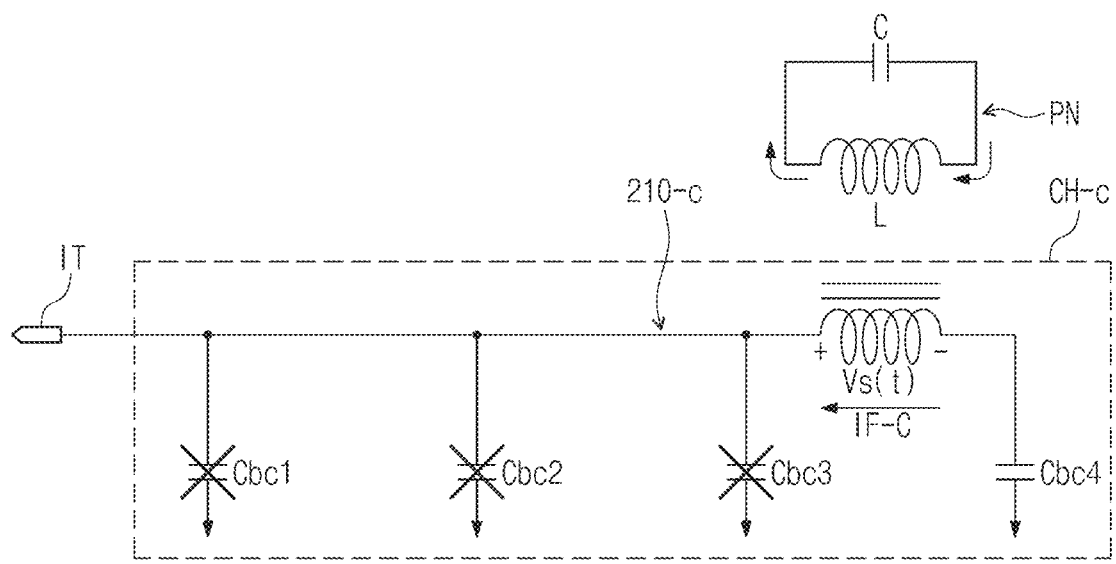
FIG. 21B is an equivalent circuit diagram illustrating the relationship between one channel and a pen according to a one or more comparative embodiments of the present disclosure.

FIG. 21A is an equivalent circuit diagram illustrating the relationship between one channel CH-c and a pen PN according to one or more comparative embodiments of the present disclosure. FIG. 21B is an equivalent circuit diagram illustrating the relationship between one channel CH-c and a pen PN according to one or more comparative embodiments of the present disclosure.

Referring to FIGS. 21A and 211B, one channel CH-c may be composed of one electrode 210-c connected to an input terminal IT. The input terminal IT may correspond to one pad electrically connected between the sensor driver 2000 and the one electrode 210-c.

Capacitors Cbc1, Cbc2, Cbc3, and Cbc4 are defined in one electrode 210-c. The capacitors Cbc1, Cbc2, Cbc3, and Cbc4 may be referred to as parasitic capacitors or base capacitors.

Referring to FIG. 21A, if a pen PN is close to one channel CH-c, a first induced electromotive force Vs(t) may be generated in the electrode 210-c by a magnetic field generated by the pen PN. Accordingly, an induced current IN-C may be generated in the one channel CH-c. In FIGS. 21A and 21B, the input terminal IT may correspond to one pad electrically connected between the sensor driver 200C (see FIG. 4) and one channel CH-c. For example, the input terminal IT may be a pad PD1 (see FIG. 6). If the pen PN is close to the one channel CH-c, the input terminal IT may be grounded. Accordingly, because the voltages on both ends of the capacitor Cbc1 among the capacitors Cbc1, Cbc2, Cbc3, and Cbc4 are all grounded, current might not flow to the capacitor Cbc1.

The induced current IN-C may be proportional to the sum of the capacitances of the capacitors Cbc2, Cbc3, and Cbc4. For example, assuming that the capacitance of each of the capacitors Cbc2, Cbc3, and Cbc4 is Cb, the induced current IN-C over time may be expressed as Mathematical Equation 1 below.

$$3Cb\frac{dVs(t)}{dt} \qquad \text{Mathematical Equation 1}$$

Referring to FIG. 21B, if a pen PN is close to one channel CH-c, an induced current IF-C may be generated in the one channel CH-c by a magnetic field generated by the pen PN. Because the voltages of both ends of the first to third capacitors Cbc1, Cbc2, and Cbc3 among the capacitors Cbc1, Cbc2, Cbc3, and Cbc4 are grounded, current might not flow to the capacitors Cbc1, Cbc2, and Cbc3. Assuming that the capacitance of the capacitor Cbc4 is Cb, the induced current IF-C over time may be expressed by Mathematical Equation 2 below.

$$3Cb\frac{dVs(t)}{dt} \quad \text{Mathematical Equation 2}$$

Referring to FIGS. 21A and 21B, if a pen PN is positioned in a region adjacent to the input terminal IT, and if a pen PN is positioned in a region far away from the input terminal IT, it can be seen that a difference in the magnitude of the induced current may occur. For example, a signal of the pen PN input from a region far from the input terminal IT or from the sensor driver 2000 may be smaller than a signal of the pen PN input from a region close to the input terminal IT or the sensor driver 2000. For example, the induced current IF-C might not be large enough to sense an input of the pen.

Figure 22A:
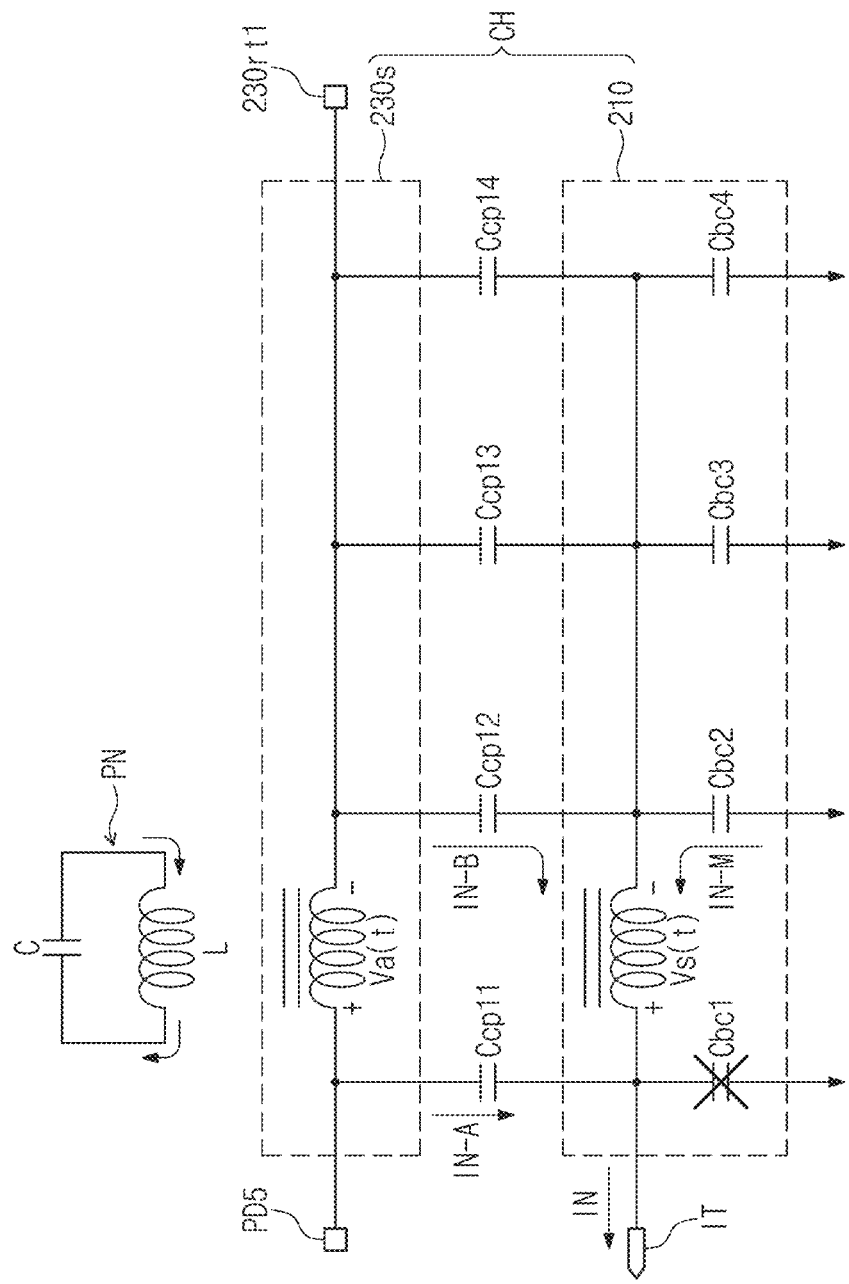
FIG. 22A is an equivalent circuit diagram illustrating the relationship between one channel and a pen according to one or more embodiments of the present disclosure.
Figure 22B:
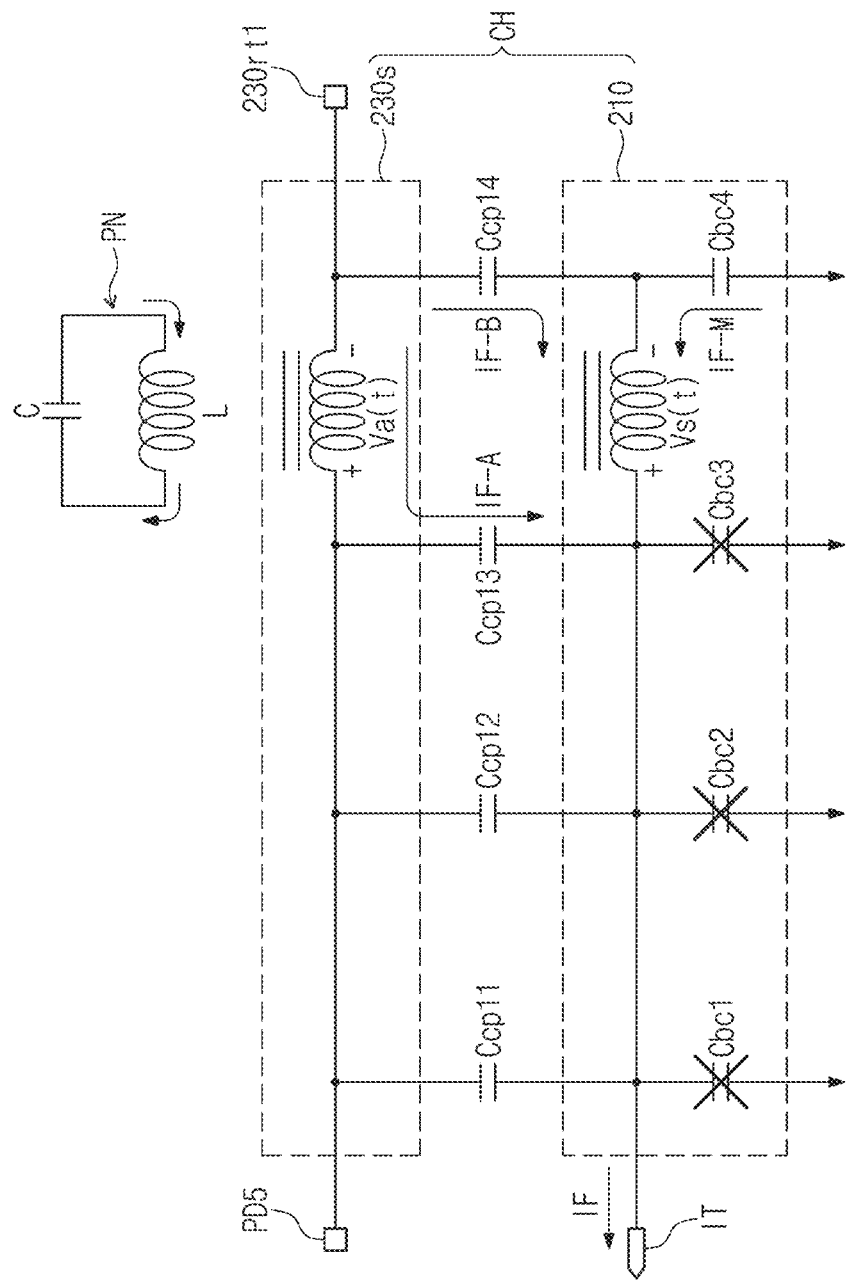
FIG. 22B is an equivalent circuit diagram illustrating the relationship between one channel and a pen according to one or more embodiments of the present disclosure.

FIG. 22A is an equivalent circuit diagram illustrating the relationship between one channel and a pen according to one or more embodiments of the present disclosure. FIG. 22B is an equivalent circuit diagram illustrating the relationship between one channel and a pen according to one or more embodiments of the present disclosure.

Referring to FIGS. 6, 22A, and 22B, one channel CH may include the first electrode 210 connected to the input terminal IT, and the first auxiliary electrode 230s of the third electrode 230 coupled to the first electrode 210.

A plurality of first coupling capacitors Ccp11, Ccp12, Ccp13, and Ccp14 may be defined between the first electrode 210 and the first auxiliary electrode 230s. Capacitors Cbc1, Cbc2, Cbc3, and Cbc4 are defined in the first electrode 210. The capacitors Cbc1, Cbc2, Cbc3, and Cbc4 may be referred to as parasitic capacitors or base capacitors.

The input terminal IT may correspond to one pad, for example, the first pad PD1, which is electrically connected between the sensor driver 200C and the first electrode 210. One end of the first auxiliary electrode 230s may be electrically connected to the fifth pad PD5, and the other end of the first auxiliary electrode 230s may be electrically connected to the third trace line 230rt1. In one or more embodiments of the present disclosure, the fifth pad PD5 may be floated, and the third trace line 230rt1 may be grounded or grounded through a bias capacitor.

Referring to FIG. 22A, if a pen PN is close to one channel CH, a first induced electromotive force Vs(t) may be generated in the first electrode 210 by a magnetic field generated by the pen PN, and a second induced electromotive force Va(t) may be generated in the first auxiliary electrode 230s of the third electrode 230. A first induced current IN-M and a third induced current IN-B may be generated by the first induced electromotive force Vs(t), and a second induced current IN-A may be generated by the second induced electromotive force Va(t). Accordingly, a total induced current IN input to the input terminal IT may correspond to the sum of the first to third induced currents IN-M, IN-A, and IN-B.

For example, it is assumed that the capacitance of each of the capacitors Cbc1, Cbc2, Cbc3, and Cbc4 is Cb, and that the capacitance of each of the first coupling capacitors Ccp11, Ccp12, Ccp13, and Ccp14 is Cc.

The first induced current IN-M over time may be expressed as Mathematical Equation 3 below.

$$3Cb\frac{dVs(t)}{dt} \quad \text{Mathematical Equation 3}$$

The second induced current IN-A over time may be expressed as Mathematical Equation 4 below.

$$Cc\frac{dVa(t)}{dt} \quad \text{Mathematical Equation 4}$$

The third induced current IN-B over time may be expressed as Mathematical Equation 5 below.

$$3Cc\frac{dVs(t)}{dt} \quad \text{Mathematical Equation 5}$$

The first induced current IN-M may be an induced current due to at least some of the capacitors Cbc1, Cbc2, Cbc3, and Cbc4 and may be referred to as an auxiliary induced current. The first induced current IN-M generated in the first electrode 210 may be referred to as a first auxiliary induced current, and the first induced current IN-M generated in the second electrode 220 may be referred to as a second auxiliary induced current. Each of the second induced current IN-A and the third induced current IN-B may be an induced current due to at least some of the first coupling capacitors Ccp11, Ccp12, Ccp13, and Ccp14 and may be referred to as a coupling induced current.

Referring to FIG. 22B, if a pen PN is close to one channel CH, a first induced electromotive force Vs(t) may be generated in the first electrode 210 by a magnetic field generated by the pen PN, and a second induced electromotive force Va(t) may be generated in the first auxiliary electrode 230s of the third electrode 230. Because the voltages of both ends of each of the capacitors Cbc1, Cbc2, and Cbc3 located between the first induced electromotive force Vs(t) and the input terminal IT are grounded, current might not flow to the capacitors Cbc1, Cbc2, and Cbc3.

A first induced current IF-M and a third induced current IF-B may be generated by the first induced electromotive force Vs(t), and a second induced current IF-A may be generated by the second induced electromotive force Va(t). Accordingly, a total induced current IF input to the input terminal IT may correspond to the sum of the first to third induced currents IF-M, IF-A, and IF-B.

For example, it is assumed that the capacitance of each of the capacitors Cbc1, Cbc2, Cbc3, and Cbc4 is Cb and that the capacitance of each of the first coupling capacitors Ccp11, Ccp12, Ccp13, and Ccp14 is Cc.

The first induced current IF-M over time may be expressed as Mathematical Equation 6 below.

$$Cb\frac{dVs(t)}{dt} \quad \text{Mathematical Equation 6}$$

The second induced current IF-A over time may be expressed as Mathematical Equation 7 below.

$$3Cc\frac{dVa(t)}{dt} \qquad \text{Mathematical Equation 7}$$

The third induced current IF-B over time may be expressed as Mathematical Equation 8 below.

$$Cc\frac{dVs(t)}{dt} \qquad \text{Mathematical Equation 8}$$

Figure 23:
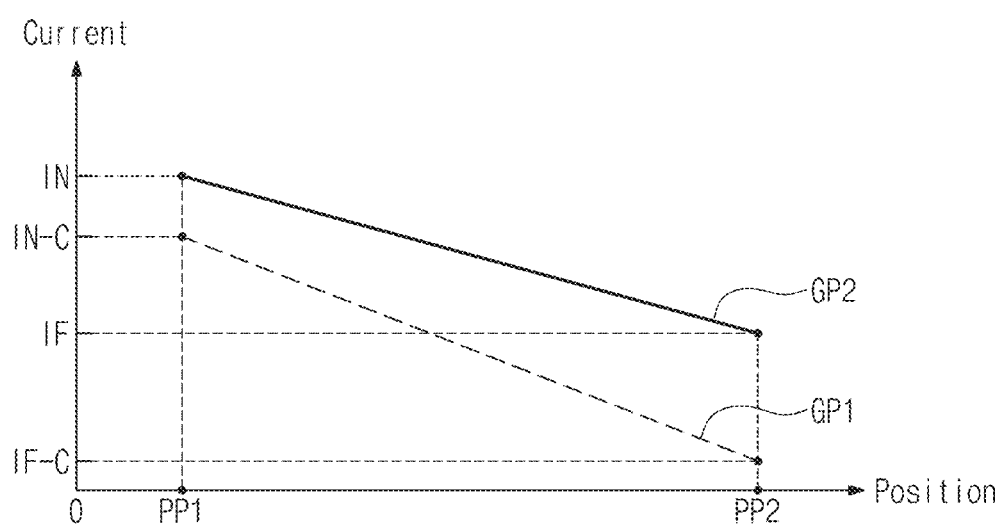
FIG. 23 is a graph showing current magnitudes according to the positions of a pen for one channel.

FIG. 23 is a graph showing current magnitudes according to the positions of a pen for one channel.

Referring to FIGS. 6, 21A, 21B, 22A, 22B, and 23, a first graph GP1 is a graph of current magnitudes according to the positions of the pen, which are measured according to the embodiments of FIGS. 21A and 21B. A second graph GP2 is a graph of current magnitudes according to the positions of the pen, which are measured according to the embodiments of FIGS. 22A and 22B.

A first point PP1 may correspond to the position of the pen PN illustrated in FIGS. 21A and 22A, and a second point PP2 may correspond to the position of the pen PN illustrated in FIGS. 21B and 22B. For example, at the second point PP2, the second induced current IF-A and the third induced current IF-B generated in the third electrode 230 by the first coupling capacitors Ccp11, Ccp12, Ccp13, and Ccp14 may be additionally generated. Accordingly, the total induced current IF may be larger than the total induced current IF-C according to one or more comparative embodiments of the present disclosure, and the magnitude of the total induced current IF may be large enough to sense an input of the pen. In addition, at the first point PP1, the total induced current IN may be larger than the total induced current IN-C according to one or more comparative embodiments of the present disclosure. Accordingly, the magnitude of each of the total induced currents IN and IF at the first point PP1 and the second point PP2 may be secured to a value (e.g., predetermined value) or more.

Figure 24:
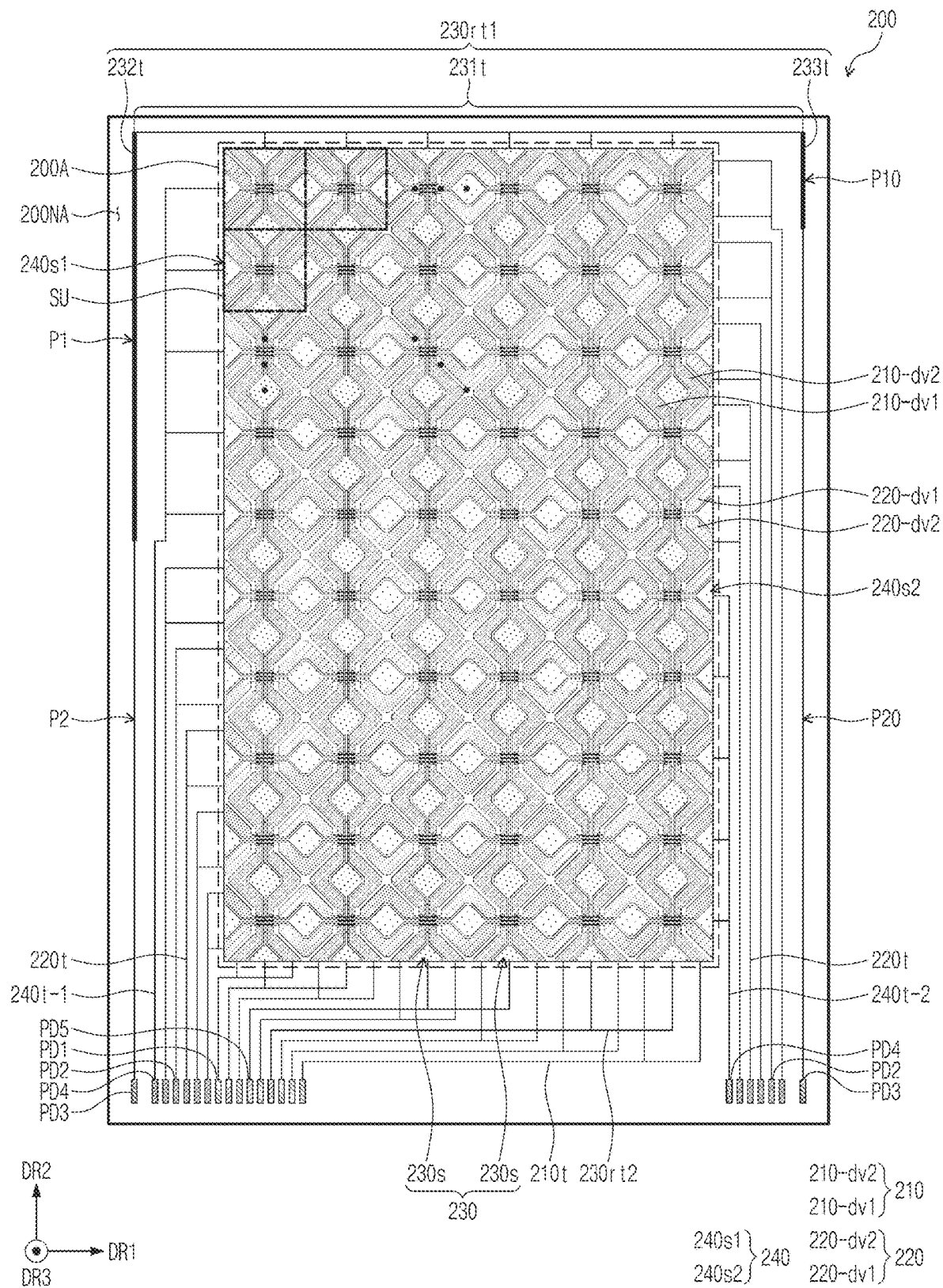
FIG. 24 is a plan view of the sensor layer according to one or more embodiments of the present disclosure.

FIG. 24 is a plan view of the sensor layer 200 according to one or more embodiments of the present disclosure.

The second line portion 232t may include a first portion P1 having a first line width, and a second portion P2 extending from the first portion P1 in the second direction DR2 and having a second line width that is less than the first line width. The third line portion 233t may include a first portion P10 having a third line width, and a second portion P20 extending from the first portion P10 in the second direction DR2 and having a fourth line width that is less than the third line width.

Because the second portion P2 of the second line portion 232t is located outside the second trace line 220t and the fourth trace line 240t-1, the area of the peripheral region 200NA in which the second portion P2 of the second line portion 232t is located is relatively small. Accordingly, the line width of the second portion P2 of the second line portion 232t is set to be relatively small. However, because the first portion P1 of the second line portion 232t is located outside the fourth trace line 240t-1 in the first direction DR1, and because the second trace line 220t is not located between the first portion P1 of the second line portion 232t and the sensing region 200A, the area of the peripheral region 200NA in which the first portion P1 of the second line portion 232t is located is relatively large. Therefore, it is possible to increase the line width of the first portion P1 of the second line portion 232t.

The sensor layer 200 (e.g., see FIG. 6) may include a main region 200A and a peripheral region 200NA. The sensor layer 200 may include electrodes in the main region. The electrodes in the main region may include first sensing electrodes 210 extending in the second direction DR2, and second sensing electrodes 220 extending in the first direction DR1. The electrodes in the main region may also include first electrodes 230s extending in the second direction DR2, and respectively overlapping the first sensing electrodes 210. Each of the first electrodes 230s may include a first end (e.g., a top end) and a second end (e.g., a bottom end). The electrodes in the main region may also include second electrodes 240s extending in the first direction DR1, and respectively overlapping the second sensing electrodes 220.

The second electrodes 240s may include a first-first line 220t connected to one of the second sensing electrodes 220, a first-second line 220t connected to another one of the second sensing electrodes, a second-first line 240t-1 connected to first group electrodes 240s1 of the second electrodes. One of the first group electrodes 240s1 may overlap the second sensing electrode 220 connected to the first-first line 220t.

The second electrodes 240s may also include a second-second line 240t-2 connected to second group electrodes 240s2 of the second electrodes 240s. One of the second group electrodes 240s2 may overlap the second sensing electrodes 220 connected to the first-second line 220t.

The second electrodes 240s may also include a third line 230rt1 connected to the first end of each of at least two first electrodes of the first electrodes, and a fourth line 230rt2 connected to the second end of each of the at least two first electrodes. The first-second line 220t may be between the second-first line 240t-1 and the main region 200A in the first direction DR1. The second-second line 240t-2 may be between the first-first line 220t and the main region 200A in the first direction DR1.

The sensor layer 200 (e.g., see FIG. 6) may also include a connection line in the peripheral region 200NA. The connection line may include a first connection line 230rt2 between the second ends (e.g., bottom ends) of at least two first electrodes 230s and a first pad PD5. The connection line may also include a second connection line 230rt1 between the first ends (e.g., top ends) of at least two first electrodes 230s and a second pad PD3.

The second connection line 230rt1 may include a first portion P1 having a first line width, and a second portion P2 having a second line width, the first line width being larger than the second line width.

Also, the second connection line 230rt1 may include a second line portion 232t facing at least two of the first electrodes 230s in the first direction DR1. A resistance of the second line portion 232t of the second connection line 230rt1 may be less than a resistance of one of the at least two first electrodes 230s.

The abovementioned at least two first electrodes 230s may be referred to as first group electrodes. Further, the first electrodes may also include second group electrodes between the first line portion 232t and the first group electrodes.

A first signal may be applied to the first connection line when a second signal is applied to the second connection line 230rt1 at a first time. The first signal may have a first phase, and the second signal may have a second phase that is opposite to the first phase.

Figure 25A:
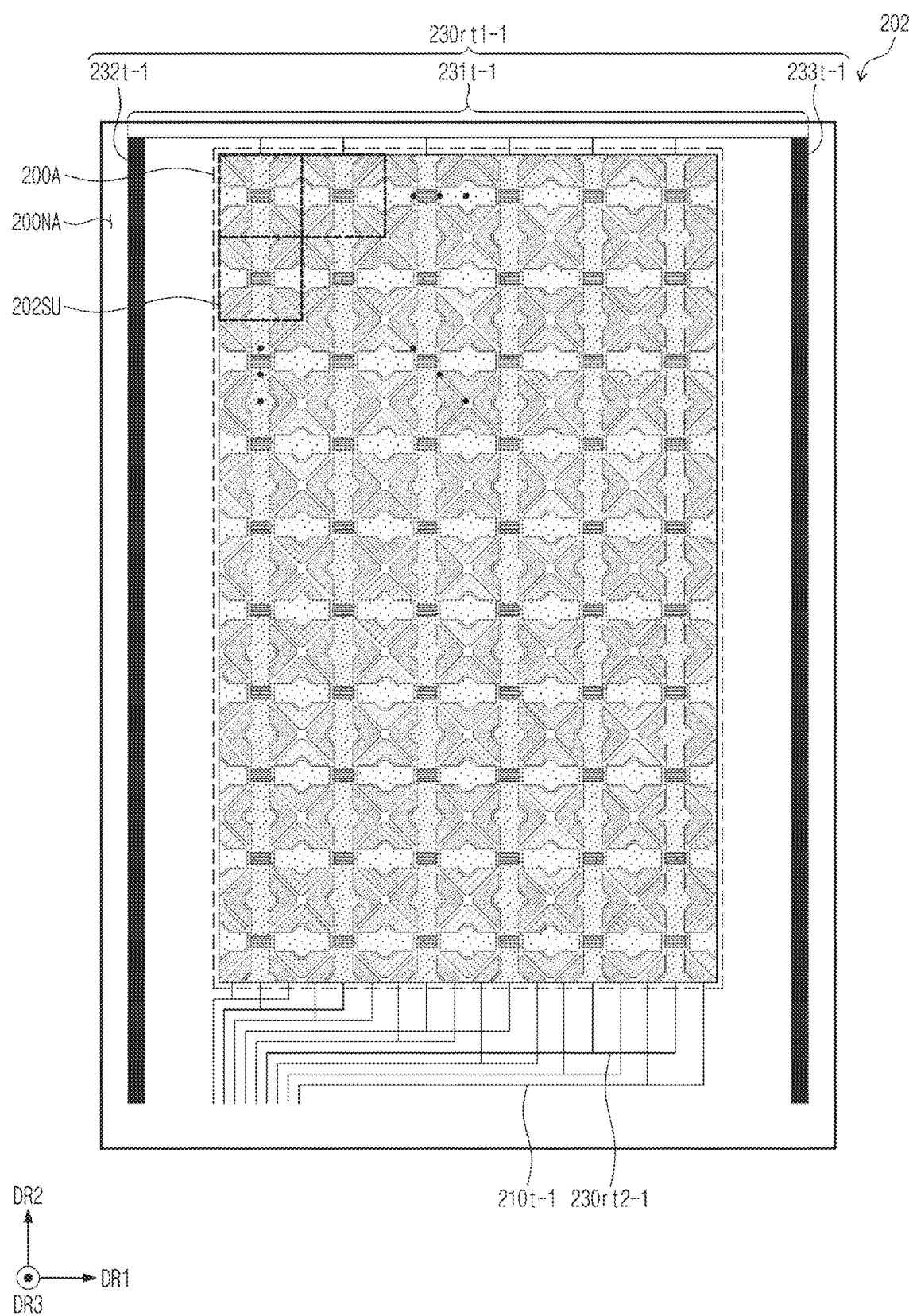
FIG. 25A is a plan view of a first conductive layer of the sensor layer according to one or more embodiments of the present disclosure.
Figure 25B:
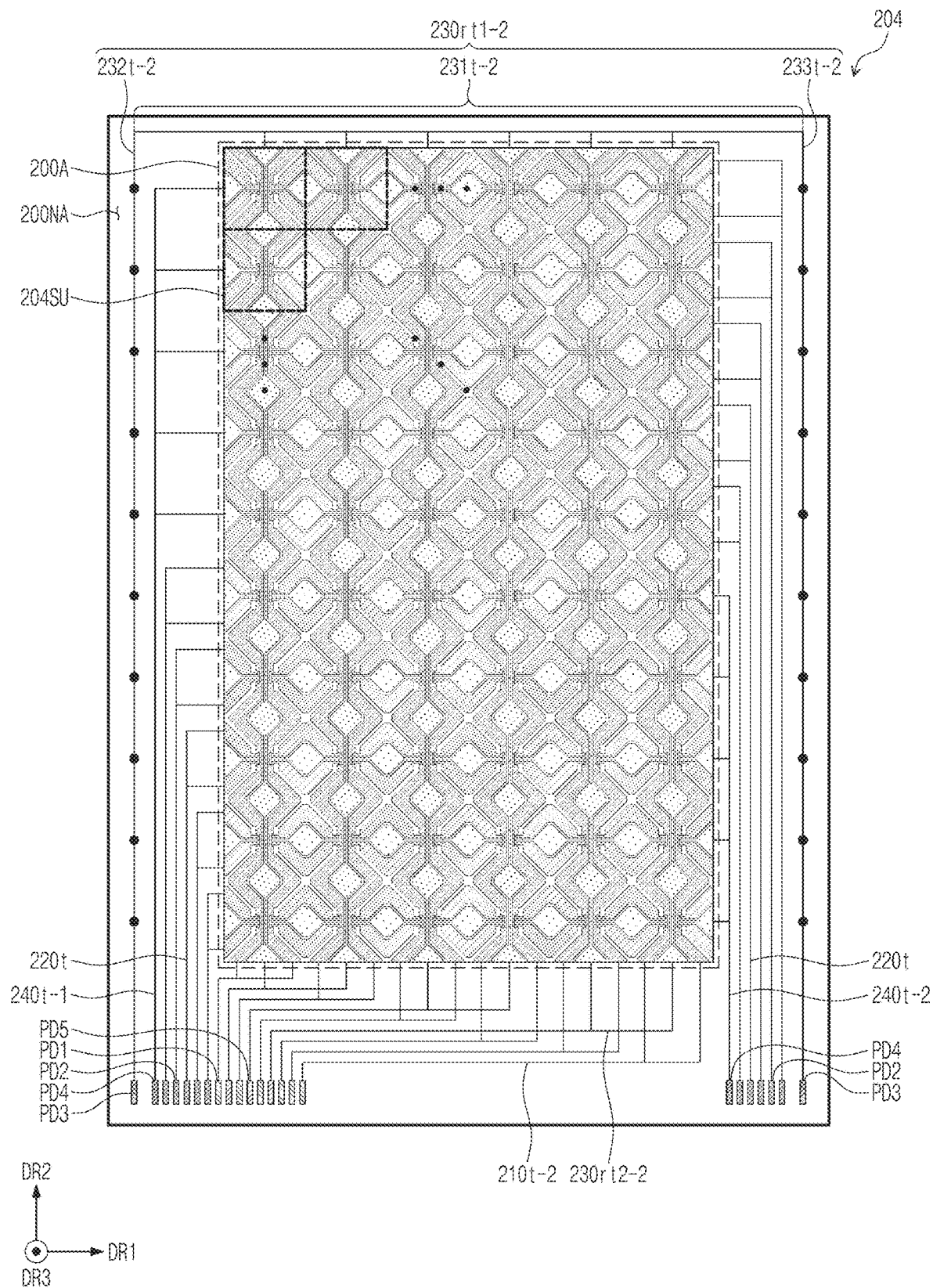
FIG. 25B is a plan view of a second conductive layer of the sensor layer according to one or more embodiments of the present disclosure.

FIG. 25A is a plan view of the first conductive layer 202 of the sensor layer 200 (see FIG. 5) according to one or more embodiments of the present disclosure. FIG. 25B is a plan view of the second conductive layer 204 of the sensor layer 200 according to one or more embodiments of the present disclosure.

Referring to FIG. 25A, the first conductive layer 202SU of the sensing unit SU (see FIG. 7) is illustrated in the sensing region 200A. Referring to FIG. 25B, the second conductive layer 204SU of the sensing unit SU (see FIG. 7) is illustrated in the sensing region 200A. FIG. 8A is referred to for the detailed description of the first conductive layer 202SU, and FIG. 8B is referred to for the detailed description of the second conductive layer 204SU.

Referring to FIG. 25A, first layer portions 210t-1 of the first trace lines 210t (see FIG. 6) may be located in the first conductive layer 202. First layer portions 230rt2-1 of the fifth trace lines 230rt2 (see FIG. 6) may be located in the first conductive layer 202. To reduce or prevent the likelihood of a short circuit of the first layer portions 210t-1 of the first trace lines 210t and the first layer portions 230rt2-1 of the fifth trace lines 230rt2, only a single one thereof may be located in the first conductive layer 202, or a single one of the first layer portions may be opened in the intersection region of the first layer portions 210t-1 of the first trace lines 210t and the first layer portions 230rt2-1 of the fifth trace lines 230rt2.

A first layer portion 230rt1-1 of the third trace line 230rt1 (see FIG. 6) may be located in the first conductive layer 202. The first layer portion 230rt1-1 of the third trace line 230rt1 may include a first layer portion 231t-1 of the first line portion 231t (see FIG. 6), a first layer portion 232t-1 of the second line portion 232t (see FIG. 6), and a first layer portion 233t-1 of the third line portion 233t (see FIG. 6).

In contrast, at least one of the second trace lines 220t or the fourth trace lines 240t-1 or 240t-2 is not located in the first conductive layer 202 of the sensor layer 200 (see FIG. 5). As illustrated in FIG. 25A, both the second trace lines 220t and the fourth trace lines 240t-1 and 240t-2 might not be located in the first conductive layer 202. Accordingly, more area may be secured in the peripheral region 200NA in which the first layer portion 232t-1 of the second line portion 232t, and the first layer portion 233t-1 of the third line portion 233t, are located. The first layer portion 232t-1 of the second line portion 232t, and the first layer portion 233t-1 of the third line portion 233t, may have a larger line width than a second layer portion 232t-2 of the second line portion 232t, and a second layer portion 233t-2 of the third line portion 233t, which will be described later. In addition, the first layer portion 232t-1 of the second line portion 232t, and the first layer portion 233t-1 of the third line portion 233t may have a larger line width than the first layer portion 231t-1 of the first line portion 231t, and the second layer portion 231t-2 of the first line portion 231t, to be described later. As a result, in addition, the first layer portion 232t-1 of the second line portion 232t and the first layer portion 233t-1 of the third line portion 233t may have a larger line width than the first line portion 231t.

Referring to FIG. 25B, a second layer portion 210t-2 of the first trace lines 210t (see FIG. 6) may be located in the second conductive layer 204. A second layer portion 230rt2-2 of the fifth trace lines 230rt2 (see FIG. 6) may be located in the second conductive layer 204. At least one of the second trace lines 220t (see FIG. 6) or the fourth trace lines 240t-1 and 240t-2 (see FIG. 6) is located in the second conductive layer 204. As illustrated in FIG. 25B, both the second trace lines 220t and the fourth trace lines 240t-1 and 240t-2 may be located in the second conductive layer 204.

A second layer portion 230rt1-2 of the third trace line 230rt1 (see FIG. 6) may be located in the second conductive layer 204. The second layer portion 230rt1-2 of the third trace line 230rt1 may include a second layer portion 231t-2 of the first line portion 231t (see FIG. 6), a second layer portion 232t-2 of the second line portion 232t (see FIG. 6), and a second layer portion 233t-2 of the third line portion 233t (see FIG. 6). The second layer portion 232t-2 of the second line portion 232t may be connected to the first layer portion 232t-1 of the second line portion 232t through contact holes CNT-4, and the second layer portion 233t-2 of the third line portion 233t may be connected to the first layer portion 233t-1 of the third line portion 233t through the contact holes CNT-4.

In one or more embodiments of the present disclosure, the second layer portion 230rt1-2 of the third trace line 230rt1 may be omitted. In this case, the third pads PD3 may be connected to the first layer portion 230rt1-1 of the third trace line 230rt1.

The first layer portion 230rt1-1 of the third trace line 230rt1 having a large line width, which is illustrated in FIG. 25A, and the two-layer structure of the third trace line 230rt1 illustrated in FIGS. 25A and 25B, may lower the resistance of the third trace line 230rt1. If the third electrode 230 defining channels as illustrated in FIGS. 17C to 17E includes a plurality of first auxiliary electrodes 230s, by applying the third trace line 230rt1 having the structure described in FIGS. 25A and 25B, the second line portion 232t and the third line portion 233t may serve as a charging channel equivalent to the third electrode 230 in the charging-driving mode.

In one or more embodiments of the present disclosure, unlike what is illustrated in FIGS. 25A and 25B, the first layer portion 232t-1 of the second line portion 232t may have a narrower width than the second layer portion 232t-2 of the second line portion 232t. The second layer portion 232t-2 of the second line portion 232t may have the same width as the first layer portion 232t-1 of the second line portion 232t in FIG. 25A, and the first layer portion 232t-1 of the second line portion 232t may have a narrow width like the second layer portion 232t-2 of the second line portion 232t in FIG. 25B.

In one or more embodiments of the present disclosure, as illustrated in FIGS. 25A and 25B, the first layer portion 232t-1 of the second line portion 232t may have a larger width than the second layer portion 232t-2 of the second line portion 232t. Also, the second layer portion 232t-2 may overlap the first layer portion 232t-1 to be at a layer that is different from that of the first layer portion 232t-1. Contrary to FIGS. 25A and 25B, the second layer portion 233t-2 of the third line portion 233t may have a larger width than the first layer portion 233t-1 of the third line portion 233t.

According to the above description, an input by a pen as well as a body part of a user may be sensed. It is possible to sense both an input by a body part of a user in a capacitive method and an input by a passive-type pen in an electromagnetic induction method.

A capacitive input sensor and an electromagnetic induction input sensor may be implemented by two conductive layers.

During a charging-driving mode, a trace line located in the peripheral region may play the same role as a channel located in the sensing region and, therefore, may charge the RLC resonance circuit of the pen located in the peripheral region.

Although the above has been described with reference to preferred embodiments of the present disclosure, those skilled in the art or those of ordinary skill in the art will understand that various modifications and changes can be made to the present disclosure within the scope that does not depart from the spirit and technical field of the present disclosure described in the claims to be described later. Accordingly, the technical scope of the present disclosure should not be limited to the content described in the detailed description of the specification, but should be determined by the claims described hereinafter, with functional equivalents thereof to be included therein.

What is claimed is:

1. An electronic device comprising:
a sensor layer comprising a main region and a peripheral region, and comprising:
electrodes in the main region, and comprising:
first sensing electrodes extending in a first direction;
second sensing electrodes extending in a second direction crossing the first direction;
first electrodes extending in the first direction, respectively overlapping the first sensing electrodes, and each of the first electrodes comprising a first end and a second end; and
second electrodes extending in the second direction, and respectively overlapping the second sensing electrodes;
a connection line in the peripheral region, and comprising:
a first connection line connecting between the second end of each of at least two first electrodes of the first electrodes and a first pad; and
a second connection line connecting between the first end of each of the at least two first electrodes and a second pad,
wherein the second connection line comprises a first portion having a first line width and a second portion having a second line width,
wherein the first line width is larger than the second line width,
wherein a first signal is applied to the first connection line when a second signal is applied to the second connection line at a first time, and
wherein the first signal has a first phase and the second signal has a second phase opposite to the first phase.

2. The electronic device of claim 1, wherein the second connection line comprises:
a first line portion connected to the first end of each of the at least two first electrodes and facing the first pad in the first direction;
a second line portion extending from the first line portion; and
a third line portion extending from the first line portion,
wherein the second line portion and the third line portion are facing each other in the second direction, and
wherein at least one of the second line portion or the third line portion comprises the first portion and the second portion.

3. The electronic device of claim 2, wherein a resistance of the second line portion is less than a resistance of one of the first electrodes.

4. The electronic device of claim 2, wherein a resistance of the second line portion is substantially same to a resistance of the at least two first electrodes.

5. The electronic device of claim 1, wherein the connection line further comprises:

third connection lines in the peripheral region, and respectively connected to the first sensing electrodes;
a first-first connection line connected to one of the second sensing electrodes;
a first-second connection line connected to another one of the second sensing electrodes;
a second-first connection line connected to first group electrodes of the second electrodes, and one of the first group electrodes overlapping the one of the second sensing electrodes; and
a second-second connection line connected to second group electrodes of the second electrodes, and one of the second group electrodes overlapping the another one of the second sensing electrodes.

6. The electronic device of claim 5, wherein the first-second connection line is disposed between the second-first connection line and the main region in the second direction, and
wherein the second-second connection line is disposed between the first-first connection line and the main region in the second direction.

7. The electronic device of claim 1, wherein the sensor layer further comprises a first insulating layer and a second insulating layer overlapping the main region and the peripheral region,
wherein each of the first sensing electrodes comprises a first split electrode and a second split electrode that are above the first insulating layer and the second insulating layer, and that are spaced apart from each other in the second direction, and
wherein each of the second sensing electrodes comprises sensing patterns above the first insulating layer and the second insulating layer, and bridge patterns between the first insulating layer and the second insulating layer, and connected to the sensing patterns.

8. The electronic device of claim 7, wherein each of the first electrodes comprises:
a first pattern between the first insulating layer and the second insulating layer, extending in the first direction, and overlapping the first split electrode and the second split electrode; and
a second pattern above the first insulating layer and the second insulating layer, extending in the first direction, and between the first split electrode and the second split electrode in the second direction,
wherein the first pattern and the second pattern are connected to each other through a contact hole passing through the second insulating layer.

9. The electronic device of claim 7, wherein each of the second electrodes comprises:
first patterns between the first insulating layer and the second insulating layer, and spaced apart from each other in the second direction;
a second pattern between the first insulating layer and the second insulating layer, and between two adjacent ones of the first patterns in the second direction; and
third patterns above the first insulating layer and the second insulating layer, and spaced apart from each other in the second direction,
wherein the first patterns respectively overlap corresponding ones of the sensing patterns, and
wherein the third patterns are respectively connected to the first patterns, and is connected to the second pattern.

10. The electronic device of claim 7, the second connection line comprises a first layer portion between the first insulating layer and the second insulating layer, and a second layer portion above the first insulating layer and the second insulating layer, and connected to the first layer portion.

11. The electronic device of claim 10, wherein the first layer portion has a larger line width than the second layer portion.

12. The electronic device of claim 10, wherein the first layer portion has a larger line width than the first connection line.

13. The electronic device of claim 10, wherein the connection line further comprises:
   third connection lines in the peripheral region, respectively connected to the first sensing electrodes, and above the first insulating layer and the second insulating layer;
   a first-first connection line connected to one of the second sensing electrodes and above the first insulating layer and the second insulating layer;
   a first-second connection line connected to another one of the second sensing electrodes and above the first insulating layer and the second insulating layer;
   a second-first connection line above the first insulating layer and the second insulating layer, connected to first group electrodes of the second electrodes, and one of the first group electrodes overlapping the one of the second sensing electrodes; and
   a second-second connection line above the first insulating layer and the second insulating layer, connected to second group electrodes of the second electrodes, and one of the second group electrodes overlapping the another one of the second sensing electrodes.

14. The electronic device of claim 1, further comprising a sensor driver configured to drive the sensor layer in a first mode for sensing a touch input, or in a second mode for sensing a pen input.

15. The electronic device of claim 14, wherein, in the second mode, the sensor driver is configured to receive a first induced current flowing from the first electrodes toward the first sensing electrodes through first coupling capacitors defined between the first electrodes and the first sensing electrodes, and is configured to receive a second induced current flowing from the second electrodes toward the second sensing electrodes through second coupling capacitors defined between the second electrodes and the second sensing electrodes.

16. An electronic device comprising:
   a sensor layer comprising a main region and a peripheral region, and comprising:
   electrodes in the main region, and comprising:
      first sensing electrodes extending in a first direction;
      second sensing electrodes extending in a second direction crossing the first direction;
      first electrodes extending in the first direction, respectively overlapping the first sensing electrodes, and each of the first electrodes comprising a first end and a second end; and
      second electrodes extending in the second direction, and respectively overlapping the second sensing electrodes,
   a connection line in the peripheral region, and comprising:
      a first connection line connecting between the second end of each of at least two first electrodes of the first electrodes and a first pad; and
      a second connection line connecting between the first end of each of the at least two first electrodes and a second pad,
   wherein the second connection line comprises a first line portion facing the at least two first electrodes in the second direction,
   wherein a resistance of the first line portion of the second connection line is less than a resistance of one of the at least two first electrodes, and
   wherein a first signal is applied to the first connection line when a second signal different the first signal is applied to the second connection line at a first time.

17. The electronic device of claim 16, wherein the first signal comprises a sinusoidal signal or square wave signal that has opposite phase to the second signal.

18. The electronic device of claim 16, wherein the at least two first electrodes of the first electrodes are defined as first group electrodes, and
   wherein the first electrodes further comprise second group electrodes disposed between the first line portion and the first group electrodes.

19. The electronic device of claim 18, wherein the first electrodes further comprise third group electrodes,
   wherein the first group electrodes disposed between the second group electrodes and the third group electrodes, and
   wherein the second group electrodes and the third group electrodes do not receive the first signal and the second signal at the first time.

20. The electronic device of claim 19, wherein the first signal is applied to the second group electrodes and the second signal is applied to the third group electrodes at a second time, and
   wherein the first group electrodes do not receive the first signal and the second signal at the second time.

21. The electronic device of claim 16, wherein the first line portion comprises:
   a first layer portion; and
   a second layer portion overlapping the first layer portion, at a layer that is different from that of the first layer portion, and having a width that is less than a width of the first layer portion.

* * * * *